(12) United States Patent
Ueda

(10) Patent No.: US 7,569,863 B2
(45) Date of Patent: Aug. 4, 2009

(54) SEMICONDUCTOR LIGHT EMITTING DEVICE

(75) Inventor: Tetsuzo Ueda, Osaka (JP)

(73) Assignee: Panasonic Corporation, Osaka (JP)

( * ) Notice: Subject to any disclaimer, the term of this patent is extended or adjusted under 35 U.S.C. 154(b) by 444 days.

(21) Appl. No.: 11/060,425

(22) Filed: Feb. 18, 2005

(65) Prior Publication Data

US 2005/0184305 A1  Aug. 25, 2005

(30) Foreign Application Priority Data

Feb. 19, 2004 (JP) .............................. 2004-042329
Feb. 19, 2004 (JP) .............................. 2004-042330

(51) Int. Cl.
*H01L 33/00* (2006.01)
(52) U.S. Cl. .............................. 257/97; 257/89; 257/90; 257/96
(58) Field of Classification Search ............. 257/89–90, 257/96–97; 313/503
See application file for complete search history.

(56) References Cited

U.S. PATENT DOCUMENTS

| | | | |
|---|---|---|---|
| 6,153,894 A * | 11/2000 | Udagawa ....................... | 257/96 |
| 6,576,933 B2 * | 6/2003 | Sugawara et al. ........... | 257/103 |
| 6,600,175 B1 | 7/2003 | Baretz et al. | |
| 6,828,599 B2 * | 12/2004 | Kim ............................. | 257/103 |
| 2002/0139984 A1* | 10/2002 | Sugawara et al. .............. | 257/79 |
| 2004/0217364 A1* | 11/2004 | Tarsa et al. .................... | 257/89 |

FOREIGN PATENT DOCUMENTS

| | | | |
|---|---|---|---|
| JP | 08-288549 | | 11/1996 |
| JP | 9-232627 | | 9/1997 |
| JP | 10-261818 | * | 9/1998 |
| JP | 11-274558 | | 10/1999 |
| JP | 2000-082849 | | 3/2000 |
| JP | 2000-091703 | | 3/2000 |
| JP | 2000-101139 | | 4/2000 |
| JP | 2000-261034 | | 9/2000 |
| JP | 11-274558 | * | 10/2000 |
| JP | 2002-009335 | | 1/2002 |
| JP | 2002-111072 | | 4/2002 |
| JP | 2002-171000 | | 6/2002 |
| JP | 2002-198561 | | 7/2002 |
| JP | 2002-217450 | | 8/2002 |
| JP | 2002-299686 | | 10/2002 |
| JP | 2002-319703 | | 10/2002 |

(Continued)

OTHER PUBLICATIONS

Shuji Nakamura et al., "The Blue Laser Diode: GaN Based Light Emitters and Lasers", Springer-Verlag Berlin Heildelberg New York, pp. 216-219, (1997).

(Continued)

*Primary Examiner*—Shouxiang Hu
(74) *Attorney, Agent, or Firm*—Greenblum & Bernstein P.L.C.

(57) ABSTRACT

A semiconductor light emitting device is composed of a blue light emitting diode, a red light emitting layer grown epitaxially on the blue light emitting diode, and an insulating material containing a YAG fluorescent material. The red light emitting layer is made of, e.g., undoped $In_{0.4}Ga_{0.6}N$ having a forbidden band width of 1.9 eV and formed on a p-type semiconductor layer to have a configuration consisting of a plurality of mutually spaced-apart islands.

16 Claims, 34 Drawing Sheets

FOREIGN PATENT DOCUMENTS

| | | |
|---|---|---|
| JP | 2002-368265 | 12/2002 |
| JP | 2003-037291 | 2/2003 |
| JP | 2003-068745 | 3/2003 |
| JP | 2003-234505 | 8/2003 |
| JP | 2003-243726 | 8/2003 |
| JP | 2003-318443 | 11/2003 |
| JP | 2003-347587 | 12/2003 |
| WO | WO 0229907 A1 * | 4/2002 |

OTHER PUBLICATIONS

English Language Abstract of JP 9-232627, published Sep. 5, 1997.
English Language Abstract of JP 2000-261034, Sep. 22, 2000.
U.S. Appl. No. 11/060,278 to Ueda, filed Feb. 18, 2005.
English language abstract of JP 11-274558.
English language abstract of JP 2003-037291.
English language abstract of JP 2002-368265.
English language abstract of JP 08-288549.
English language abstract of JP 2002-171000.
English language abstract of JP 2002-111072.
English language abstract of JP 2003-234505.
English language abstract of JP 2000-091703.
English language abstract of JP 2002-299686.
English language abstract of JP 10-261818.
English language abstract of JP 2000-082849.
English language abstract of JP 2002-217450.
English language abstract of JP 2003-318443.
English language abstract of JP 2003-347587.
English language abstract of JP 2000-101139.
English language abstract of JP 2002-009335.
English language abstract of JP 2002-319703.
English language abstract of JP 2003-068745.
English language abstract of JP 2003-243726.
English language abstract of JP 2002-198561.

* cited by examiner

LASER LIGHT

LASER LIGHT

SEMICONDUCTOR LIGHT EMITTING DEVICE

CROSS-REFERENCE TO RELATED APPLICATIONS

The teachings of Japanese Patent Applications JP 2004-42329 and JP 2004-42330, each filed Feb. 19, 2004, are entirely incorporated herein by reference, inclusive of the claims, specification, and drawings.

BACKGROUND OF THE INVENTION

The present invention relates to a semiconductor light emitting device which is applicable to, e.g., a white light emitting diode and to a method for fabricating the same.

A gallium nitride-based (GaN-based) group III-V nitride semiconductor (InGaAlN) in which GaN has a large forbidden bandwidth of, e.g., 3.4 eV at a room temperature is a material which can implement a light emitting device capable of a high output in the blue or green wavelength band or even in the ultraviolet wavelength band. The GaN-based semiconductor has already been commercialized as a blue/green light emitting diode in various display panels, large-scale display devices, and traffic signals.

On the other hand, a white light emitting diode which provides white light by exciting a YAG fluorescent material with emission light from a blue light emitting diode has also been commercialized already for various applications including the back light of a liquid crystal display panel.

If the white light emitting diode can be enhanced in brightness and light emitting efficiency, a semiconductor illuminating device as a replacement for currently prevailing fluorescent and incandescent lamps can be provided. Accordingly, white light emitting diodes for illumination are predicted to create an extremely large market in the future.

For illumination purposes, the improvement of the manner in which color appears when a white light emitting diode is used for illumination, i.e., a color rendering property is important in addition to the enhancement of brightness and the light emitting efficiency.

Since each of the white light emitting diodes that have been commercialized heretofore has used a method which excites a YAG (Yttrium Aluminum Garnet) fluorescent material with emission light at about 470 nm from a blue light emitting diode and thereby obtains yellow emission light (see, e.g., S. Nakamura et al., "The Blue Laser Diode" Springer-Verlag Berlin Heidelberg New York: See p. 216), the problem has been encountered that the amount of red emission light in an emission spectrum is small and the color rendering property is consequently inferior to that of light from a fluorescent lamp and light from an incandescent lamp.

At present, there is no red fluorescent material that exhibits a sufficiently high excitation efficiency upon excitation caused by blue emission light. To improve the color rendering property, therefore, it is particularly necessary to enhance the brightness of a red light emitting fluorescent material.

Referring to FIG. 36, a description will be given herein below to a structure of a conventional white light emitting diode which provides white light by mixing blue light from a GaN-based blue light emitting diode with yellow light which is outputted through the excitation of a YAG fluorescent material with the blue light and to the light emission characteristics thereof.

As shown in FIG. 36, the white light emitting diode is composed of a blue light emitting diode 300 for outputting blue light at a wavelength of 470 nm which has been mounted on a package 310 to have upper and side surfaces thereof covered with an insulating material 320 containing a YAG fluorescent material.

A method for fabricating the blue light emitting diode 300 will be described, in which an n-type GaN layer 302, an active layer 303 made of InGaN, and a p-type GaN layer 304 are formed successively on a substrate 301 made of sapphire by, e.g., MOCVD (Metal Organic Chemical Vapor Deposition).

Next, dry etching using, e.g., a chlorine gas is performed with respect to the n-type GaN layer 304 and the active layer 303, thereby selectively exposing a part of the n-type GaN layer 302. Subsequently, an n-side electrode 305 composed of a multilayer film of titanium and gold is formed on the exposed portion of the n-type GaN layer 302. On the other hand, a p-side transparent electrode 306 composed of a multilayer film of nickel and gold and having a reduced thickness of 10 nm or less for the transmission of light emitted from the active layer 303 is formed on the p-type GaN layer 304.

Next, a pad electrode 307 made of gold is formed selectively on the p-side transparent electrode 306, whereby a majority of the blue light emitted from the active layer 303 passes through the p-side transparent electrode 306.

Next, the blue light emitting diodes 300 in the form of a wafer is divided into square chips each having, e.g., 350-μm sides. Each of the chips is mounted at a specified position on the package 310 and then wire bonding is performed with respect to the n-side electrode and the pad electrode 307. Subsequently, the insulting material 320 containing the YAG fluorescent material is coated or applied dropwise to cover the blue light emitting diode 300 and then hardened.

The light emission characteristics of the white light emitting diode thus obtained are as shown in FIG. 37 so that white light which is a mixture of blue emission light 300A from the blue light emitting diode 300 and yellow emission light 320A from the YAG fluorescent material 320 is emitted.

However, the conventional white light emitting diode has the problem of a poor white color rendering property, as shown in FIG. 37, due to the small amount of the red emission light component in a spectrum obtained from the blue light emitting diode 300.

SUMMARY OF THE INVENTION

In view of the conventional problems described above, it is therefore an object of the present invention to provide a white light emitting diode made of a GaN-based compound semiconductor having an excellent color rendering property.

To attain the object, the present invention provides a structure wherein a light emitting diode for emitting short-wavelength light such as blue light or ultraviolet light has a semiconductor layer which is excited by light emitted from the light emitting diode to release long-wavelength light such as green light or red light.

The present invention also provides another structure wherein another n-type semiconductor layer is provided to come in contact with a p-type semiconductor layer composing the light emitting diode in conjunction with an n-type semiconductor layer such that a tunnel current is allowed to flow between the other n-type semiconductor layer and the p-type semiconductor layer. The arrangement obviates the necessity for a transparent electrode used for the light emitting diode.

Specifically, a first semiconductor light emitting device according to the present invention comprises: a light emitting diode for emitting first emission light; and a semiconductor film provided in a portion of the light emitting diode to absorb the first emission light and emit second emission light, wherein the semiconductor film emits the second emission light through optical excitation by the first emission light.

The first semiconductor light emitting device allows the light emitting diode to output blue light as the first emission light and allows the semiconductor film to absorb the blue first emission light and release the second emission light, which is either red light or green light, so that the white light emitting diode having an excellent color rendering property is provided.

Preferably, the first semiconductor light emitting device further comprises: a transparent electrode provided in the light emitting diode, wherein the transparent electrode transmits the first emission light or the second emission light. The arrangement enhances the efficiency with which a current is injected in the light emitting diode to cause light emission from the diode.

In the first semiconductor light emitting device, the semiconductor film is preferably formed on a part of a light emitting surface of the semiconductor light emitting device. In the arrangement, a part of the first emission light is absorbed by the semiconductor film so that there is no conversion of the remaining part of the first emission light to the second emission light. This ensures the emission of white light having an excellent color rendering property.

Preferably, the first semiconductor light emitting device further comprises: a fluorescent material covering the light emitting diode and the semiconductor film, wherein the fluorescent material absorbs the first emission light and emits third emission light. In the case where a YAG fluorescent material is used for the fluorescent material, the arrangement allows the emission of high-brightness yellow light through excitation caused by blue light. By combining the yellow light from the fluorescent material with the high-brightness red light from the semiconductor film, therefore, white light having an excellent color rendering property is obtainable.

In the first semiconductor light emitting device, the light emitting diode or the semiconductor film is preferably formed on a substrate made of a single crystal. The arrangement allows the formation the light emitting diode or the semiconductor film on the substrate made of a single crystal by epitaxial growth. As a result, the crystal property of the light emitting diode or the semiconductor film is improved and therefore a high-brightness white light emitting diode can be provided.

In the first semiconductor light emitting device, the substrate preferably transmits the first emission light and the second emission light. The arrangement allows the extraction of the first emission light and the second emission light through the substrate. Accordingly, in the case where the light emitting diode and the semiconductor film are formed on the substrate in this order, e.g., so-called flip-chip mounting can be performed which forms an electrode made of a material having a high reflectivity with respect to each of the first emission light and the second emission light on the semiconductor film and mounts the formed electrode in opposing relation to the surface of a package. As a result, a white light emitting diode featuring an excellent heat dissipation property and high brightness can be obtained.

In the case where the transparent electrode is provided, the transparent electrode is preferably provided with a plurality of openings and the semiconductor film is preferably formed in each of the openings on a light emitting surface of the light emitting diode. The arrangement allows the second emission light from the semiconductor film to be extracted without passing through the transparent electrode so that a reduction in brightness due to the absorption of light by the transparent electrode no more occurs. In addition, the semiconductor film is in contact with the light emitting diode so that the brightness of the second emission light is also enhanced.

In this case, the semiconductor film is preferably formed in mutually divided relation in each of the openings on a light emitting surface of the light emitting diode.

In this case, the semiconductor film is preferably formed to cover a part of the transparent electrode in the vicinity of the openings.

In the first the semiconductor light emitting device, the semiconductor film has a crystal defect density which is lower in the portion thereof located on the transparent electrode than in each of the portions thereof located over the individual openings of the transparent electrode.

In the case where the semiconductor film or the light emitting diode is thus formed to grow selectively in a lateral direction from each of the openings in the transparent electrode, the crystal property of the portion of the semiconductor film or the light emitting diode located on the transparent electrode is improved so that light emission is performed with higher brightness.

In the first semiconductor light emitting device, the first emission light is preferably blue light or ultraviolet light.

In this case, the semiconductor film is preferably excited by the first emission light to emit the second emission light which is red light. In the arrangement, if the semiconductor film and the light emitting diode are covered with, e.g., an insulating material containing a YAG fluorescent material, a white light emitting diode having an excellent white color rendering property is obtainable.

In the first semiconductor light emitting device, the semiconductor film is preferably composed of a plurality of semiconductor films which are stacked in layers and emit emission light components having different wavelengths from each of the stacked layers.

In the first semiconductor light emitting device, the semiconductor film is preferably doped with impurities and excited by the first emission light to emit the second emission light in a visible range via energy levels resulting from the impurities. The arrangement allows high-brightness light emission from the semiconductor film doped with the impurity via the energy level of the impurity which can serve as a high-brightness luminescent center. As a result, the brightness of the second emission light can be enhanced and the color rendering property can further be improved.

In the first semiconductor light emitting device, the semiconductor film is preferably doped with an impurity to emit the second emission light in a visible range through light emission from inner-shell transition of the impurities. The arrangement realizes high-efficiency red light emission and allows a white light emitting diode having a more excellent color rendering property to be obtained.

In this case, the impurity is preferably Eu, Sm, or Yb.

Preferably, the impurities in the semiconductor film are introduced by ion implantation. The arrangement allows the semiconductor film to be doped with the impurity with high controllability.

In the first semiconductor light emitting device, the light emitting diode or the semiconductor layer is preferably composed of a compound semiconductor containing nitrogen. The arrangement ensures the emission of high-brightness blue light or ultraviolet light as the first emission light and the emission of high-brightness red light as the second emission light so that white light having an excellent color rendering property is obtainable.

In the first semiconductor light emitting device, the transparent electrode is preferably composed of a conductive material containing nickel or indium tin oxide (ITO) each having a thickness more than 0 nm and not more than 20 nm.

The arrangement reduces the absorption of light emitted and absorbed by the transparent electrode. In addition, since nickel, e.g., can form an excellent ohmic contact with a nitride semiconductor layer, a white light emitting diode featuring high brightness and a reduced series resistance can be provided.

In the case where an insulating material containing a fluorescent material is provided, the fluorescent material is preferably yttrium aluminum garnet (YAG). The arrangement allows high-brightness yellow light to be obtained by using the blue excitation light from the light emitting diode. By mixing the blue emission light with the red second emission light from the semiconductor film, e.g., a high-brightness light emitting diode having an excellent white color rendering property can be provided.

In the case where the light-emitting diode is formed on the substrate made of a single crystal, there can be used sapphire, silicon carbide, gallium nitride, aluminum nitride, magnesium oxide, lithium gallium oxide, lithium aluminum oxide, lithium aluminum oxide, or a mixed crystal of lithium gallium oxide and lithium aluminum oxide as the single crystal. Since the use of such a single crystal allows a nitride semiconductor layer having an excellent crystal property to be formed on the substrate, higher-brightness blue or ultraviolet light can be obtained as the first emission light so that higher-brightness red second emission light is obtainable by using the first emission light as the excitation light.

Preferably, the first semiconductor light emitting device further comprises a metal film provided in the light emitting diode and having a thickness of at least 10 μm, wherein a current is injected in the light emitting diode through the metal film. The arrangement allows heat generated from the light emitting diode in operation to dissipate through the metal film so that a white light emitting diode having an excellent heat dissipation property and capable of high-output operation is obtainable.

In this case, the metal film is preferably made of gold, copper, or silver.

In the first semiconductor light emitting device, the light emitting diode is preferably provided with a metal electrode having a reflectivity of 60% or more with respect to the first emission light or the second emission light. The arrangement remarkably increases the efficiency with which emission light is extracted.

In this case, the metal electrode is preferably composed of a single-layer film or a multi-layer film each made of at least one material selected from the group consisting of gold, platinum, copper, silver, and rhodium.

A first method for fabricating a semiconductor light emitting device according to the present invention comprises the steps of: (a) forming a light emitting diode composed of a plurality of semiconductor layers on a substrate made of a single crystal; and (b) selectively forming, on the light emitting diode, a semiconductor film which absorbs first emission light and emits second emission light through the optical excitation by the first emission light.

Since the first method for fabricating a semiconductor light emitting device allows the light emitting diode formed on the substrate made of the single crystal to emit blue light as the first emission light and allows the semiconductor film formed selectively on the light emitting diode to absorb the blue first emission light and release the second emission light which is either red or green, a white light emitting diode having an excellent color rendering property can be provided.

Preferably, the first method for fabricating a semiconductor light emitting device further comprises the step of: (c) between the steps (a) and (b) or after the step (b), forming a transparent electrode which transmits the first emission light on the light emitting diode.

In this case, the step (c) preferably includes the step of providing a plurality of openings in the transparent electrode. The arrangement allows the second emission light released from the semiconductor film to be extracted without passing through the transparent electrode so that a brightness reduction due to the absorption of light by the transparent electrode no more occurs. As a result, a high-brightness white light emitting diode can be obtained.

In this case, the semiconductor film is preferably formed in the step (b) to selectively grow from each of the regions of an upper surface of the light emitting diode which are exposed through the plurality of openings of the transparent electrode.

Preferably, the first method for fabricating a semiconductor light emitting device further comprises the step of: (d) after the step (b), irradiating the surface of the substrate opposite to the light emitting diode with light having a wavelength which is not absorbed by the substrate but is absorbed by the semiconductor layers composing the light emitting diode to separate the substrate from the diode. The arrangement allows a white light emitting diode having an excellent heat dissipation property and capable of large-output operation to be provided through the separation of the substrate when the substrate is made of a material having a poor heat dissipation property such as, e.g., sapphire.

In this case, the step (d) preferably includes forming, in a part of the semiconductor layers irradiated with the light, a decomposition layer resulting from thermal decomposition of the irradiated semiconductor layers. Even when the substrate has a relatively larger area, the arrangement allows no-split separation of the substrate from the light emitting diode with high reproducibility.

A second method for fabricating a semiconductor light emitting device according to the present invention comprises the steps of: (a) forming a semiconductor film on a substrate made of a single crystal; and (b) forming a light emitting diode composed of a plurality of semiconductor layers on the semiconductor film, wherein the semiconductor film absorbs first emission light emitted from the light emitting diode and emits second emission light through the optical excitation by the first emission light.

Since the second method for fabricating a semiconductor light emitting device allows the semiconductor film and the light emitting diode to be formed on the substrate made of the single crystal, allows the light emitting diode to output, e.g., blue light as first emission light, and allows the semiconductor film to absorb the blue first emission light and release the second emission light, which is either red or green, a white light emitting diode having an excellent white color rendering property can be provided.

Preferably, the second method for fabricating a semiconductor light emitting device further comprises the step of: (c) between the steps (a) and (b), forming a transparent electrode which transmits the first emission light on the semiconductor film.

In this case, the step (c) preferably includes the step of providing a plurality of openings in the transparent electrode.

In this case, a lower one of the plurality of semiconductor layers is preferably formed in the step (b) to selectively grow from each of the regions of an upper surface of the semiconductor film which are exposed through the plurality of openings of the transparent electrode.

Preferably, the second method for fabricating a semiconductor light emitting device further comprises the step of: (d) after the step (b), irradiating the surface of the substrate opposite to the semiconductor film with light having a wavelength which is not absorbed by the substrate but is absorbed by the semiconductor film to separate the substrate from the semiconductor film.

In this case, the step (d) preferably includes forming, in a part of the semiconductor layers irradiated with the light, a decomposition layer resulting from thermal decomposition of the irradiated semiconductor layers.

Preferably, the first or second method for fabricating a semiconductor light emitting device further comprises the step of: (e) after the step (d), forming a metal film on the light emitting diode or on the semiconductor film.

A second semiconductor light emitting device according to the present invention comprises: a light emitting diode composed of a first n-type semiconductor layer, a p-type semiconductor layer, and a second n-type semiconductor layer which are formed successively to emit first emission light; and a semiconductor film provided in the light emitting diode to absorb the first emission light and emit second emission light through the optical excitation by the first emission light, wherein when a voltage is applied such that the second n-type semiconductor layer has a positive potential relative to the first n-type semiconductor layer, a current flows from the second n-type semiconductor layer to the first n-type semiconductor layer.

Since the second semiconductor light emitting device allows the light emitting diode to output blue light as the first emission light and allows the semiconductor film to absorb the blue first emission light and release the second emission light, which is either red or green, a white light emitting diode having an excellent white color rendering property can be provided. In addition, when an operating current is injected in the light emitting diode, a structure is adopted in which a so-called tunnel current flows in a $p^+n^+$ junction composed of the p-type semiconductor layer and the second n-type semiconductor layer so that a rectifying property is obtained by applying a voltage between the second n-type semiconductor layer and the first n-type semiconductor layer such that it is higher to the second n-type semiconductor layer than to the first n-type semiconductor layer. Since the heavily doped second n-type semiconductor layer has a low resistance, a current is more likely to be dispersed in the in-plane direction of a pn junction surface. This obviates the necessity to use the transparent electrode and enhances the brightness of the emission light.

In the second semiconductor light emitting device, an impurity concentration in preferably each of the p-type semiconductor layer and the second n-type semiconductor layer is $10^{18}$ cm$^{-3}$ or more. This more positively allows a tunnel current to flow in the $p^+n^+$ junction between the p-type semiconductor layer and the second n-type semiconductor layer.

Preferably, the second semiconductor light emitting device further comprises: a fluorescent material covering the light emitting diode and the semiconductor film which absorbs the first emission light and emits third emission light through the optical excitation by the first emission light.

In the case where a YAG fluorescent material, e.g., is used for a fluorescent material, the arrangement allows high-brightness yellow light to be emitted as the third emission light through excitation caused by blue light. As a result, a white light emitting diode having an excellent color rendering property can be provided by combining the yellow third emission light with the high-brightness second emission light which is red.

In the second semiconductor light emitting device, the light emitting diode or the semiconductor film is preferably formed on a substrate made of a single crystal. Since the arrangement allows the light emitting diode and the semiconductor film to be formed on the substrate made of the single crystal by epitaxial growth, the crystal property of each of the first n-type semiconductor layer, the p-type semiconductor layer, the second n-type semiconductor layer, and the semiconductor film is improved so that a high-brightness white light emitting diode is obtainable. In addition, since the second emission light released from the semiconductor film can be extracted through the substrate, flip-chip mounting which forms, e.g., a high-reflectivity electrode on the semiconductor film can be performed so that a white light emitting diode having an excellent heat dissipation property is provided.

Preferably, the second semiconductor light emitting device further comprises: a metal film provided on the light emitting diode to have a thickness of at least 10 μm, wherein an operating current is injected in the light emitting diode through the metal film. The arrangement allows heat generated from the light emitting diode in operation to dissipate through the metal film so that a white light emitting diode having an excellent heat dissipation property and capable of high-output operation is obtainable.

In this case, the metal film is preferably made of gold, copper, or silver.

In the second semiconductor light emitting device, the light emitting diode is preferably provided with a metal electrode having a reflectivity of 60% or more with respect to the first emission light or the second emission light. In the arrangement, the first or second emission light is reflected strongly by the metal electrode so that the efficiency with which emission light is extracted is remarkably improved.

In this case, the metal electrode is preferably composed of a single-layer film or a multi-layer film each made of at least one material selected from the group consisting of gold, platinum, copper, silver, and rhodium.

In the second semiconductor light emitting device, the first emission light is preferably blue light or ultraviolet light. The arrangement allows a white light emitting diode having an excellent white color rendering property to be obtained by, e.g., covering the light emitting diode and the semiconductor film with an insulating material containing a YAG fluorescent material.

In the second semiconductor light emitting device, the second emission light is preferably red light. The arrangement provides a white light emitting diode having an excellent white color rendering property by covering the light emitting diode and the semiconductor film with an insulating material which contains a YAG fluorescent material and emits blue light as the first emission light.

In the second semiconductor light emitting device, the semiconductor film is preferably composed of a plurality of semiconductor films which are stacked in layers and emit emission light components having different wavelengths from each of the stacked layers. The arrangement allows a white light emitting diode having an excellent white color rendering property to be provided by constituting the plurality of semiconductor films such that they emit light in three colors which are red, green, and blue through excitation caused by, e.g., ultraviolet light.

In the second semiconductor light emitting device, the semiconductor film is preferably doped with impurities and the semiconductor film is preferably excited by the first emission light to emit the second emission light in a visible range via energy levels resulting from the impurities. The arrangement provides high-brightness emission light via the energy level of the impurity which may serve as a high-brightness luminescent center in the semiconductor film doped with the impurity. Accordingly, the brightness of the second emission light can be enhanced and the color rendering property can further be improved.

In the second semiconductor light emitting device, the semiconductor film is preferably doped with impurities to emit the second emission light in a visible range through light emission from inner-shell transition of the impurities. The arrangement allows high-efficiency red light emission and provides a white light emitting diode having a more excellent color rendering property.

In this case, the impurity is preferably Eu, Sm, or Yb.

Preferably, the impurities of the semiconductor film in the impurity are introduced by ion implantation. The arrangement allows the semiconductor film to be doped with the impurity with high controllability.

In the second semiconductor light emitting device, the light emitting diode or the semiconductor film is preferably made of a compound semiconductor containing nitrogen. The arrangement ensures the emission of high-brightness blue light or ultraviolet light as the first emission light and the emission of high-brightness red light as the second emission light so that white light having an excellent color rendering property is obtainable.

In the case where the light emitting diode and the semiconductor film are covered with an insulating material containing a fluorescent material, the fluorescent material is preferably yttrium aluminum garnet (YAG). The arrangement allows high-brightness yellow light to be obtained by using the blue excitation light from the light emitting diode. By mixing the blue emission light with the red second emission light from the semiconductor film, e.g., a high-brightness light emitting diode having an excellent white color rendering property can be provided.

In the case where the light emitting diode or the semiconductor film is formed on the substrate made of a single crystal, the single crystal is preferably sapphire, silicon carbide, gallium nitride, aluminum nitride, magnesium oxide, lithium gallium oxide, lithium aluminum oxide, or a mixed crystal of lithium gallium oxide and lithium aluminum oxide. Since the use of such a single crystal allows a nitride semiconductor layer having an excellent crystal property to be formed on the substrate, higher-brightness blue or ultraviolet light can be obtained as the first emission light so that higher-brightness red second emission light is obtainable by using the first emission light as the excitation light.

A third method for fabricating a semiconductor light emitting device according to the present invention comprises the steps of: (a) successively depositing a first n-type semiconductor layer, a p-type semiconductor layer, and a second n-type semiconductor layer on a substrate made of a single crystal to form a light emitting diode; and (b) selectively forming, on the light emitting diode, a semiconductor film which absorbs first emission light emitted from the light emitting diode and emit second emission light through the optical excitation by the first emission light, wherein an impurity concentration in each of the p-type semiconductor layer and the second n-type semiconductor layer is set in the step (a) to allow a current to flow from the second n-type semiconductor layer to the first n-type semiconductor layer when a voltage is applied such that the second n-type semiconductor layer has a positive potential relative to the first n-type semiconductor layer.

Since the third method for fabricating a semiconductor light emitting device allows the light emitting diode to output blue light as the first emission light and allows the semiconductor film to absorb the blue first emission light and release the second emission light, which is either red or green, a white light emitting diode having an excellent white color rendering property can be provided. In addition, an impurity concentration in each of the p-type semiconductor layer and the second n-type semiconductor layer is set to allow a tunnel current to flow in the $p^+n^+$ junction surface therebetween so that a rectifying property is obtained by applying a voltage between the second n-type semiconductor layer and the first n-type semiconductor layer such that it is higher to the second n-type semiconductor layer than to the first n-type semiconductor layer. Since the heavily doped second n-type semiconductor layer has a low resistance, a current is more likely to be dispersed in the in-plane direction of the pn junction surface. This obviates the necessity to use the transparent electrode and enhances the brightness of the emission light.

In the third method for fabricating a semiconductor light emitting device, the impurity concentration in each of the p-type semiconductor layer and the second n-type semiconductor layer is preferably $10^{18}$ cm$^{-3}$ or more.

Preferably, the third method for fabricating a semiconductor light emitting device further comprises the step of: (c) after the step (b), separating the substrate from the light emitting diode. The arrangement allows a white light emitting diode having an excellent heat dissipation property and capable of large-output operation to be provided through the separation of the substrate when the substrate is made of a material having a poor heat dissipation property such as, e.g., sapphire.

In this case, the step (c) preferably includes the step of irradiating the surface of the substrate opposite to the light emitting diode with light having a wavelength which is not absorbed by the substrate but is absorbed by the semiconductor layers composing the light emitting diode to form, in a part of the semiconductor layers irradiated with the light, a decomposition layer resulting from decomposition of the semiconductor layers. Even when the substrate has a relatively larger area, the arrangement allows no-split separation of the substrate from the light emitting diode with high reproducibility.

In this case, the third method for fabricating a semiconductor light emitting device preferably further comprises the steps of: (d) prior to the step (c), bonding a holding substrate made of a material other than that of the substrate to the light emitting diode or to the semiconductor film; and (e) after the step (c), separating the holding substrate from the light emitting diode or from the semiconductor film. The arrangement suppresses the occurrence of a crack in the semiconductor film in the process in which stress in the semiconductor is reduced by thermal decomposition during the formation the decomposition layer in the step (c). Accordingly, even when the substrate having a large area is used, the substrate can be separated without causing a crack in the light emitting diode.

BRIEF DESCRIPTION OF THE DRAWINGS

FIGS. 1A and 1B show a semiconductor light emitting device according to a first embodiment of the present invention, of which FIG. 1A is a cross-sectional view thereof and FIG. 1B is a plan view thereof;

FIGS. 6A and 6B show a semiconductor light emitting device according to a third embodiment of the present invention, of which FIG. 6A is a cross-sectional view thereof and FIG. 6B is a plan view thereof;

FIGS. 9A and 9B show a semiconductor light emitting device according to a fourth embodiment of the present invention, of which FIG. 9A is a cross-sectional view thereof and FIG. 9B is a plan view thereof;

FIGS. 13A and 13B show a semiconductor light emitting device according to a fifth embodiment of the present invention, of which FIG. 13A is a cross-sectional view thereof and FIG. 13B is a plan view thereof;

FIGS. 17A and 17B show a semiconductor light emitting device according to a sixth embodiment of the present invention, of which FIG. 17A is a cross-sectional view thereof and FIG. 17B is a plan view thereof;

FIGS. 26A and 26B show a semiconductor light emitting device according to an eighth embodiment of the present invention, of which FIG. 26A is a cross-sectional view thereof and FIG. 26B is a plan view thereof;

FIGS. 30A and 30B show a semiconductor light emitting device according to a ninth embodiment of the present invention, of which FIG. 30A is a cross-sectional view thereof and FIG. 30B is a plan view thereof;

FIGS. 33A and 33B show a semiconductor light emitting device according to a tenth embodiment of the present invention, of which FIG. 33A is a cross-sectional view thereof and FIG. 33B is a plan view thereof;

DESCRIPTION OF THE PREFERRED EMBODIMENTS

Embodiment 1

A first embodiment of the present invention will be described with reference to the drawings.

Figure 1A:
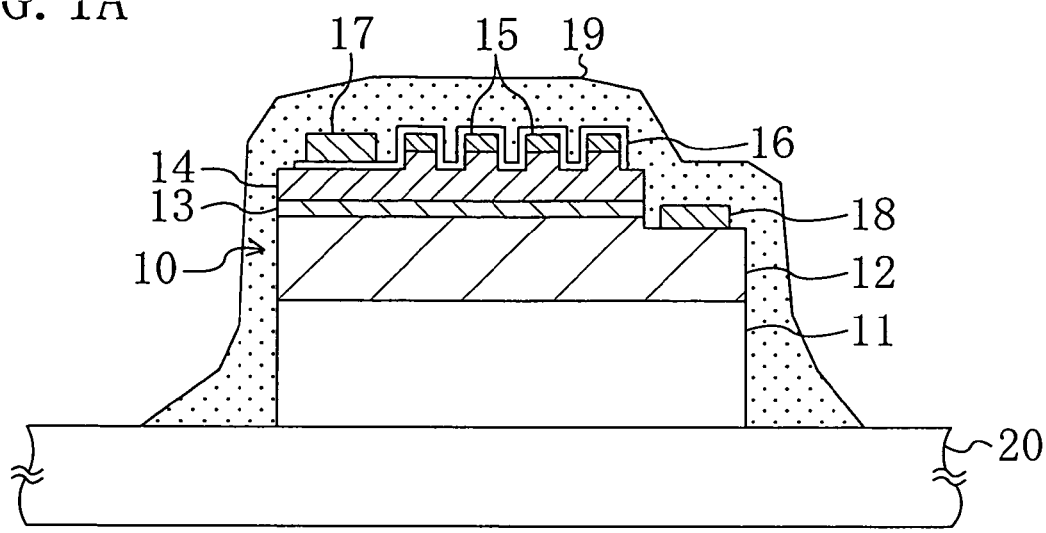
Figure 1B:
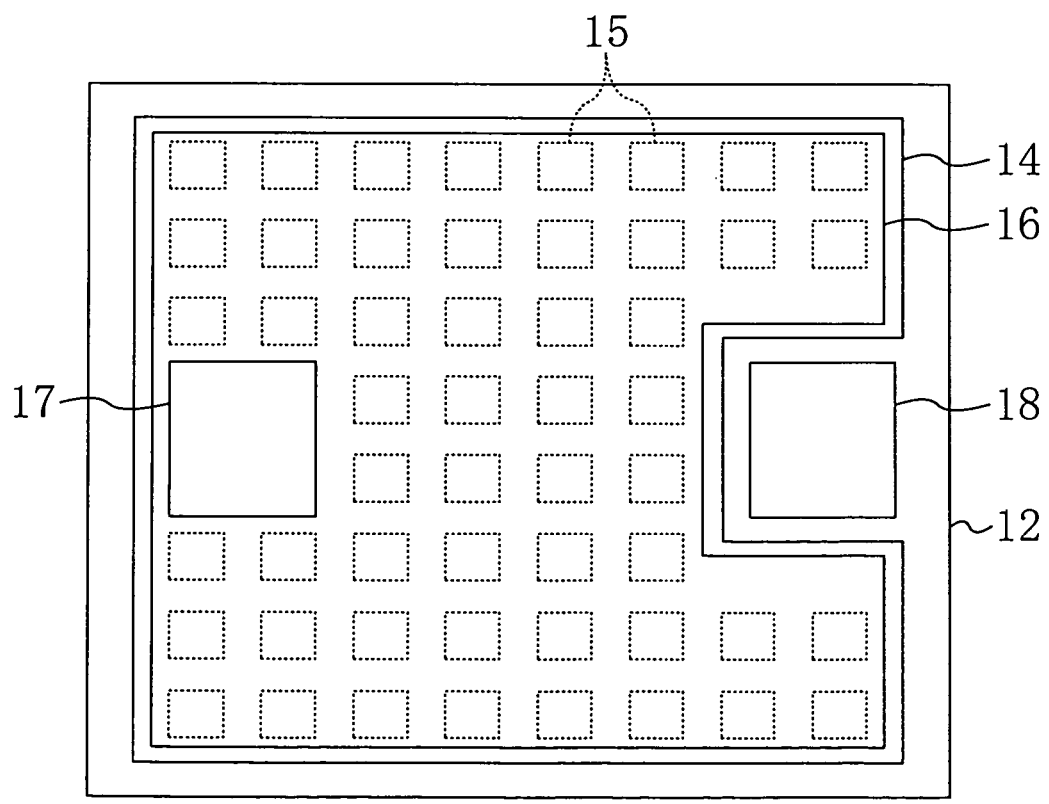

FIG. 1A shows a cross-sectional structure of a semiconductor light emitting device according to the first embodiment and FIG. 1B shows a plan structure thereof.

As shown in FIGS. 1A and 1B, a semiconductor light emitting device according to the first embodiment is composed of: a blue light emitting diode 10 mounted at a specified position on a package 20 as a mounting member; a red light emitting layer 15 grown epitaxially on the blue light emitting diode 10; and an insulating material 19 containing an yttrium aluminum garnet (YAG) fluorescent material. In FIG. 1B, the depiction of the insulating material 19 is omitted.

The blue light emitting diode 10 is composed of: an n-type semiconductor layer 12 made of n-type GaN; an active layer 13 having a multiple quantum well structure made of InGaN; and a p-type semiconductor layer 14 made of p-type $Al_{0.05}Ga_{0.95}N$ which are epitaxially grown successively on a substrate 11 made of, e.g., sapphire. The active layer 13 is composed of three well layers each made of $In_{0.35}Ga_{0.65}N$ having a thickness of 2 nm and three barrier layers each made of $In_{0.02}Ga_{0.98}N$ having a thickness of 10 nm which are alternately stacked, thereby emitting blue light at 470 nm.

The red light emitting layer 15 is made of, e.g., undoped $In_{0.4}Ga_{0.6}N$ with a forbidden band width of 1.9 eV and formed on the p-type semiconductor layer 14 to have a matrix configuration of discrete and spaced-apart squares with 2-µm to 20-µm sides when viewed in a plan view. Each square of the red light emitting layer 15 is excited by light outputted from the blue light emitting diode 10 to emit red light at 650 nm. Red light can be obtained from the red light emitting layer 15 by doping the red light emitting layer 15 with, e.g., zinc (Zn) and thereby reducing the composition of In, magnesium (Mg), or silicon (Si). By thus reducing the composition of In, a lattice mismatch with an underlie layer made of GaN normally used can be suppressed and crystal defects in the red light emitting layer 15 can be reduced so that high-brightness light emission is enabled. At this time, the emission light released from the red light emitting layer 15 is mixed with excitation light in a visible range which is generated via an energy level resulting from the impurity used for doping.

A transparent electrode 16 made of ITO (Indium Tin Oxide) has been formed over the entire surface of the p-type semiconductor layer 14 including the red light emitting layer 15. In addition, a p-side electrode 17 made of gold (Au) has been formed selectively on a region of the p-type semiconductor layer 14 via the transparent electrode 16.

The n-type semiconductor layer 12 has a portion thereof exposed and an n-side electrode 18 composed of a multilayer film of titanium (Ti) and gold (Au) has been formed on the exposed region.

It is to be noted that required metal fine lines are connected by wire bonding to the p-side and n-side electrodes 17 and 18, thought they are not depicted.

The insulating material 19 containing the YAG fluorescent material has been formed in such a manner that it is coated or applied dropwise onto the package 20 to cover the blue light emitting diode 10, the transparent electrode 16, the p-side electrode 17, and the n-side electrode 18. The insulating material 19 is excited by the blue light outputted from the blue light emitting diode 10 and emits yellow light.

Film forming conditions for the transparent electrode 16 have been optimized such that the transparent electrode 16 does not absorb the blue light from the blue light emitting diode 10 and a contact resistance with the p-type semiconductor layer 14 becomes, e.g., $1×10^{-3}$ $\Omega cm^2$ or less.

Figure 2:
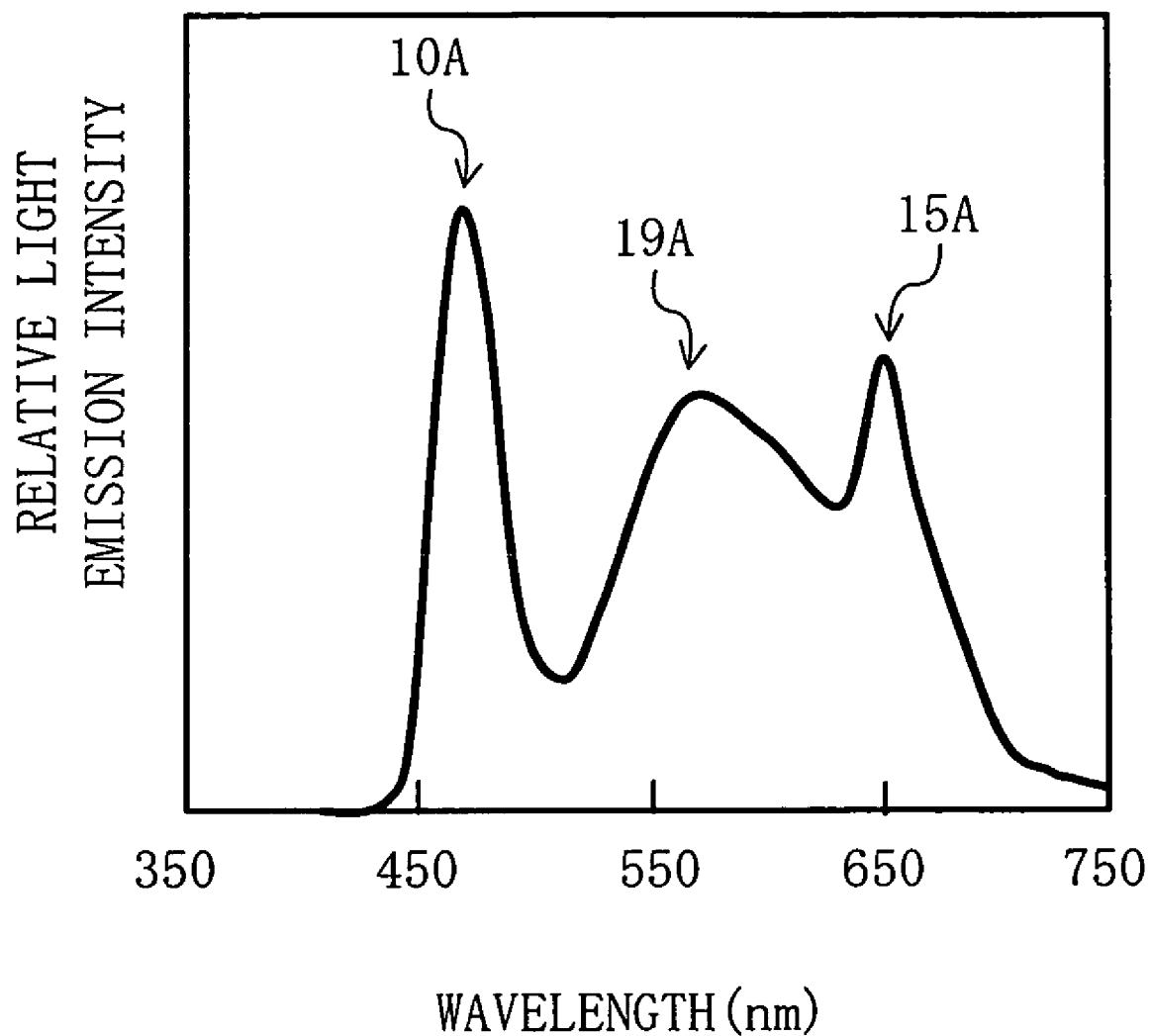
FIG. 2 is a graph showing an emission spectrum obtained from the semiconductor light emitting device according to the first embodiment.

A current is injected into the blue light emitting diode 10 via the p-side electrode 17, the transparent electrode 16, and the p-type semiconductor layer 14. The blue light emitting diode 10 is capable of operating at a relatively low voltage of, e.g., about 3 V. Accordingly, white light having the spectrum shown in FIG. 2 can be obtained by injecting a current of, e.g., 20 mA into the blue light emitting diode 10 and thereby causing the emission of blue light at a wavelength of 470 nm. In FIG. 2, the emission spectrum is composed of the transmitted component 10A of the blue light at a wavelength of 470 nm, yellow light 19A with a peak wavelength of 550 nm from the YAG fluorescent material, and red light 15A at a wavelength of 650 nm from the red light emitting layer 15. The blue light 10A, the yellow light 19A, and the red light 15A are mixed to provide white light.

Thus, the first embodiment allows one-chip integration of a light emitting diode in which the red light emitting layer 15 which receives blue light outputted from the blue light emitting diode 10 and emits red light through excitation caused thereby is provided between the insulating material 19 containing the YAG fluorescent material which emits yellow light and the blue light emitting diode 10 which emits blue light. Accordingly, the intensity of emission light in the red range is higher than in an emission spectrum obtained from the conventional white light emitting diode shown in FIG. 23 which provides white light by exciting the YAG fluorescent material with blue light from the blue light emitting diode. This allows a white light emitting diode which outputs white light having an excellent color rendering property to be provided.

The blue light emitting diode 10 may also be formed with an underlie layer made of GaN and a thin-film buffer layer made of GaN or AlN being interposed between the substrate 11 made of sapphire and the n-type semiconductor layer 12.

The active layer 13 may also be constituted to have the composition of In which is nonuniform in the in-plane direction (direction parallel to a substrate surface) of the active layer 13.

Instead of varying a lattice constant in each of the n-type semiconductor layer 12, the active layer 13, the p-type semiconductor layer 14, and the read semiconductor layer 15 which have been formed on the substrate 11, the composition of a group III element in a quaternary or higher-order mixed crystal may also be varied in forming the blue light emitting diode 10 and the red light emitting layer 15. This provides a structure from which high-brightness light emission can be obtained without incurring a crystal defect due to a lattice mismatch and the resulting nonradiative recombination.

In the first embodiment, the YAG fluorescent material and the red light emitting layer 15 are excited by the output light received thereby from the blue light emitting diode 10 and emit yellow light and red light, respectively, thereby providing white light. However, an ultraviolet light emitting diode which output ultraviolet light at a wavelength of, e.g., 340 nm may also be formed in place of the blue light emitting diode 10. In this case, a blue light emitting fluorescent material and a green light emitting fluorescent material are added to the insulating material 19.

It is also possible to separate the substrate 11 made of sapphire from the blue light emitting diode 10 and provide a metal film in place of the separated substrate. The arrangement allows the use of the provided metal film as an n-side electrode and obviates the necessity to form the n-side electrode 18 by exposing the n-type semiconductor layer 12.

Instead of ITO, a translucent multilayer film made of nickel (Ni) and gold (Au) which are stacked in layers may also be used to form the transparent electrode 16.

Referring to the drawings, a description will be given herein below to a method for fabricating the semiconductor light emitting device thus constructed.

FIGS. 3A through 3C and FIGS. 4A through 4C show the cross-sectional structures of the semiconductor light emitting device according to the first embodiment in the individual process steps of the fabrication method therefor. The drawings show, of a wafer on which a plurality of semiconductor light elements can be formed simultaneously, only one element formation region.

Figure 3A:
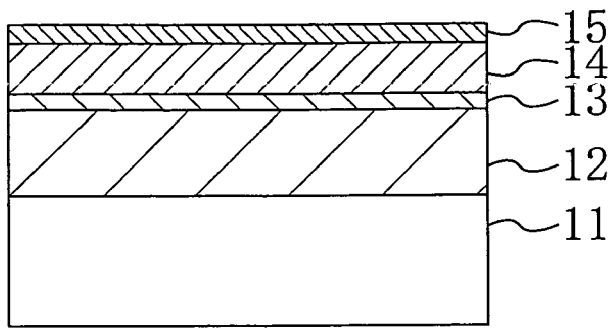
FIGS. 3A through 3C are cross-sectional views illustrating the individual process steps of a method for fabricating the semiconductor light emitting device according to the first embodiment.

First, as shown in FIG. 3A, the n-type semiconductor layer 12 made of n-type GaN, the active layer 13 having a multiple quantum well structure made of InGaN, the p-type semiconductor layer 14 made of p-type $Al_{0.05}Ga_{0.95}N$, and the red light emitting layer 15 made of undoped $In_{0.4}Ga_{0.6}N$ are grown successively by MOCVD (Metal Organic Chemical Vapor Deposition) on the substrate 11 made of sapphire having a principal surface of which the plane orientation is, e.g., the (0001) plane. As described above, the active layer 13 is composed of the three quantum well layers each made of $In_{0.35}Ga_{0.65}N$ having a thickness of 2 nm and the three barrier layers each made of $In_{0.02}Ga_{0.98}N$ having a thickness of 10 nm, which are alternately stacked. However, the structure of the active layer 13 is not limited thereto provided that the emission wavelength is about 470 nm. It is possible to form an underlie layer made of GaN and a thin-film buffer layer made of GaN or AlN between the substrate 11 and the n-type semiconductor layer 12. It is also possible to form the active layer 13 such that the composition of In is nonuniform in the in-plane direction (direction parallel to the substrate surface) of the active layer 13. It is also possible to obtain red emission light by using InGaN doped with, e.g., zinc, magnesium, or silicon, instead of using undoped $In_{0.4}Ga_{0.6}N$, and thereby forming the red light emitting layer 15 such that the composition of In is lower than 0.4.

Figure 3B:
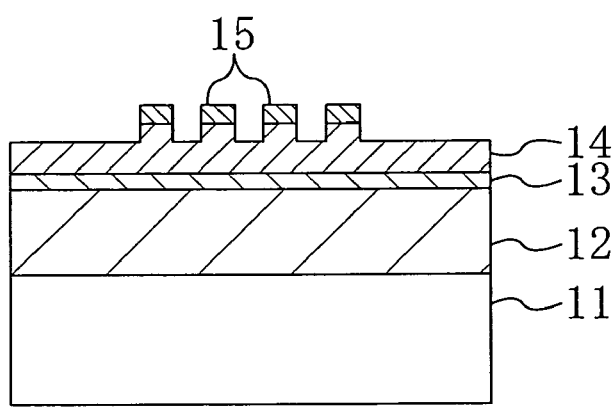

Next, as shown in FIG. 3B, a metal thin film (not shown) made of nickel and having a pattern consisting of a plurality of discrete and spaced-apart squares each having, e.g., 2-μm to 20-μm sides is formed on the red light emitting layer 15. Subsequently, the red light emitting layer 15 and an upper portion of the p-type semiconductor layer 14 are selectively removed by ICP (Inductive Coupled Plasma) etching using, e.g., a chlorine ($Cl_2$) gas by using the formed metal thin film as a mask. At this stage, the portion of the red light emitting layer 15 overlying the p-side electrode formation region is also removed.

Figure 3C:
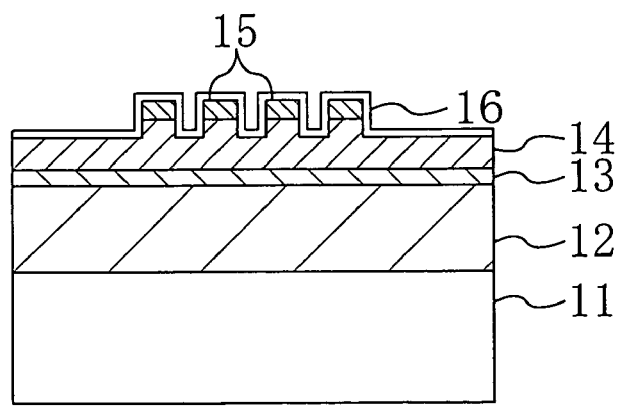

Next, as shown in FIG. 3C, the metal thin film for the mask is removed and then the transparent electrode 16 which is made of ITO with a thickness of about 300 nm and transmits visible light is formed by, e.g., radio-frequency (RF) sputtering over the selectively exposed portions of the p-type semiconductor layer 14 and the red light emitting layer 15 that has been divided into the plurality of islands each configured as a square when viewed in a plan view. Subsequently, the portion of the transparent electrode 16 overlying the n-side electrode formation region is removed by wet etching using, e.g., an aqueous hydrogen chloride (HCl) solution. Thereafter, a thermal process is performed in an oxygen atmosphere at a temperature of, e.g., about 600° C., thereby reducing the contact resistance and the resistivity of the transparent electrode 16 and improving the transmittance thereof.

Figure 4A:
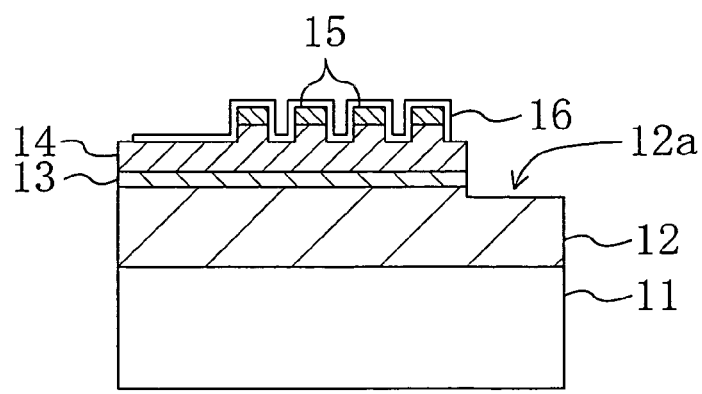
FIGS. 4A through 4C are cross-sectional views illustrating the individual process steps of the method for fabricating the semiconductor light emitting device according to the first embodiment.

Next, as shown in FIG. 4A, the respective portions of the p-type semiconductor layer 14 and the active layer 13 each overlying the n-side electrode formation region 12a are selectively removed by ICP etching, whereby the n-side electrode formation region 12a of the n-type semiconductor layer 12 is exposed.

Figure 4B:
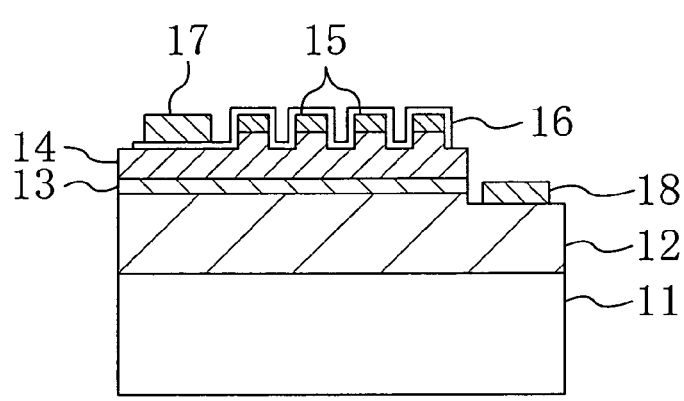

Next, as shown in FIG. 4B, the n-side electrode 18 as an ohmic electrode composed of a multilayer film of titanium (Ti) and gold (Au) is formed by, e.g., sputtering on the n-side electrode formation region 12a of the n-type semiconductor layer 12. Thereafter, sintering may also be performed appropriately in a nitrogen atmosphere at a temperature of, e.g., about 550° C. to reduce the contact resistance of the n-side electrode 18. Subsequently, the p-side electrode 17 made of gold (Au) and serving as a p-side electrode pad is formed selectively by, e.g., sputtering on the p-side electrode formation region of the transparent electrode 16. The order in which the n-side electrode 18 and the p-side electrode 17 are formed may also be reversed.

Figure 4C:
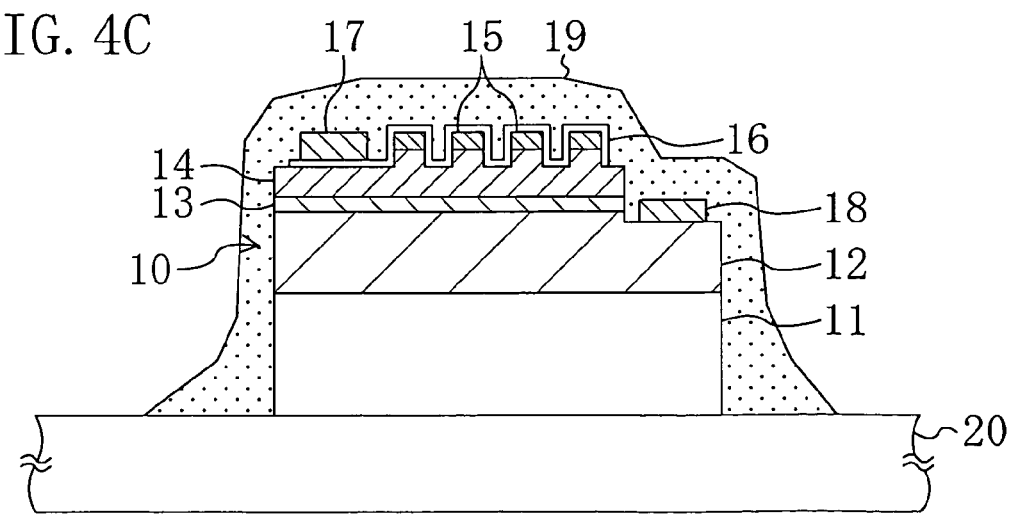

Next, as shown in FIG. 4C, after the formation of the p-side electrode 17, the resulting structure is divided into light emitting diode chips each having a 350-μm square size by, e.g., dicing. Subsequently, each of the chips resulting from the division is mounted on the specified region of the package 20 by using, e.g., a silver (Ag) paste. Thereafter, wire bonding is performed with respect to the p-side electrode 17 and the n-side electrode 18 and the insulating material 19 containing a YAG fluorescent material is further applied to cover the chip.

Thus, the fabrication method according to the first embodiment allows one-chip integration of a white light emitting diode in which the red light emitting layer 15 and the YAG fluorescent material are excited by the blue light from the blue light emitting diode 10. This enables the intensity of emission light in the red range to be higher than in the conventional white light emitting diode. As a result, it becomes possible to provide a white light emitting diode which outputs white light having an excellent color rendering property.

Embodiment 2

A second embodiment of the present invention will be described with reference to the drawings.

Figure 5:
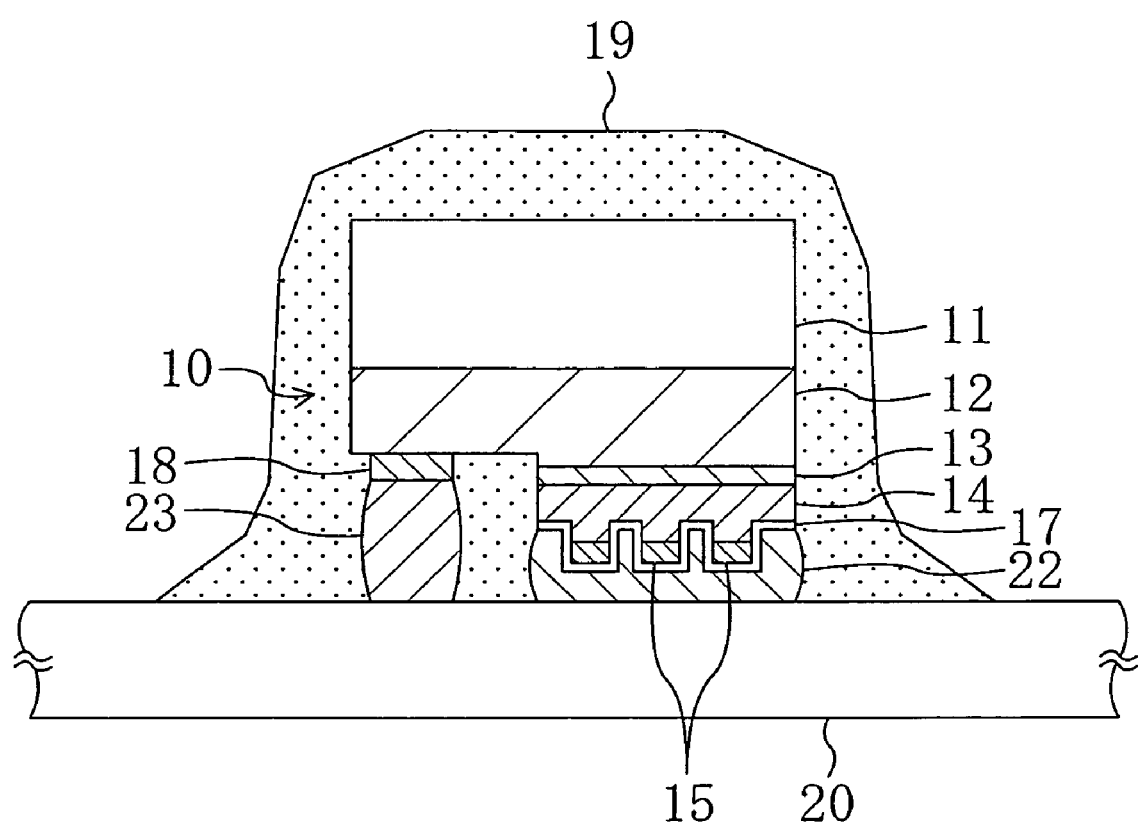
FIG. 5 is a cross-sectional view showing a semiconductor light emitting device according to a second embodiment of the present invention.

FIG. 5 shows a cross-sectional structure of a semiconductor light emitting device according to the second embodiment. The description of the components shown in FIG. 5 which are the same as those shown in FIG. 1A will be omitted by retaining the same reference numerals.

As shown in FIG. 5, the blue light emitting diode 10 in which the red light emitting layer 15 is formed selectively on the p-type semiconductor layer 14 is mounted by so-called flip-chip mounting such that the red light emitting layer 15 is opposed to the mounting surface of the package 20.

The p-type semiconductor layer 14 and the red light emitting layer 15 are connected electrically to the p-side electrode pad (not shown) of the package 20 by the p-side electrode 17 made of a multilayer film of platinum (Pt) and gold (Au) and a first bump 22 made of silver. On the other hand, the n-side electrode 18 is connected electrically to the n-side electrode pad (not shown) of the package 20 by a second bump 23 made of silver (Ag). The blue light emitting diode 10 containing the red light emitting layer 15 is covered with the insulating material 19 containing a YAG fluorescent material.

Thus, in the semiconductor light emitting device according to the second embodiment, the blue light from the active layer 13 and the red light emitted from the red light emitting layer 15 through excitation caused by the blue light is released upward through the substrate 11 made of sapphire. In addition, the blue light outputted from the active layer 13 excites a YAG fluorescent material and the excited YAG fluorescent material emits yellow light, as stated previously.

Consequently, even in the structure in which output light is extracted from the substrate 11 due to flip-chip mounting, the red light emitting layer 15 provided in the blue light emitting diode 10 allows the enhancement of an amount of emission light in the red range. As a result, it becomes possible to provide a white light emitting diode which outputs white light having an excellent color rendering property.

In addition, the structure in which output light is extracted from the substrate 11 according to the second embodiment obviates the necessity to provide the transparent electrode 16 on the surface of the p-side semiconductor layer 14.

Embodiment 3

A third embodiment of the present invention will be described with reference to the drawings.

Figure 6A:
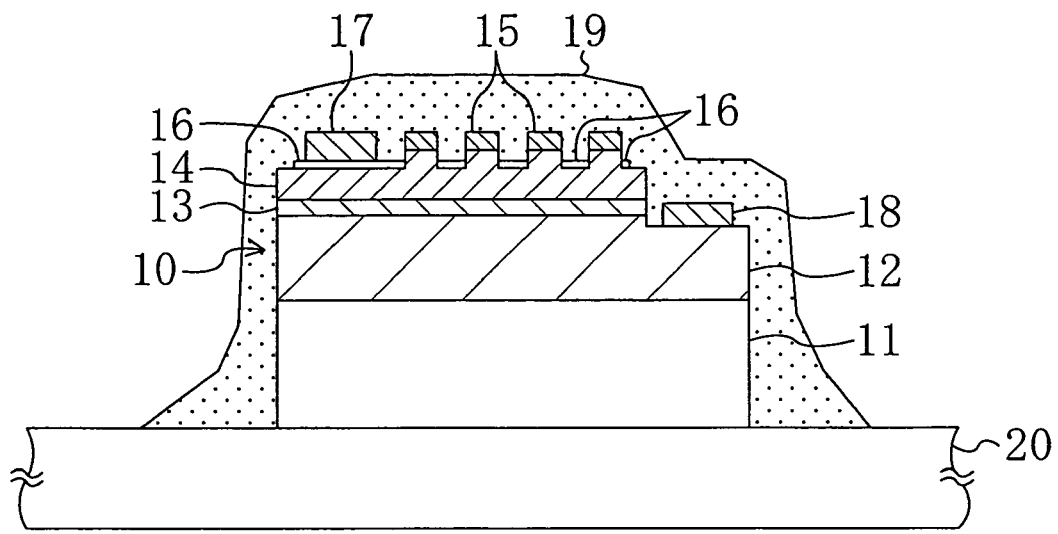
Figure 6B:
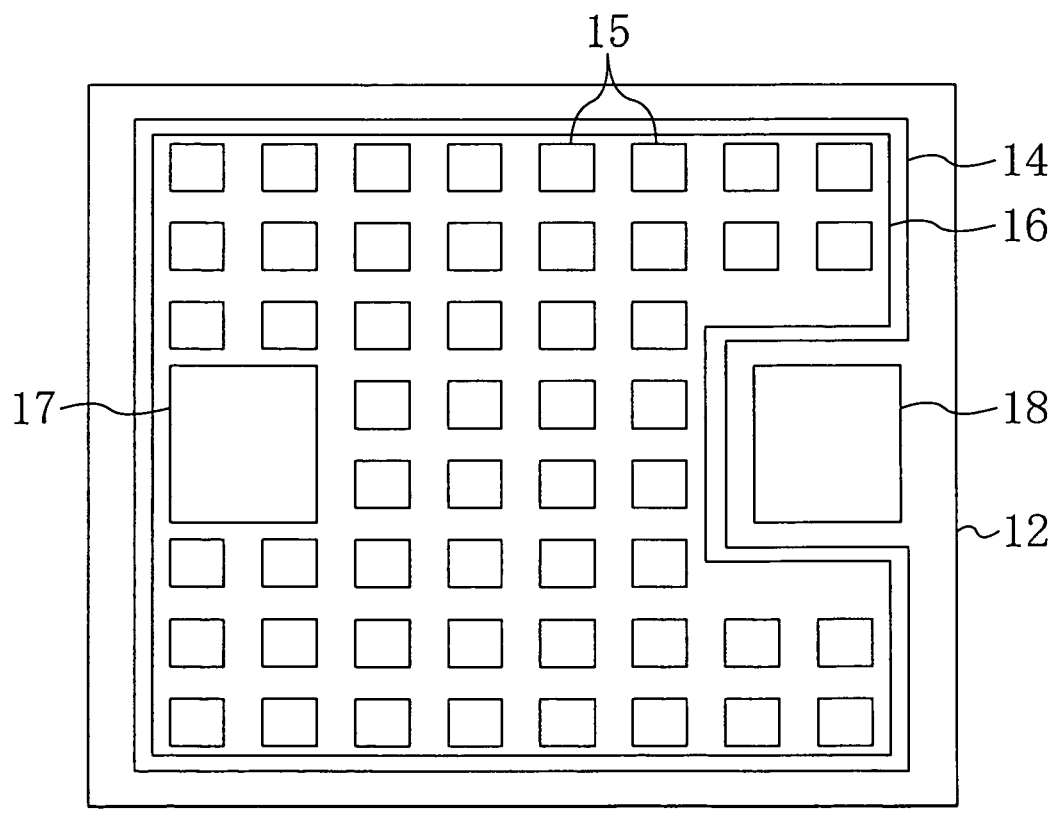

FIG. 6A shows a cross-sectional structure of a semiconductor light emitting device according to the third embodiment and FIG. 6B shows a plan structure thereof. The description of the components shown in FIGS. 6A and 6B which are the same as those shown in FIGS. 1A and 1B will be omitted by retaining the same reference numerals.

As shown in FIGS. 6A and 6B, the semiconductor light emitting device according to the third embodiment is composed of: the blue light emitting diode 10 mounted at a specified position on the package 20 as a mounting member; the red light emitting layer 15 grown epitaxially on the blue light emitting diode 10; and the insulating material 19 containing an yttrium aluminum garnet (YAG) fluorescent material.

The third embodiment is different from the first embodiment in that the transparent electrode 16 made of ITO covers only the upper surface of the p-type semiconductor layer 14 without covering the red light emitting layer 15. Accordingly, an emission spectrum obtained from the semiconductor light emitting device according to the third embodiment shows a spectrum pattern equal to the pattern shown in FIG. 2.

Thus, one-chip integration of the light emitting device is realized in which the red light emitting layer 15 and the YAG fluorescent material are excited by the blue light from the blue light emitting diode 10. This allows the enhancement of an amount of emission light in the red range to a value larger than in the conventional white light emitting diode which provides white light by exciting the YAG fluorescent material with the light emitted from the blue light emitting diode. As a result, it becomes possible to provide a white light emitting diode having an excellent white color rendering property. In addition, since the red light emitting layer 15 is not covered with the transparent electrode 16, the red light is no more absorbed by the transparent electrode 16 so that red emission light with a higher intensity is obtainable. This allows a white light emitting diode having a more excellent color rendering property to be provided.

Preferably, the size of the red light emitting layer 15 having a pattern consisting of discrete islands each configured as a square when viewed in a plan view is determined to allow a current injected from the transparent electrode 16 into the p-type semiconductor layer 14 to be sufficiently diffused in the active layer 13.

In the third embodiment also, an ultraviolet light emitting diode which outputs ultraviolet light at a wavelength of, e.g., 340 nm may also be formed in place of the blue light emitting diode 10. In this case, a blue light emitting fluorescent material and a green light emitting fluorescent material are added to the insulating material 19.

It is also possible to separate the substrate 11 made of sapphire from the blue light emitting diode 10 and provide a metal film in place of the separated substrate. The arrangement allows the provided metal film to be used as an n-side electrode and obviates the necessity to form the n-side electrode 18 by exposing the n-type semiconductor layer 12.

Instead of ITO, a translucent multilayer film composed of nickel (Ni) and gold (Au) which are stacked in layers may also be used to form the transparent electrode 16. Alternatively, the transparent electrode 16 may also be composed of a multilayer film of Ni and ITO.

Referring to the drawings, a description will be given herein below to a method for fabricating the semiconductor light emitting device thus constructed.

FIGS. 7A through 7D and FIGS. 8A through 8C show the cross-sectional structures of the semiconductor light emitting device according to the third embodiment in the individual process steps of the fabrication method therefor.

Figure 7A:
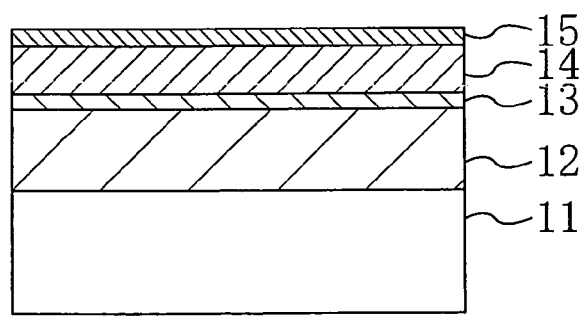
FIGS. 7A through 7D are cross-sectional views illustrating the individual process steps of a method for fabricating the semiconductor light emitting device according to the third embodiment.

First, as shown in FIG. 7A, the n-type semiconductor layer 12 made of n-type GaN, the active layer 13 having a multiple quantum well structure made of InGaN, the p-type semiconductor layer 14 made of p-type $Al_{0.05}Ga_{0.95}N$, and the red light emitting layer 15 made of undoped $In_{0.4}Ga_{0.6}N$ are grown successively by MOCVD on the substrate 11 made of sapphire having a principal surface of which the plane orientation is, e.g., the (0001) plane. The active layer 13 is composed of three quantum well layers each made of $In_{0.35}Ga_{0.65}N$ having a thickness of 2 nm and three barrier layers each made of $In_{0.02}Ga_{0.98}N$ having a thickness of 10 nm, which are alternately stacked. However, the structure of the active layer 13 is not limited thereto provided that the emission wavelength is about 470 nm. It is possible to form an underlie layer made of GaN and a thin-film buffer layer made of GaN or AlN between the substrate 11 and the n-type semiconductor layer 12. It is also possible to form the active layer 13 such that the composition of In is nonuniform in the in-plane direction (direction parallel to the substrate surface) of the active layer 13. It is also possible to obtain red emission light by using InGaN doped with, e.g., zinc, magnesium, or silicon, instead of using undoped $In_{0.4}Ga_{0.6}N$, and thereby forming the red light emitting layer 15 such that the composition of In is lower than 0.4.

Figure 7B:
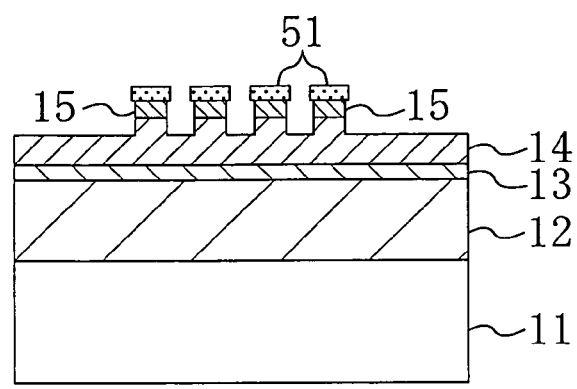

Next, as shown in FIG. 7B, a resist film 51 having a pattern consisting of a plurality of discrete and spaced-apart squares each having, e.g., 2-μm to 20-μm sides is formed on the red light emitting layer 15. Subsequently, the red light emitting layer 15 and an upper portion of the p-type semiconductor layer 14 are selectively removed by ICP dry etching using, e.g., a chlorine ($Cl_2$) gas by using the formed resist film 51 as a mask. At this stage, the portion of the red light emitting layer 15 overlying the p-side electrode formation region is also removed.

Figure 7C:
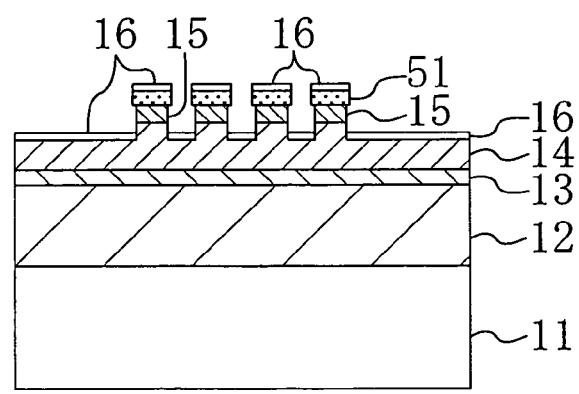

Next, as shown in FIG. 7C, the transparent electrode 16 which is made of ITO with a thickness of about 300 nm and transmits visible light is formed by, e.g., electron beam vapor deposition on each of the selectively exposed portions of the p-type semiconductor layer 14 including the red light emitting layer 15 that has been divided into the plurality of islands each configured as a square when viewed in a plan view and the resist film 51 covering the individual islands of the red light emitting layer 15.

Figure 7D:
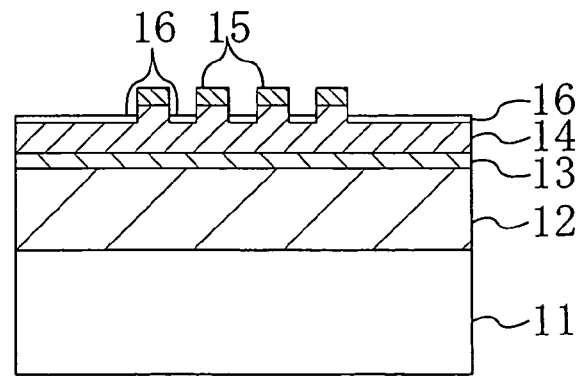

Next, as shown in FIG. 7D, the transparent electrode 16 formed selectively only on the p-type semiconductor layer 14 is obtained by a so-called lift-off process which removes the resist film 51. Subsequently, the portion of the transparent electrode 16 overlying the n-side electrode formation region is removed by wet etching using, e.g., an aqueous hydrogen chloride (HCl) solution. Thereafter, a thermal process is performed in an oxygen atmosphere at a temperature of, e.g., about 600° C., thereby reducing the contact resistance and the resistivity of the transparent electrode 16 and improving the transmittance thereof.

Figure 8A:
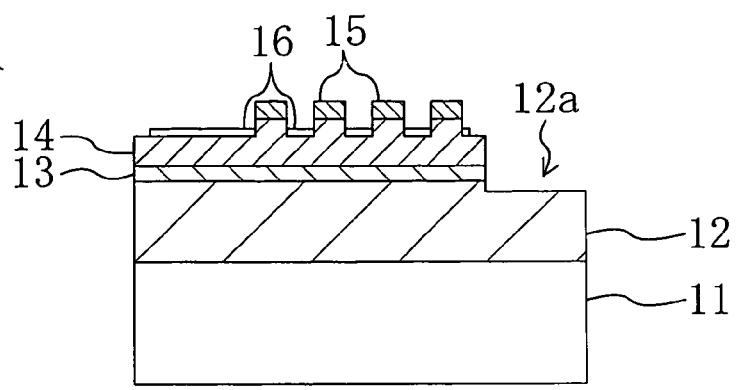
FIGS. 8A through 8C are cross-sectional views illustrating the individual process steps of the method for fabricating the semiconductor light emitting device according to the third embodiment.

Next, as shown in FIG. 8A, the respective portions of the p-type semiconductor layer 14 and the active layer 13 overlying the n-side electrode formation region 12a is selectively removed by ICP etching, whereby the n-side electrode formation region 12a of the n-type semiconductor layer 12 is exposed.

Figure 8B:
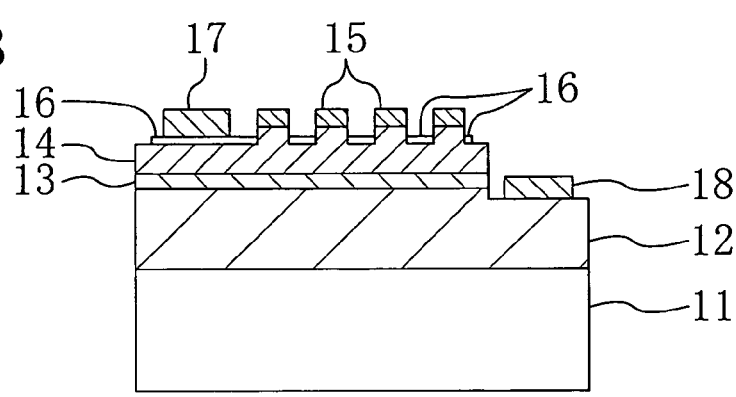

Next, as shown in FIG. 8B, the n-side electrode 18 as an ohmic electrode composed of a multilayer film of titanium (Ti) and gold (Au) is formed by, e.g., sputtering on the n-side electrode formation region 12a of the n-type semiconductor layer 12. Thereafter, sintering may also be performed appropriately to reduce the contact resistance of the n-side electrode 18 in a nitrogen atmosphere at a temperature of, e.g., about 550° C. Subsequently, the p-side electrode 17 made of gold (Au) and serving as a p-side electrode pad is formed selectively by, e.g., sputtering on the p-side electrode formation region of the transparent electrode 16. The order in which the n-side electrode 18 and the p-side electrode 17 are formed may also be reversed.

Figure 8C:
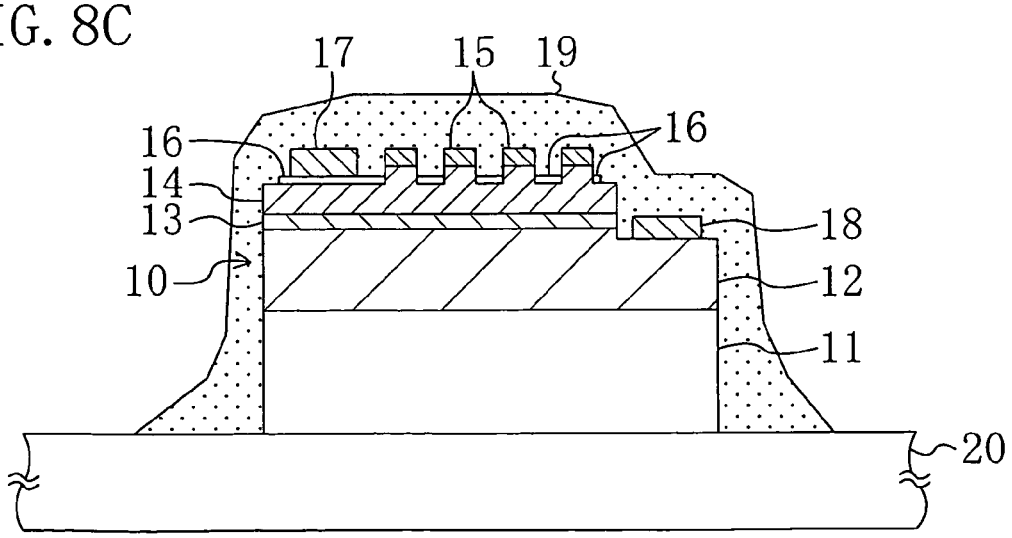

Next, as shown in FIG. 8C, the p-side electrode 17 is formed and then divided into light emitting diode chips each having a 350-µm square size by, e.g., dicing. Subsequently, each of the chips resulting from the division is mounted on the specified region of the package 20 by using, e.g., a silver (Ag) paste. Thereafter, wire bonding is performed with respect to the p-side electrode 17 and the n-side electrode 18 and the insulating material 19 containing a YAG fluorescent material is further applied to cover the chip.

Thus, the fabrication method according to the third embodiment allows one-chip integration of a white light emitting diode in which the red light emitting layer 15 and the YAG fluorescent material are excited by the blue light outputted from the blue light emitting diode 10. This enables the intensity of emission light in the red range to be higher than in the conventional white light emitting diode. As a result, it becomes possible to provide a white light emitting diode which outputs white light having an excellent color rendering property.

In addition, since the red light emitting layer 15 is not covered with the transparent electrode 16, there is no more absorption of the red light by the transparent electrode 16 so that red emission light with a higher intensity is obtainable. This provides white light having a more excellent color rendering property.

Embodiment 4

A fourth embodiment of the present invention will be described with reference to the drawings.

Figure 9A:
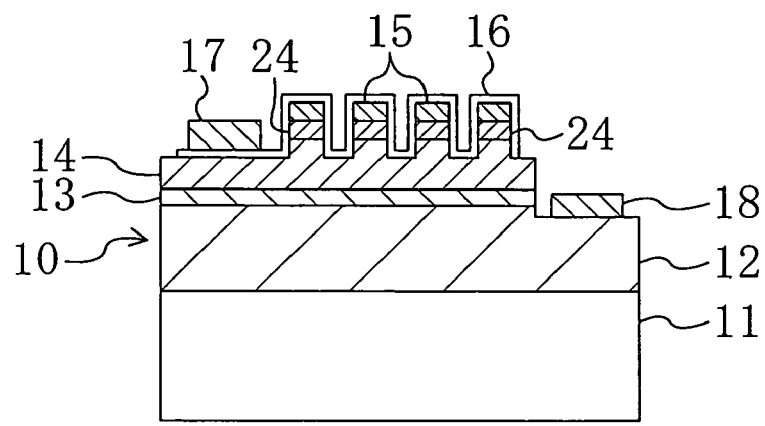
Figure 9B:
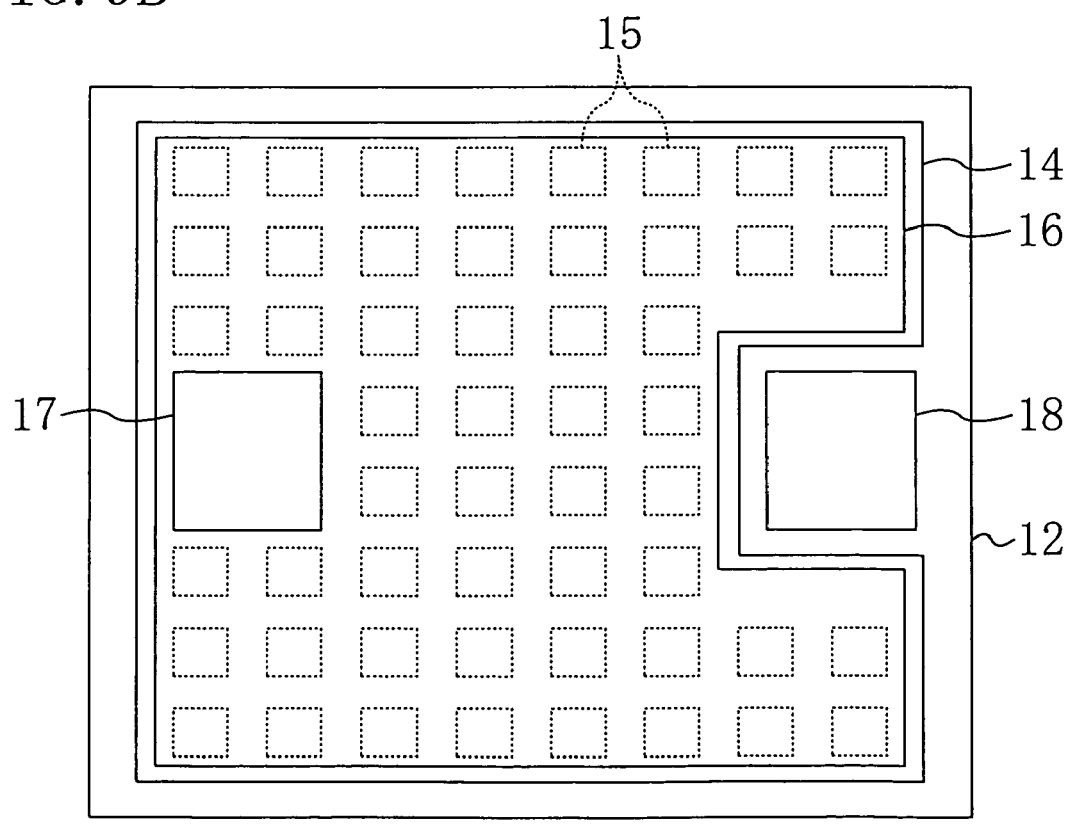

FIG. 9A shows a cross-sectional structure of a semiconductor light emitting device according to the fourth embodiment and FIG. 9B shows a plan structure thereof. The description of the components shown in FIGS. 9A and 9B which are the same as those shown in FIGS. 1A and 1B will be omitted by retaining the same reference numerals.

As shown in FIGS. 9A and 9B, the semiconductor light emitting device according to the fourth embodiment is composed of: the blue light emitting diode 10; a green light emitting layer 24 grown epitaxially on the blue light emitting diode 10; and the red light emitting layer 15 grown epitaxially on the green light emitting layer 24.

The fourth embodiment is different from the first embodiment in that it provides the green light emitting layer 24 which is made of $In_{0.2}Ga_{0.8}N$ and excited by blue light at a wavelength of 470 nm emitted from the blue light emitting diode 10 to emit green light at a wavelength of 555 nm and thereby obviates the necessity for the insulating material 19 covering the blue light emitting diode 10 and containing a YAG fluorescent material which emits yellow light.

Green light and red light can be obtained from the green light emitting layer 24 and the red light emitting layer 15 by doping each of the red light emitting layer 15 and the green light emitting layer 24 with, e.g., zinc (Zn), magnesium (Mg), or silicon (Si) and thereby reducing the composition of In in each of the light emitting layers. By thus reducing the composition of In, a lattice mismatch with an underlie layer made of GaN normally used can be suppressed and crystal defects in the green light emitting layer 24 and the red light emitting layer 15 can be reduced so that high-brightness light emission is enabled.

Figure 10:
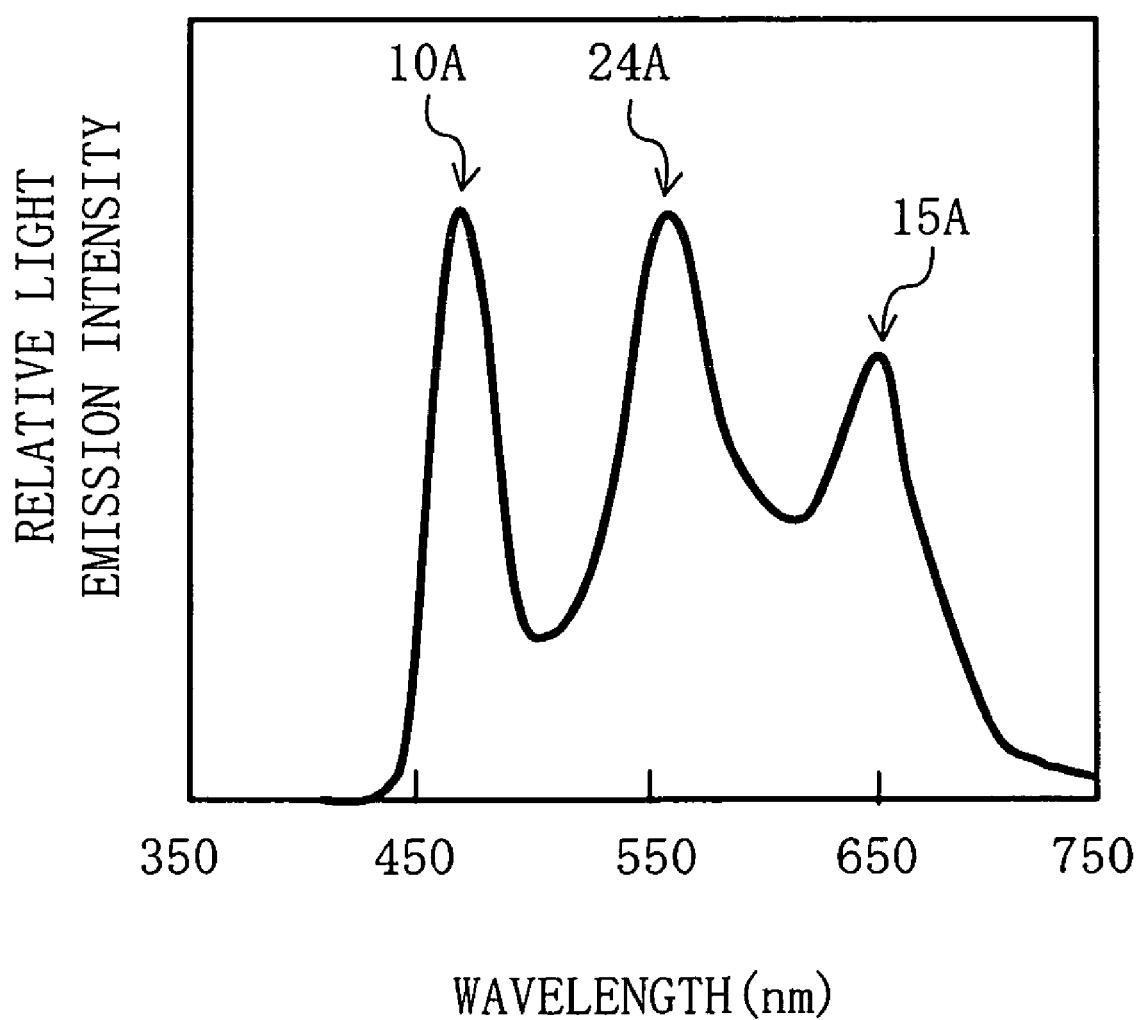
FIG. 10 is a graph showing an emission spectrum obtained from the semiconductor light emitting device according to the fourth embodiment.

White light having the spectrum shown in FIG. 10 can be obtained by injecting a current of, e.g., 20 mA into the blue light emitting diode 10 and thereby causing the emission of blue light at a wavelength of 470 nm. In FIG. 10, the emission spectrum is composed of the transmitted component 10A of the blue light at a wavelength of 470 nm, green emission light 24A with a peak wavelength of 555 nm from the green light emitting layer 24, and the red light 15A at a wavelength of 650 nm from the red light emitting layer 15. The blue light 10A, the green light 24A, and the red light 15A are mixed to provide white light.

Thus, the fourth embodiment allows one-chip integration of a light emitting diode in which the green light emitting layer 24 and the red light emitting layer 15 which receive blue light outputted from the blue light emitting diode 10 and generate green light and red light through excitation caused by the received blue light are provided on the blue light emitting diode 10. Accordingly, the intensity of emission light in the red range is higher than in an emission spectrum obtained from the conventional white light emitting diode which provides white light by exciting the YAG fluorescent material with blue light from the blue light emitting diode. This allows a white light emitting diode which outputs white light having an excellent color rendering property to be provided.

Although white light has been obtained in the fourth embodiment through the reception of the output light from the blue light emitting diode 10, the excitation of the green light emitting layer 24 and the red light emitting layer 15, and the emission of green light and red light therefrom, an ultraviolet light emitting diode which outputs ultraviolet light at a wavelength of, e.g., 340 nm may also be formed in place of the blue light emitting diode 10. In this case, the ultraviolet light emitting diode is covered with an insulating material containing a blue light emitting fluorescent material.

It is also possible to separate the substrate 11 made of sapphire from the blue light emitting diode 10 and provide a metal film in place of the separated substrate. The arrangement allows the provided metal film to be used as an n-side electrode and obviates the necessity to form the n-side electrode 18 by exposing the n-type semiconductor layer 12.

Instead of ITO, a translucent multilayer film composed of nickel (Ni) and gold (Au) which are stacked in layers may also be used to form the transparent electrode 16. Alternatively, the transparent electrode 16 may also be composed of a multilayer film of Ni and ITO.

Referring to the drawings, a description will be given herein below to a method for fabricating the semiconductor light emitting device thus constructed.

FIGS. 11A through 11C and FIGS. 12A and 12B show the cross-sectional structures of the semiconductor light emitting device according to the fourth embodiment in the individual process steps of the fabrication method therefor.

Figure 11A:
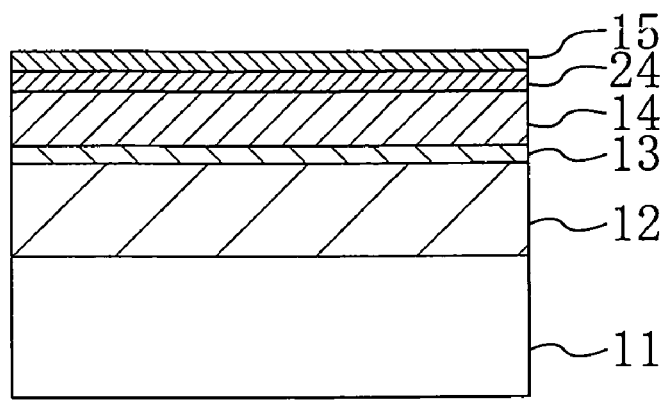
FIGS. 11A through 11C are cross-sectional views illustrating the individual process steps of a method for fabricating the semiconductor light emitting device according to the fourth embodiment.

First, as shown in FIG. 11A, the n-type semiconductor layer 12 made of n-type GaN, the active layer 13 having a multiple quantum well structure made of InGaN, the p-type semiconductor layer 14 made of p-type $Al_{0.05}Ga_{0.95}N$, the green light emitting layer 24 made of undoped $In_{0.2}Ga_{0.8}N$, and the red light emitting layer 15 made of undoped $In_{0.4}Ga_{0.6}N$ are grown successively by MOCVD on the substrate 11 made of sapphire having a principal surface of which the plane orientation is, e.g., the (0001) plane. The active layer 13 is composed of three quantum well layers each made of $In_{0.35}Ga_{0.65}N$ having a thickness of 2 nm and three barrier layers each made of $In_{0.02}Ga_{0.98}N$ having a thickness of 10 nm, which are alternately stacked. However, the structure of the active layer 13 is not limited thereto provided that the emission wavelength is about 470 nm. The forbidden band width of the green light emitting layer 24 is 2.3 eV and emits green light at 555 nm. The forbidden band width of the red light emitting layer 15 is 1.9 eV and emits red light at 650 nm. It is possible to form an underlie layer made of GaN and a thin-film buffer layer made of GaN or AlN between the substrate 11 and the n-type semiconductor layer 12. It is also possible to obtain green emission light and red emission light by using InGaN doped with, e.g., zinc, magnesium, or silicon, instead of using undoped $In_{0.2}Ga_{0.8}N$ and $In_{0.4}Ga_{0.6}N$, and thereby forming the green light emitting layer 24 and the red light emitting layer 15 such that the composition of In is lower than 0.2 and 0.4, respectively.

Figure 11B:
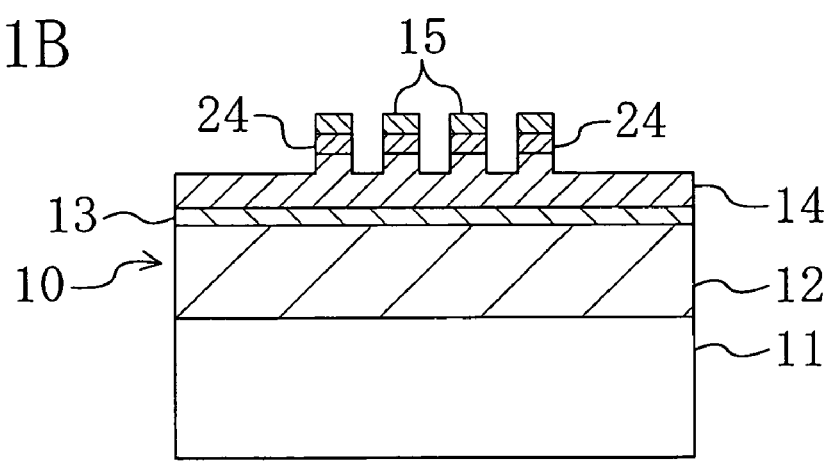

Next, as shown in FIG. 11B, a metal thin film (not shown) made of nickel and having a pattern consisting of a plurality of discrete and spaced-apart squares each having, e.g., 2- μm to 20-μm sides is formed on the red light emitting layer 15. Subsequently, the red light emitting layer 15, the green light emitting layer 24, and an upper portion of the p-type semiconductor layer 14 are selectively removed by ICP etching using, e.g., a chlorine ($Cl_2$) gas by using the formed metal thin film as a mask. At this stage, the respective portions of the red light emitting layer 15 and the green light emitting layer 24 overlying the p-side electrode formation region are also removed.

Figure 11C:
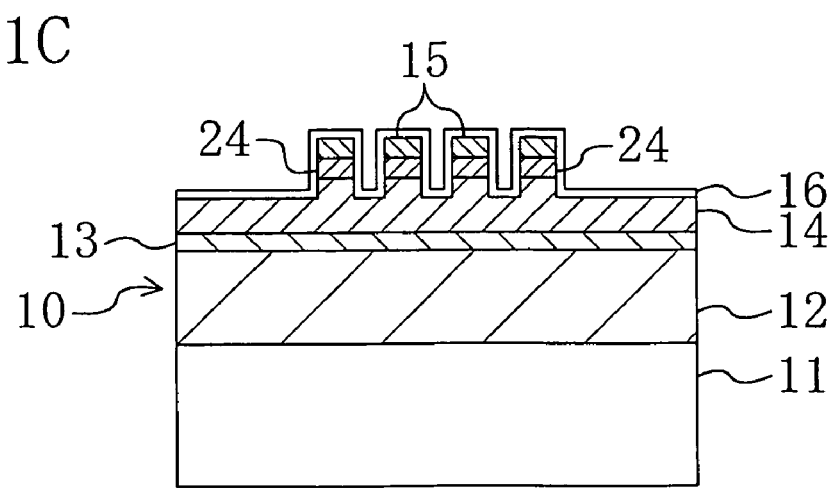

Next, as shown in FIG. 11C, the metal thin film is removed and then the transparent electrode 16 which is made of ITO with a thickness of about 300 nm and transmits visible light is formed by, e.g., RF sputtering over the selectively exposed portions of the p-type semiconductor layer 14 and the red light emitting layer 15 that has been divided into the plurality of islands each configured as a square when viewed in a plan view. Subsequently, the portion of the transparent electrode 16 overlying the n-side electrode formation region is removed by wet etching using, e.g., an aqueous hydrogen chloride (HCl) solution. Thereafter, a thermal process is performed in an oxygen atmosphere at a temperature of, e.g., about 600° C., thereby reducing the contact resistance and the resistivity of the transparent electrode 16 and improving the transmittance thereof.

Figure 12A:
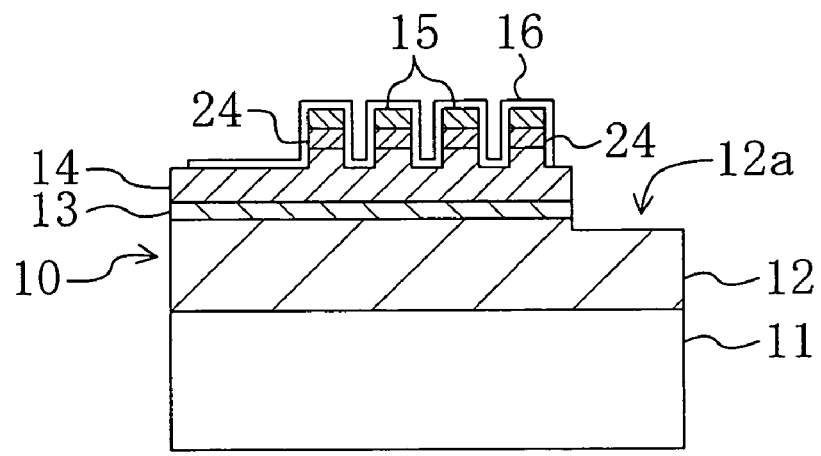
FIGS. 12A and 12B are cross-sectional views illustrating the individual process steps of the method for fabricating the semiconductor light emitting device according to the fourth embodiment.

Next, as shown in FIG. 12A, the respective portions of the p-type semiconductor layer 14 and the active layer 13 overlying the n-side electrode formation region 12a are selectively removed by ICP etching, whereby the n-side electrode formation region 12a of the n-type semiconductor layer 12 is exposed.

Figure 12B:
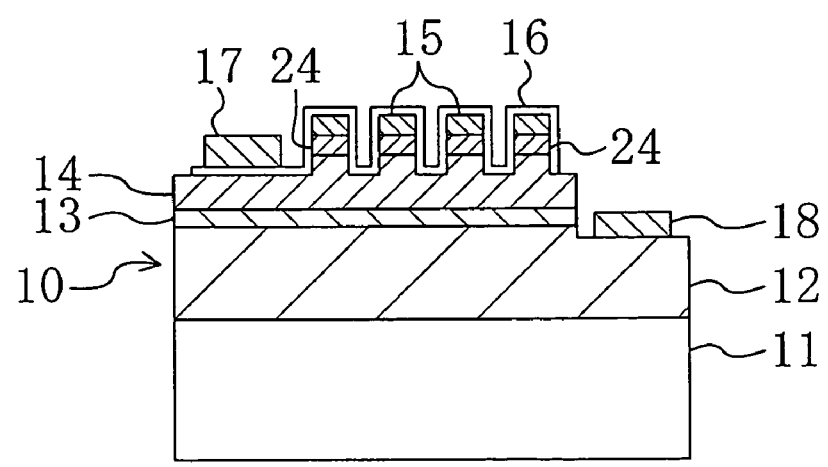

Next, as shown in FIG. 12B, the n-side electrode 18 as an ohmic electrode composed of a multilayer film of titanium (Ti) and gold (Au) is formed by, e.g., sputtering on the exposed n-side electrode formation region 12a of the n-type semiconductor layer 12. Thereafter, sintering may also be performed appropriately to reduce the contact resistance of the n-side electrode 18 in a nitrogen atmosphere at a temperature of, e.g., about 550° C. Subsequently, the p-side electrode 17 made of gold (Au) and serving as a p-side electrode pad is formed selectively by, e.g., sputtering on the p-side electrode formation region of the transparent electrode 16. The order in which the n-side electrode 18 and the p-side electrode 17 are formed may also be reversed. Thereafter, the resulting structure is divided into light emitting diode chips each having a 350-μm square size by, e.g., dicing. Subsequently, each of the chips resulting from the division is mounted on the specified region of a package (not shown) by using, e.g., a silver (Ag) paste. Thereafter, wire bonding is performed with respect to the p-side electrode 17 and the n-side electrode 18.

Thus, the fabrication method according to the fourth embodiment allows one-chip integration of a white light emitting diode in which the green light emitting layer 24 and the red light emitting layer 15 are excited by the blue light from the blue light emitting diode 10. This enables the intensity of emission light in the red range to be higher than in the conventional white light emitting diode. As a result, it becomes possible to provide a white light emitting diode which outputs white light having an excellent color rendering property.

In addition, the step of applying the insulating material containing the YAG fluorescent material can be eliminated so that the fabrication process is simplified.

Embodiment 5

A fifth embodiment of the present invention will be described with reference to the drawings.

Figure 13A:
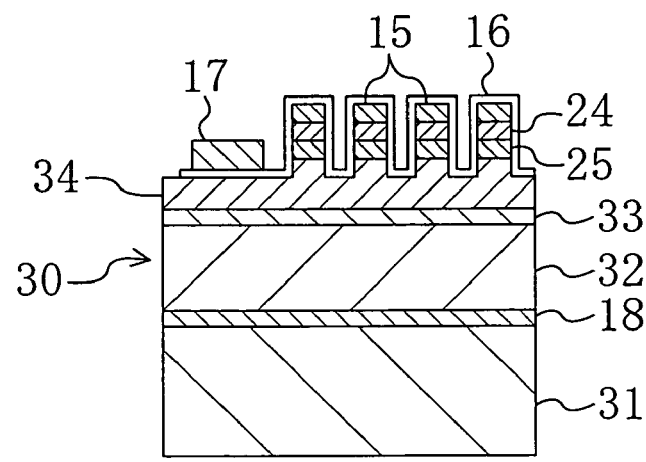
Figure 13B:
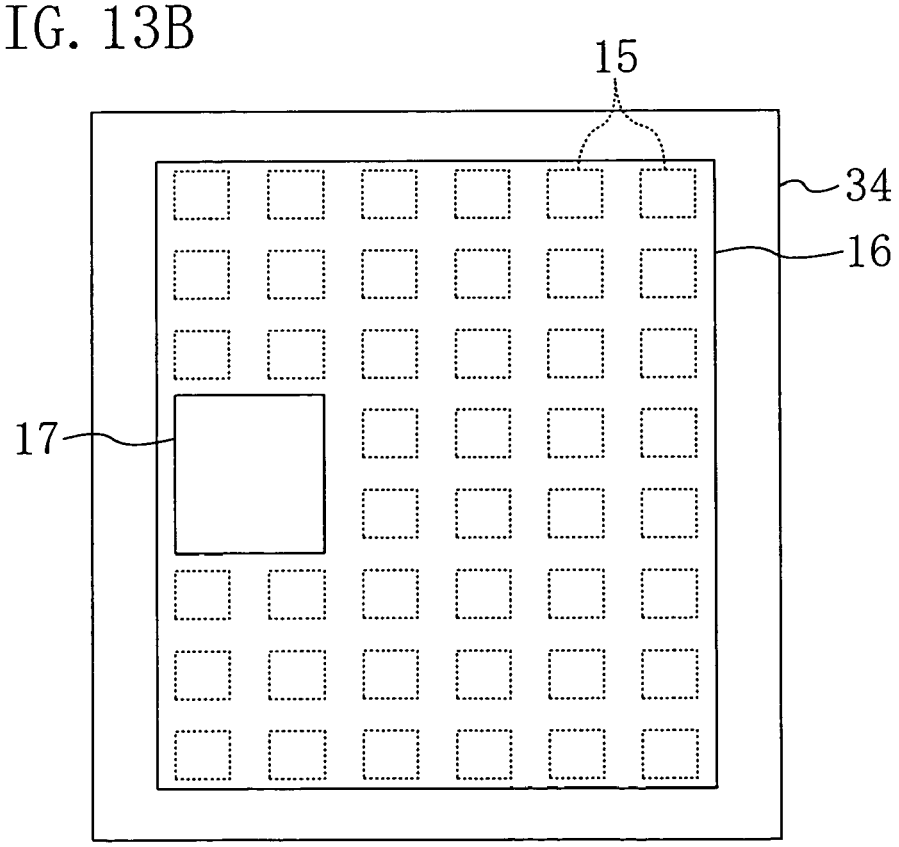

FIG. 13A shows a cross-sectional structure of a semiconductor light emitting device according to the fifth embodiment and FIG. 13B shows a plan structure thereof.

As shown in FIGS. 13A and 13B, the semiconductor light emitting device according to the fifth embodiment is composed of: an ultraviolet light emitting diode 30; a blue light emitting layer 25; the green light emitting layer 24; and the red light emitting layer 15, each of which has been grown epitaxially on the ultraviolet light emitting diode 30.

The ultraviolet light emitting diode 30 is composed of: an n-type semiconductor layer 32 made of, e.g., n-type $Al_{0.1}Ga_{0.9}N$; an active layer 33 having a multiple quantum well structure made of InGaN and AlGaN; and a p-type semiconductor layer 34 made of p-type $Al_{0.15}Ga_{0.85}N$. The active layer 33 is composed of five well layers each made of $In_{0.02}Ga_{0.98}N$ having a thickness of 1.5 nm and five barrier layers each made of $Al_{0.15}Ga_{0.85}N$ having a thickness of 10 nm which are alternately stacked, thereby emitting ultraviolet light at 340 nm.

The n-side electrode 18 composed of a multilayer structure of titanium (Ti) and gold (Au) has been formed on the entire surface of the n-type semiconductor layer 32 opposite to the active layer 33. A plating layer 31 made of gold (Au) with a thickness of 10 μm or more, e.g., about 50 μm has been formed on the entire surface of the n-side electrode 18 opposite to the n-type semiconductor layer 32 to substantially function as the n-side electrode. Preferably, a material having a reflectivity of 60% or more with respect to ultraviolet light, blue light, green light, and red light is used herein for the n-side electrode 18. For example, a single layer film made of, e.g., gold (Au), platinum (Pt), copper (Cu), silver (Ag), or rhodium (Rh) or a multilayer film containing at least two of the foregoing elements can be used. For the gold plating layer 31, copper (Cu) or silver (Ag) can be used instead of gold (Au).

The blue light emitting layer 25 is made of, e.g., undoped $In_{0.15}Ga_{0.85}N$ with a forbidden band width of 2.6 eV and formed on the p-type semiconductor layer 34 to have a configuration consisting of a plurality of discrete and spaced-apart islands. The green light emitting layer 24 is made of, e.g., undoped $In_{0.2}Ga_{0.8}N$ with a forbidden band width of 2.2 eV and formed on the blue light emitting layer 25 to have the same plan configuration as the blue light emitting layer 25. The red light emitting layer 15 is made of, e.g., undoped $In_{0.4}Ga_{0.6}N$ with a forbidden band width of 1.9 eV and formed on the green light emitting layer 24 to have the same plan configuration as the green light emitting layer 24. The blue light emitting layer 25, the green light emitting layer 24, and the red light emitting layer 15 are excited by the ultraviolet light outputted from the ultraviolet light emitting diode 30 to emit blue light at a wavelength of 470 nm, green light at a wavelength of 555 nm, and red light at a wavelength of 650 nm. Blue light emission, green light emission, and red light emission can be obtained from the blue light emitting layer 25, the green light emitting layer 24, and the red light emitting layer 15 by doping each of the blue light emitting layer 25, the green light emitting layer 24, and the red light emitting layer 15 with, e.g., zinc (Zn), magnesium (Mg), or silicon (Si) and thereby reducing the composition of In in each of the light emitting layers. By thus reducing the composition of In, a lattice mismatch with an underlie layer made of GaN normally used can be suppressed and crystal defects in the blue light emitting layer 25, in the green light emitting layer 24, and in the red light emitting layer 15 can be reduced so that high-brightness light emission is enabled.

On the entire surface of the p-type semiconductor layer 34 including the blue light emitting layer 25, the green light emitting layer 24, and the red light emitting layer 15, the transparent electrode made of ITO has been formed. Further, the p-side electrode 17 made of gold (Au) has been formed on a region of the p-type semiconductor layer 34 with the transparent electrode 16 being interposed therebetween.

Figure 14:
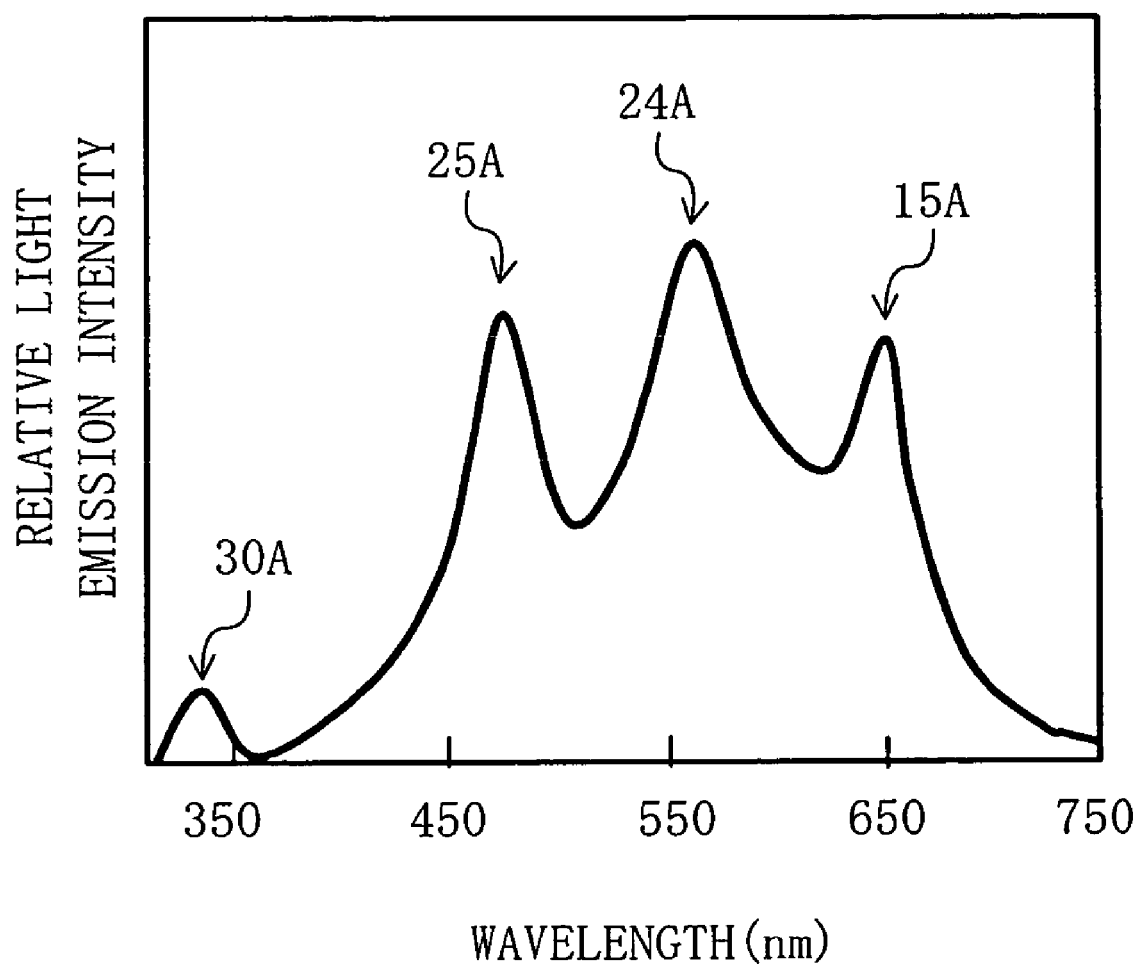
FIG. 14 is a graph showing an emission spectrum obtained from the semiconductor light emitting device according to the fifth embodiment.

A current is injected into the ultraviolet light emitting diode 30 via the p-side electrode 17, the transparent electrode 16, and the p-type semiconductor layer 34. The ultraviolet light emitting diode 30 is capable of operating at a relatively low voltage of, e.g., about 3 V. Accordingly, white light having the spectrum shown in FIG. 14 can be obtained by injecting a current of, e.g., 20 mA into the ultraviolet light emitting diode 30 and thereby causing the emission of ultraviolet light at a wavelength of 340 nm. In FIG. 14, the emission spectrum is composed of the transmitted component 30A of the ultraviolet light at a wavelength of 340 nm which is low in intensity, blue light 25A with a peak wavelength of 470 nm from the blue light emitting layer 25, green light 24A with a peak wavelength of 555 nm from the green light emitting layer 24, and the red light 15A at a wavelength of 650 nm from the red light emitting layer 15. The blue light 25A, the green light 24A, and the red light 15A are mixed to provide white light.

The fifth embodiment is characterized in that the n-side electrode 18 is formed over the entire surface (back surface) of the n-type semiconductor layer 32 opposite to the active layer 33 by removing the substrate made of sapphire for epitaxial growth and the gold plating layer 31 is further provided. The arrangement remarkably improves the heat dissipation property of the ultraviolet light emitting diode 30 and allows a higher-output white light emitting diode to be provided. In addition, since the n-side electrode 18 and the p-side electrode 17 are disposed in opposing relation with the active layer 33 interposed therebetween, a series resistance between the n-side electrode 18 and the p-side electrode 17 can be reduced advantageously. Since the insulating substrate made of sapphire or the like has been removed, it is unnecessary to provide the n-side electrode 18 on the upper portion of the n-type semiconductor layer 32. This achieves a reduction in chip size and allows the elimination of the step of etching away the n-side semiconductor layer 32 from the side of the p-type semiconductor layer 34.

Thus, the fifth embodiment allows one-chip integration of a light emitting diode in which the blue light emitting layer 25, the green light emitting layer 24, and the red light emitting layer 15 which receive ultraviolet light outputted from the ultraviolet light emitting diode 30 and generate blue light, green light, and red light through excitation caused by the received ultraviolet light are provided on the ultraviolet light emitting diode 30. Accordingly, the intensity of emission light in the red range is higher than in an emission spectrum obtained from the conventional white light emitting diode which provides white light by exciting the YAG fluorescent material with blue light from the blue light emitting diode. This allows a white light emitting diode which outputs white light having an excellent color rendering property to be implemented.

In addition, the substrate made of sapphire which is not excellent in heat dissipation property is removed and the gold plating layer 31 which is excellent in heat dissipation property is provided in place thereof. As a result, a white light emitting diode featuring a higher output and an excellent color rending property can be provided.

In the case where the ultraviolet light emitting diode 30 is replaced with the blue light emitting diode 10 used in the fourth embodiment, the blue light emitting layer 25 need not be provided.

Instead of ITO, a translucent multilayer film composed of nickel (Ni) and gold (Au) which are stacked in layers may also be used to form the transparent electrode 16. Alternatively, the transparent electrode 16 may also be composed of a multilayer film of Ni and ITO.

Referring to the drawings, a description will be given herein below to a method for fabricating the semiconductor light emitting device thus constructed.

FIGS. 15A through 15E and FIGS. 16A through 16C show the cross-sectional structures of the semiconductor light emitting device according to the fifth embodiment in the individual process steps of the fabrication method therefor.

Figure 15A:
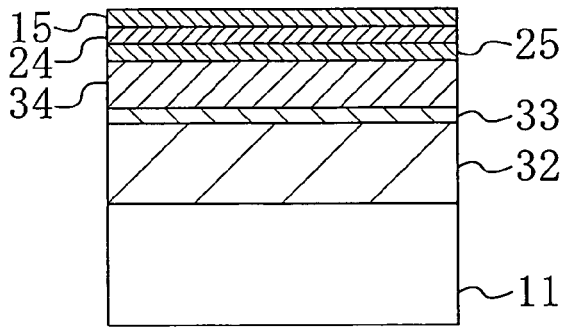
FIGS. 15A through 15E are cross-sectional views illustrating the individual process steps of a method for fabricating the semiconductor light emitting device according to the fifth embodiment.

First, as shown in FIG. 15A, the n-type semiconductor layer 32 made of n-type $Al_{0.0}Ga_{0.9}N$, the active layer 33 having a multiple quantum well structure made of InGaN and AlGaN, the p-type semiconductor layer 34 made of p-type $Al_{0.15}Ga_{0.85}N$, the blue light emitting layer 25 made of undoped $In_{0.15}Ga_{0.85}N$, the green light emitting layer 24 made of undoped $In_{0.2}Ga_{0.8}N$, and the red light emitting layer 15 made of undoped $In_{0.4}Ga_{0.6}N$ are grown successively by MOCVD on the substrate 11 made of sapphire having a principal surface of which the plane orientation is, e.g., the (0001) plane. The active layer 33 is composed of five quantum well layers each made of $In_{0.02}Ga_{0.98}N$ having a thickness of 1.5 nm and five barrier layers each made of $Al_{0.15}Ga_{0.85}N$ having a thickness of 10 nm, which are alternately stacked. However, the structure of the active layer 33 is not limited thereto provided that the emission wavelength is about 470 nm. The forbidden band width of the blue light emitting layer 25 is 2.6 eV and emits blue light at 340 nm. The forbidden band width of the green light emitting layer 24 is 2.3 eV and emits green light at 555 nm. The forbidden band width of the red light emitting layer 15 is 1.9 eV and emits red light at 650 nm. It is possible to form an underlie layer made of GaN and a thin-film buffer layer made of GaN or AlN between the substrate 11 and the n-type semiconductor layer 32. It is also possible to obtain blue light emission, green light emission, and red light emission by using InGaN doped with, e.g., zinc, magnesium, or silicon in which the composition of In is lower than 0.2, instead of using undoped $In_{0.15}Ga_{0.85}N$, $In_{0.2}Ga_{0.8}N$, and $In_{0.4}Ga_{0.6}N$, and thereby forming the blue light emitting layer 25, the green light emitting layer 24, and the red light emitting layer 15 such that the composition of In is lower than 0.4.

Figure 15D:
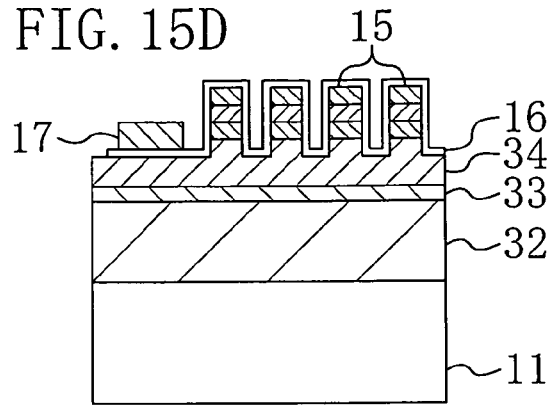
Figure 15B:
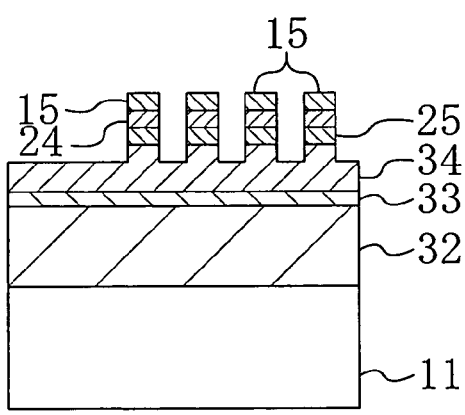

Next, as shown in FIG. 15B, a metal thin film (not shown) made of nickel and having a pattern consisting of a plurality of discrete and spaced-apart squares each having, e.g., 2-μm to 20-μm sides is formed on the red light emitting layer 15. Subsequently, the red light emitting layer 15, the green light emitting layer 24, the blue light emitting layer 25, and an upper portion of the p-type semiconductor layer 14 are removed selectively by ICP etching using, e.g., a chlorine ($Cl_2$) gas by using the formed metal thin film as a mask. At this stage, the respective portions of the red light emitting layer 15, the green light emitting layer 24, and the blue light emitting layer 25 overlying the p-side electrode formation region are also removed.

Figure 15E:
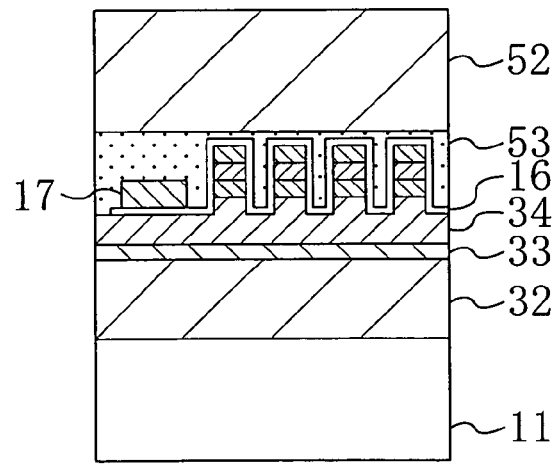
Figure 15C:
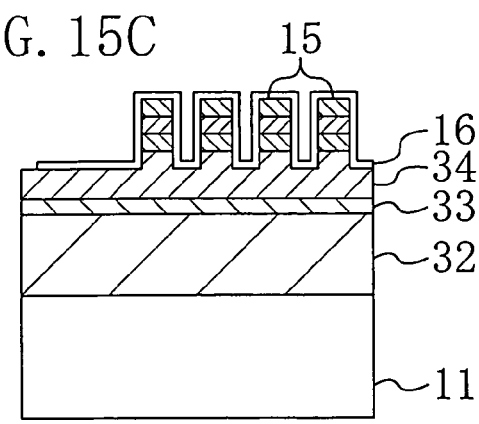

Next, as shown in FIG. 15C, the metal thin film is removed and then the transparent electrode 16 which is made of ITO with a thickness of about 300 nm and transmits visible light is formed by, e.g., RF sputtering over the selectively exposed portions of the p-type semiconductor layer 14 and the red light emitting layer 15 that has been divided into the plurality of islands each configured as a square when viewed in a plan view. Subsequently, a thermal process is performed in an oxygen atmosphere at a temperature of, e.g., about 600° C., thereby reducing the contact resistance and the resistivity of the transparent electrode 16 and improving the transmittance thereof.

Next, as shown in FIG. 15D, the p-side electrode 17 made of gold (Au) and serving as a p-side electrode pad is formed selectively by, e.g., sputtering on the p-side electrode formation region of the transparent electrode 16.

Next, as shown in FIG. 15E, after the formation of the p-side electrode 17, a holding substrate 52 made of silicon and the transparent electrode 16 including the p-side electrode are bonded to each other by using, e.g., an epoxy-based adhesive agent 53. The material of the holding substrate 52 is not limited to silicon. A polymer film may also be used for the holding substrate 52.

Figure 16A:
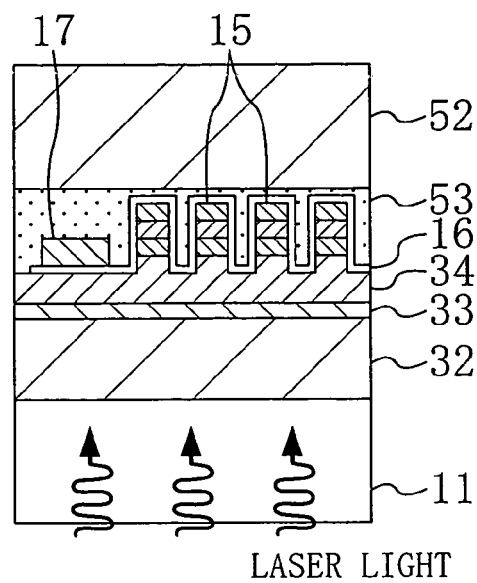
FIGS. 16A through 16C are cross-sectional views illustrating the individual process steps of the method for fabricating the semiconductor light emitting device according to the fifth embodiment.

Next, as shown in FIG. 16A, a high-output and short-wavelength pulse laser beam which is not absorbed by the substrate 11 but is absorbed by the n-type semiconductor layer 32, such as the third-harmonic beam of a YAG laser at a wavelength of, e.g., 355 nm or a KrF excimer laser beam at a wavelength of 248 nm, is applied in a scanning manner to the surface of the substrate 11 opposite to the holding substrate 52 for the irradiation thereof. At this time, the applied laser beam is absorbed by the portion of the n-type semiconductor layer 32 made of $Al_{0.1}Ga_{0.9}N$ which is adjacent to the interface between itself and the substrate 11. As a result, the portion of the n-type semiconductor layer 32 which is adjacent to the interface with the substrate 11 is heated and, if the temperature becomes, e.g., 900° C. or higher through the absorption of the laser beam, the portion of the n-type semiconductor layer 32 adjacent to the interface with the substrate 11 is decomposed into a metal gallium (Ga) gas, a metal aluminum (Al) gas, and a nitrogen ($N_2$) gas, so that a decomposition layer is formed. In the case of using a YAG laser as the laser beam for forming the decomposition layer, a semiconductor thin film made of gallium nitride (GaN) is inserted between the substrate 11 and the n-type semiconductor layer 32 to accelerate the absorption of the YAG laser beam and the decomposition layer is formed by irradiating the inserted semiconductor thin film with the YAG laser beam.

Figure 16B:
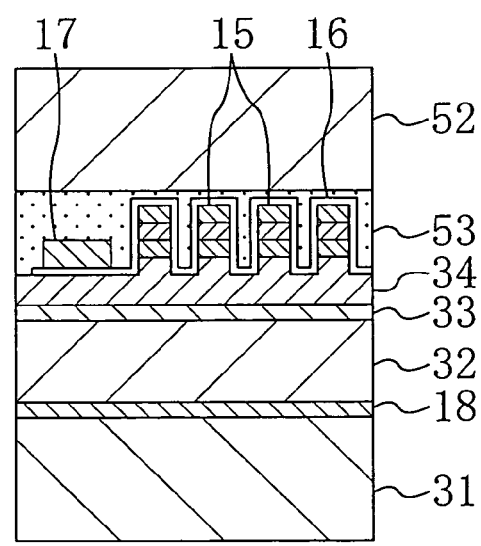

Then, the substrate 11 formed with the decomposition layer is separated from the n-type semiconductor layer 32 by heating the substrate 11 to a temperature not less than 29° C., which is a melting point of gallium, or by immersing the substrate 11 in an aqueous hydrogen chloride (HCl) solution and thereby melting or removing metal gallium contained in the decomposition layer. Thereafter, the n-side electrode 18 composed of a multilayer film of titanium (Ti) and gold (Au) is formed by, e.g., electron beam vapor deposition on the exposed surface from which the substrate 11 has been separated and removed. Subsequently, the gold plating layer 31 with a thickness of about 50 μm is formed by electrolytic plating using the gold (Au) layer of the n-side electrode 18 as an underlie, whereby the structure shown in FIG. 16B is obtained.

Figure 16C:
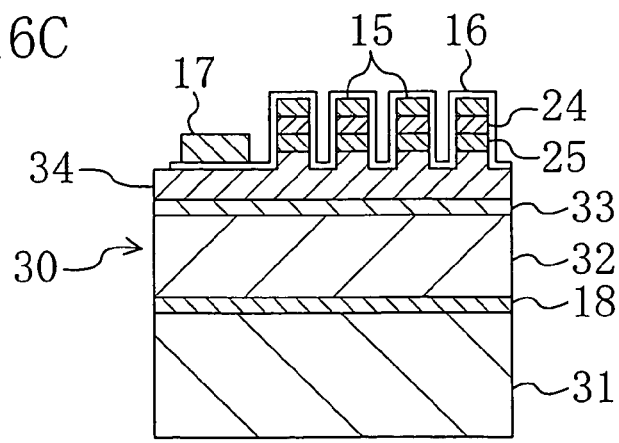

Next, as shown in FIG. 16C, the adhesive agent 53 is removed by using, e.g., acetone so that the holding substrate 52 is removed. Then, the resulting structure is divided into light emitting diode chips each having a 350-μm square size by, e.g., dicing. Subsequently, each of the chips resulting from the division is mounted on the specified region of a package (not shown) by using, e.g., a silver (Ag) paste. Thereafter, wire bonding is performed with respect to the p-side electrode 17, whereby the white light emitting diode is obtained.

Thus, the fabrication method according to the fifth embodiment allows one-chip integration of a white light emitting diode in which the blue light emitting layer 25, the green light emitting layer 24, and the red light emitting layer 15 are excited by the ultraviolet light outputted from the ultraviolet light emitting diode 30. This enables the intensity of emission light in the red range to be higher than in the conventional white light emitting diode. As a result, it becomes possible to provide a white light emitting diode which outputs white light having an excellent color rendering property.

In addition, the step of applying the insulating material containing the YAG fluorescent material can be eliminated so that the fabrication process is simplified. Moreover, the sapphire substrate 11 which is not excellent in heat dissipation property is removed and the gold plating layer 31 which is excellent in heat dissipation property is provided in place thereof so that a higher output is produced.

Embodiment 6

A sixth embodiment of the present invention will be described with reference to the drawings.

Figure 17A:
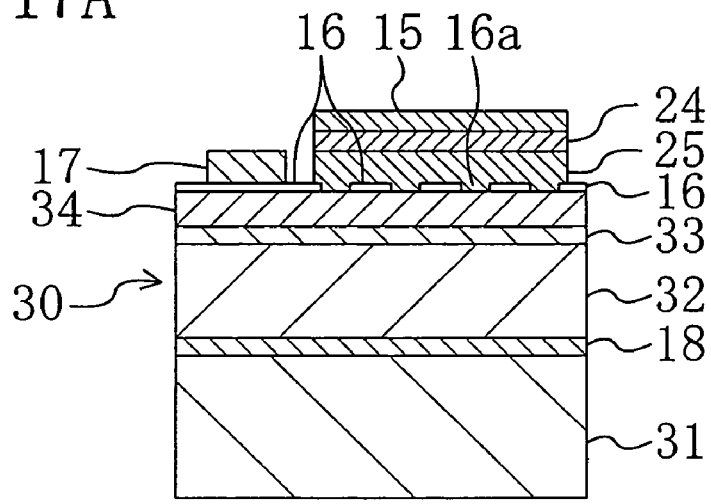
Figure 17B:
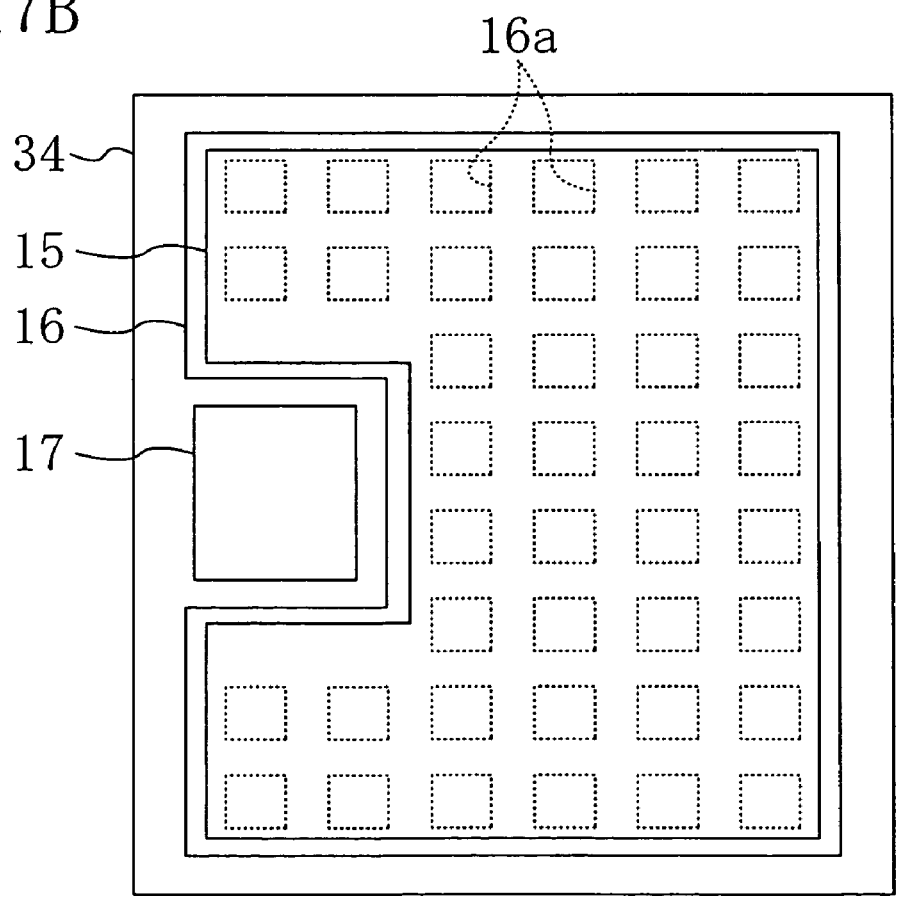

FIG. 17A shows a cross-sectional structure of a semiconductor light emitting device according to the sixth embodiment and FIG. 17B shows a plan structure thereof. The description of the components shown in FIGS. 17A and 17B which are the same as those shown in FIGS. 13A and 13B will be omitted by retaining the same reference numerals.

The semiconductor light emitting device according to the sixth embodiment is the same as the semiconductor light emitting device according to the fifth embodiment in that it is composed of the ultraviolet light emitting diode 30, the blue light emitting layer 25, the green light emitting layer 24, and the red light emitting layer 15 each formed thereon. The semiconductor light emitting device according to the sixth is different from the semiconductor light emitting device according to the fifth embodiment in that the transparent electrode 16 is formed on the p-type semiconductor layer 34 to have a plurality of openings 16a each configured as a square when viewed in a plan view and the blue light emitting layer 25 is grown epitaxially by using the transparent electrode 16 having the plurality of openings 16a as a mask for selective growth. Accordingly, an emission spectrum obtained from the semiconductor light emitting device according to the sixth embodiment shows a spectrum pattern equal to the pattern shown in FIG. 14.

The injection of a current into the ultraviolet light emitting diode 30 is performed via the transparent electrode 16 that has been patterned to be used as the mask for selective growth and the p-type semiconductor layer 34.

Since an area occupied by the blue light emitting layer 25, the green light emitting layer 24, and the red light emitting layer 15 can be increased in the sixth embodiment, the intensity of white light can be increased.

In addition, the portion grown laterally over the transparent electrode 16 used as the mask for selective growth, i.e., in a direction parallel to the upper surface of the transparent electrode 16 has an improved crystal property so that a crystal dislocation density is low. As a result, high-brightness visible light can be emitted through excitation caused by the ultraviolet light outputted from the ultraviolet light emitting diode 30.

In addition, the n-side electrode 18 is formed over the entire surface (back surface) of the n-type semiconductor layer 32 opposite to the active layer 33 by removing the substrate made of sapphire for epitaxial growth and the gold plating layer 31 is further provided. The arrangement remarkably improves the heat dissipation property of the ultraviolet light emitting diode 30 and allows a higher-output white light emitting diode to be provided. In addition, since the n-side electrode 18 and the p-side electrode 17 are disposed in opposing relation with the active layer 33 interposed therebetween, a series resistance between the n-side electrode 18 and the p-side electrode 17 can be reduced advantageously. Since the insulating substrate made of sapphire or the like has been removed, it is unnecessary to provide the n-side electrode 18 on the upper portion of the n-type semiconductor layer 32. This achieves a reduction in chip size and allows the elimination of the step of etching away the n-side semiconductor layer 32 from the side of the p-type semiconductor layer 34.

Thus, the sixth embodiment allows one-chip integration of a white light emitting diode in which the blue light emitting layer 25, the green light emitting layer 24, and the red light emitting layer 15 which receive ultraviolet light outputted from the ultraviolet light emitting diode 30 and generate blue light, green light, and red light through excitation caused by the received light are provided on the ultraviolet light emitting diode 30. Accordingly, the intensity of emission light in the red range is higher than in an emission spectrum obtained from the conventional white light emitting diode which provides white light by exciting the YAG fluorescent material with blue light from the blue light emitting diode. This allows a white light emitting diode which outputs white light having an excellent color rendering property to be provided.

In addition, the substrate made of sapphire which is not excellent in heat dissipation property is removed and the gold plating layer 31 which is excellent in heat dissipation property is provided in place thereof. As a result, a white light emitting diode featuring a higher output and an excellent color rending property can be provided.

In the case where the ultraviolet light emitting diode 30 is replaced with the blue light emitting diode 10 used in the fourth embodiment, the blue light emitting layer 25 need not be provided.

Instead of ITO, a translucent multilayer film composed of nickel (Ni) and gold (Au) which are stacked in layers may also be used to form the transparent electrode 16. Alternatively, the transparent electrode 16 may also be composed of a multilayer film of Ni and ITO.

Referring to the drawings, a description will be given herein below to a method for fabricating the semiconductor light emitting device thus constructed.

FIGS. 18A through 18D and FIGS. 19A through 19C show the cross-sectional structures of the semiconductor light emitting device according to the sixth embodiment in the individual process steps of the fabrication method therefor.

Figure 18A:
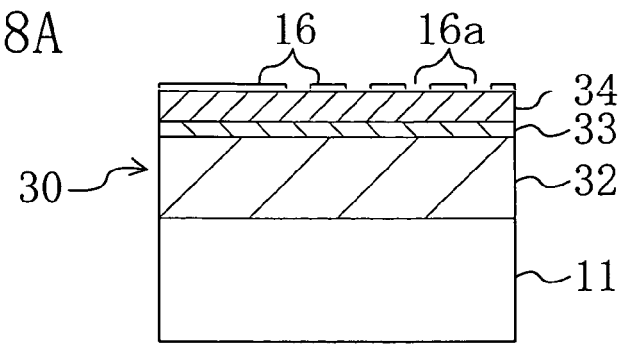
FIGS. 18A through 18D are cross-sectional views illustrating the individual process steps of a method for fabricating the semiconductor light emitting device according to the sixth embodiment.

First, as shown in FIG. 18A, the n-type semiconductor layer 32 made of n-type $Al_{0.1}Ga_{0.9}N$, the active layer 33 having a multiple quantum well structure made of InGaN and AlGaN and the p-type semiconductor layer 34 made of p-type $Al_{0.05}Ga_{0.85}N$ are grown successively by MOCVD on the substrate 11 made of sapphire having a principal surface of which the plane orientation is, e.g., the (0001) plane. The active layer 33 is composed of five quantum well layers each made of $In_{0.02}Ga_{0.98}N$ having a thickness of 1.5 nm and five barrier layers each made of $Al_{0.15}Ga_{0.85}N$ having a thickness of 10 nm, which are alternately stacked. However, the structure of the active layer 33 is not limited thereto provided that the emission wavelength is about 340 nm. Subsequently, the transparent electrode 16 made of ITO with a thickness of about 300 nm is formed by, e.g., RF sputtering on the p-type semiconductor layer 34 and then the plurality of openings 16a each configured as a square with 2-μm to 20-μm sides when viewed in a plan view are formed in the transparent electrode 16 by using, e.g., an aqueous hydrofluoric acid (HF) solution. Thereafter, a thermal process is performed in an oxygen atmosphere at a temperature of, e.g., about 600° C., thereby reducing the contact resistance and the resistivity of the transparent electrode 16 and improving the transmittance thereof.

Figure 18B:
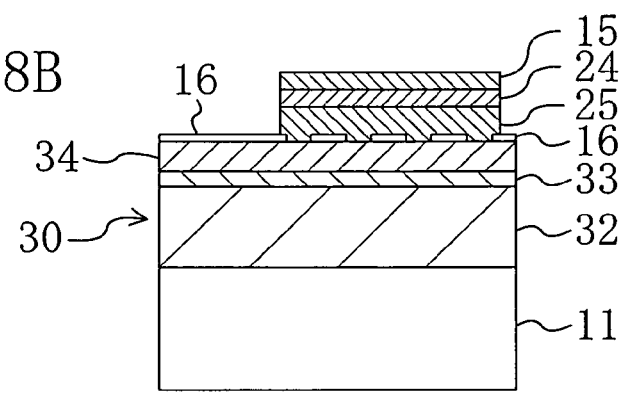

Next, as shown in FIG. 18B, the blue light emitting layer 25 made of undoped $In_{0.15}Ga_{0.85}N$, the green light emitting layer 24 made of undoped $In_{0.02}Ga_{0.8}N$, and the red light emitting layer 15 made of undoped $In_{0.4}Ga_{0.6}N$ are grown successively by MOCVD on the p-type semiconductor layer 34 by using the transparent electrode 16 formed with the plurality of openings 16a as a mask. At this time, the size of each of the openings 16a provided in the transparent electrode 16 is preferably minimized within a range which allows planar growth of the blue light emitting layer 25 because, e.g., a crystal defect is likely to occur in the portion of the blue light emitting layer 25 overlying the opening 16a. The forbidden band width of the blue light emitting layer 25 is 2.6 eV herein and emits blue light at 470 nm. The forbidden band width of the green light emitting layer 24 is 2.3 eV and emits green light at 555 nm. The forbidden band width of the red light emitting layer 15 is 1.9 eV and emits red light at 650 nm. It is possible to form an underlie layer made of GaN and a thin-film buffer layer made of GaN or AlN between the substrate 11 and the n-type semiconductor layer 32. It is also possible to obtain blue light emission, green light emission, and red light emission by using InGaN doped with, e.g., zinc, magnesium, or silicon, instead of using undoped $In_{0.15}Ga_{0.85}N$, $In_{0.2}Ga_{0.8}N$, and $In_{0.4}Ga_{0.6}N$, and thereby forming the blue light emitting layer 25, the green light emitting layer 24, and the red light emitting layer 15 such that the composition of In is lower than 0.2 and 0.4, respectively.

Figure 18C:
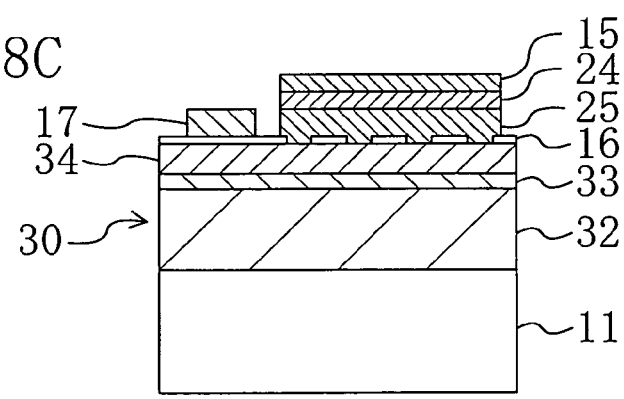

Next, as shown in FIG. 18C, the p-side electrode 17 made of gold (Au) and serving as a p-side electrode pad is formed selectively by, e.g., sputtering on the p-side electrode formation region of the transparent electrode 16.

Figure 18D:
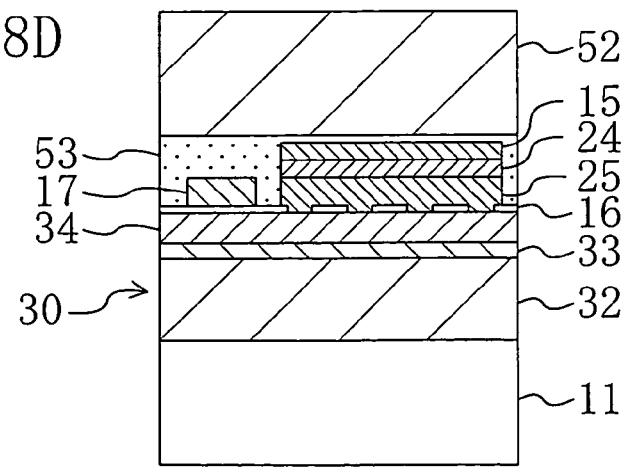

Next, as shown in FIG. 18D, after the formation of the p-side electrode 17, a holding substrate 52 made of silicon, the transparent electrode 16 including the p-side electrode, and the red light emitting layer 15 are bonded to each other by using, e.g., an epoxy-based adhesive agent 53. The material of the holding substrate 52 is not limited to silicon. A polymer film may also be used for the holding substrate 52.

Figure 19A:
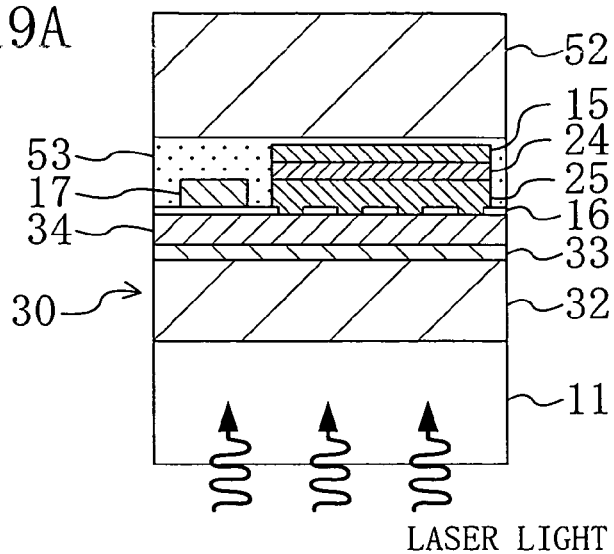
FIGS. 19A through 19C are cross-sectional views illustrating the individual process steps of the method for fabricating the semiconductor light emitting device according to the sixth embodiment.

Next, as shown in FIG. 19A, a high-output and short-wavelength pulse laser beam, such as the third-harmonic beam of a YAG laser at a wavelength of 355 nm or a KrF excimer laser beam at a wavelength of 248 nm, is applied in a scanning manner to the surface of the substrate 11 opposite to the holding substrate 52 for the irradiation thereof. At this time, the applied laser beam is absorbed by the portion of the n-type semiconductor layer 32 made of $Al_{0.1}Ga_{0.9}N$ which is adjacent to the interface between itself and the substrate 11. As a result, the portion of the n-type semiconductor layer 32 which is adjacent to the interface with the substrate 11 is heated and, if the temperature becomes 900° C. or higher through the absorption of the laser beam, the portion of the n-type semiconductor layer 32 adjacent to the interface with the substrate 11 is decomposed into a metal gallium (Ga) gas, a metal aluminum (Al) gas, and a nitrogen ($N_2$) gas, so that a decomposition layer is formed. In the case of using a YAG laser as the laser beam for forming the decomposition layer, a semiconductor thin film made of gallium nitride (GaN) is inserted between the substrate 11 and the n-type semiconductor layer 32 to accelerate the absorption of the YAG laser beam and the decomposition layer is formed by irradiating the inserted semiconductor thin film with the YAG laser beam.

Figure 19B:
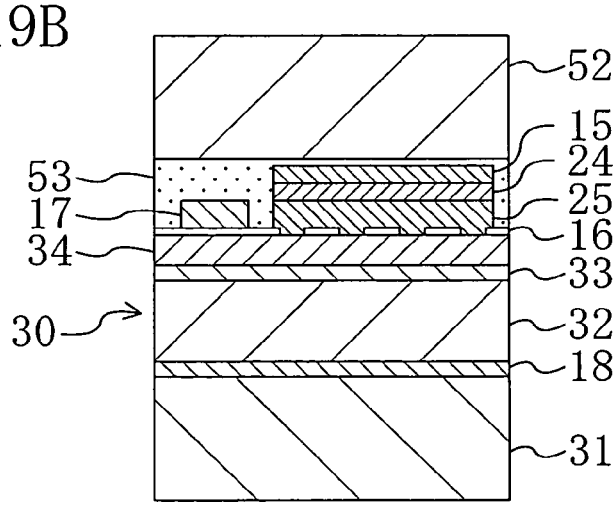

Then, the substrate 11 formed with the decomposition layer is separated from the n-type semiconductor layer 32 by heating the substrate 11 to a temperature not less than 29° C., which is a melting point of gallium, or by immersing the substrate 11 in an aqueous hydrogen chloride (HCl) solution and thereby melting or removing metal gallium contained in the decomposition layer. Thereafter, the n-side electrode 18 composed of a multilayer film of titanium (Ti) and gold (Au) is formed by, e.g., electron beam vapor deposition on the exposed surface from which the substrate 11 has been separated and removed. Subsequently, the gold plating layer 31 with a thickness of about 50 μm is formed by electrolytic plating using the gold (Au) layer of the n-side electrode 18 as an underlie, whereby the structure shown in FIG. 19B is obtained.

Figure 19C:
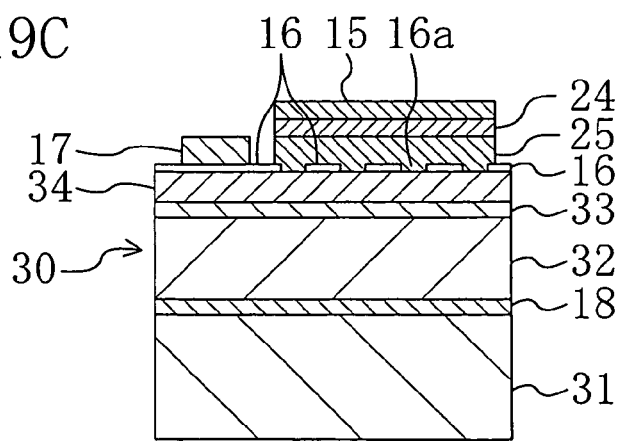

Next, as shown in FIG. 19C, the adhesive agent 53 is removed by using, e.g., acetone so that the holding substrate 52 is removed. Then, the resulting structure is divided into light emitting diode chips each having a 350-μm square size by, e.g., dicing. Subsequently, each of the chips resulting from the division is mounted on the specified region of a package (not shown) by using, e.g., a silver (Ag) paste. Thereafter, wire bonding is performed with respect to the p-side electrode 17, whereby the white light emitting diode is obtained.

Thus, the fabrication method according to the sixth embodiment allows one-chip integration of a white light emitting diode in which the blue light emitting layer 25, the green light emitting layer 24, and the red light emitting layer 15 are excited by the ultraviolet light outputted from the ultraviolet light emitting diode 30. This enables the intensity of emission light in the red range to be higher than in the conventional white light emitting diode. As a result, it becomes possible to provide a white light emitting diode which outputs white light having an excellent color rendering property.

In addition, since the transparent electrode 16 does not cover the blue light emitting layer 25, the green light emitting layer 24, and the red light emitting layer 15, the brightness of each of the blue emission light, the green emission light, and the red emission light is enhanced.

Moreover, since the step of applying the insulating material containing the YAG fluorescent material can be eliminated, the fabrication process is simplified. Furthermore, the sapphire substrate 11 which is not excellent in heat dissipation property is removed and the gold plating layer 31 which is excellent in heat dissipation property is provided in place thereof so that a higher output is produced.

Although each of the fifth and sixth embodiments has described the separation method which applies the high-output short-wavelength pulse laser beam for the separation of the substrate 11 made of sapphire, the separation of the substrate 11 is not limited to the method using laser irradiation. It is also possible to, e.g., use the substrate 11 made of silicon (Si) or gallium arsenide (GaAs) in place of the substrate 11 made of sapphire and separate and remove the substrate 11 by wet etching using an acid.

Embodiment 7

A seventh embodiment of the present invention will be described with reference to the drawings.

Figure 20:
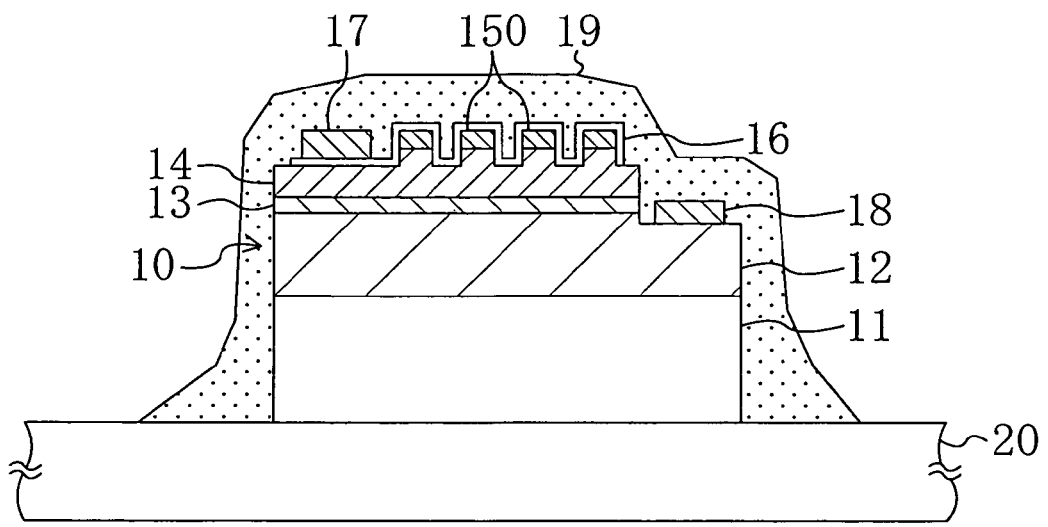
FIG. 20 is a cross-sectional view showing a semiconductor light emitting device according to a seventh embodiment of the present invention.
Figure 21:
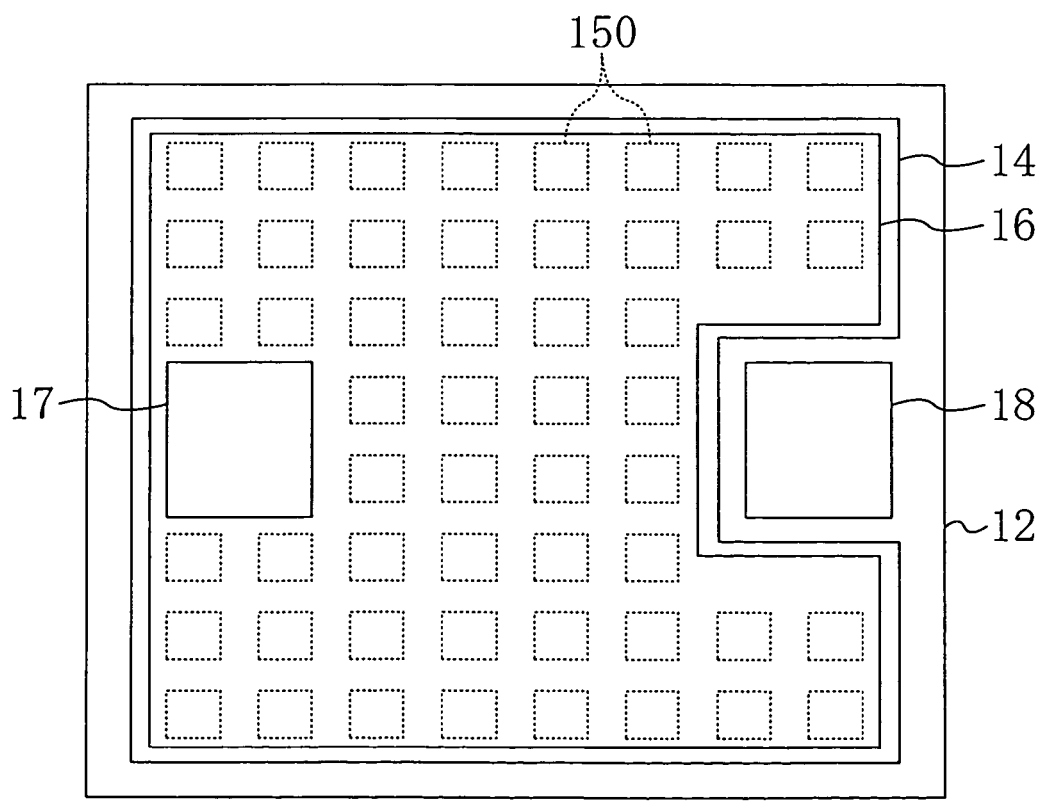
FIG. 21 is a plan view showing the semiconductor light emitting device according to the seventh embodiment.

FIG. 20 shows a cross-sectional structure of a semiconductor light emitting device according to the seventh embodiment and FIG. 21 shows a plan structure thereof when viewed from the side with the electrode. The description of the components shown in FIGS. 21 and 22 which are the same as those shown in FIGS. 1A and 1B will be omitted by retaining the same reference numerals.

The semiconductor light emitting device according to the seventh embodiment is the same as the semiconductor light emitting device according to the first embodiment in that it is composed of the blue light emitting diode 10, the red light emitting layer 15 grown epitaxially on the blue light emitting diode 10, and the insulating material 19 containing an yttrium aluminum garnet (YAG) fluorescent material. In FIG. 21 also, the depiction of the insulating material 19 is omitted.

The semiconductor light emitting device according to the seventh embodiment is different from the semiconductor light emitting device according to the first embodiment in that a red light emitting Eu doped layer 150 made of undoped $Al_{0.5}Ga_{0.5}N$ is provided in place of the red light emitting layer 15 made of undoped InGaN.

Figure 22:
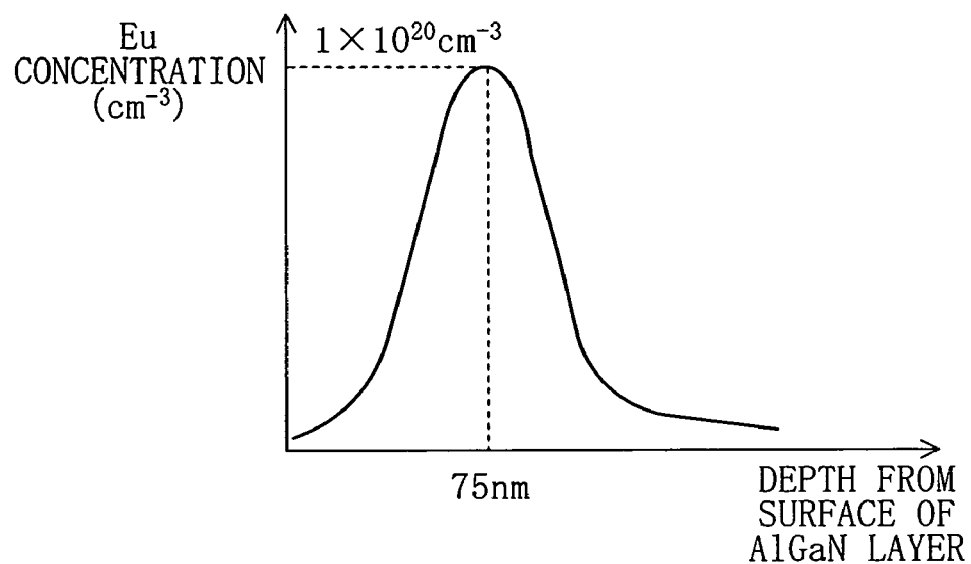
FIG. 22 is a graph showing the concentration profile of Eu ions used to dope a red light emitting Eu doped layer in the semiconductor light emitting device according to the seventh embodiment.

The red light emitting Eu doped layer 150 has been formed by implanting europium (Eu) ions into the epitaxially grown AlGaN layer under such implant conditions that, e.g., an acceleration voltage is about 200 keV and a dose is about $1\times10^{15}$ cm$^{-2}$. Under these implant conditions, as shown in FIG. 22, the red light emitting Eu doped layer 150 shows a relatively shallow Eu concentration profile having a peak of $1\times10^{20}$ cm$^{-3}$ at a depth of about 75 nm from the surface of the AlGaN layer. It will easily be appreciated that the Eu concentration profile can be changed by adjusting the acceleration voltage and the dose.

When the red light emitting Eu doped layer 150 receives visible light or ultraviolet light, inner-shell electrons in Eu atoms used for doping are excited and release red light at a wavelength of 622 nm on returning from the excited state to a ground state. By increasing the dose of implanted Eu ions, the emission intensity of the red excitation light can be enhanced.

The semiconductor composing the red light emitting Eu doped layer 150 is not limited to AlGaN. Ga may also be used instead. It is also possible to use a semiconductor layer having a multiple quantum well layer composed of a pair of $In_{0.02}Ga_{0.98}N$ and $Al_{0.4}Ga_{0.6}N$.

The doping of the semiconductor layer with Eu is not limited to a method which performs ion implantation after epitaxial growth. Doping with Eu may also be performed during epitaxial growth.

Figure 23:
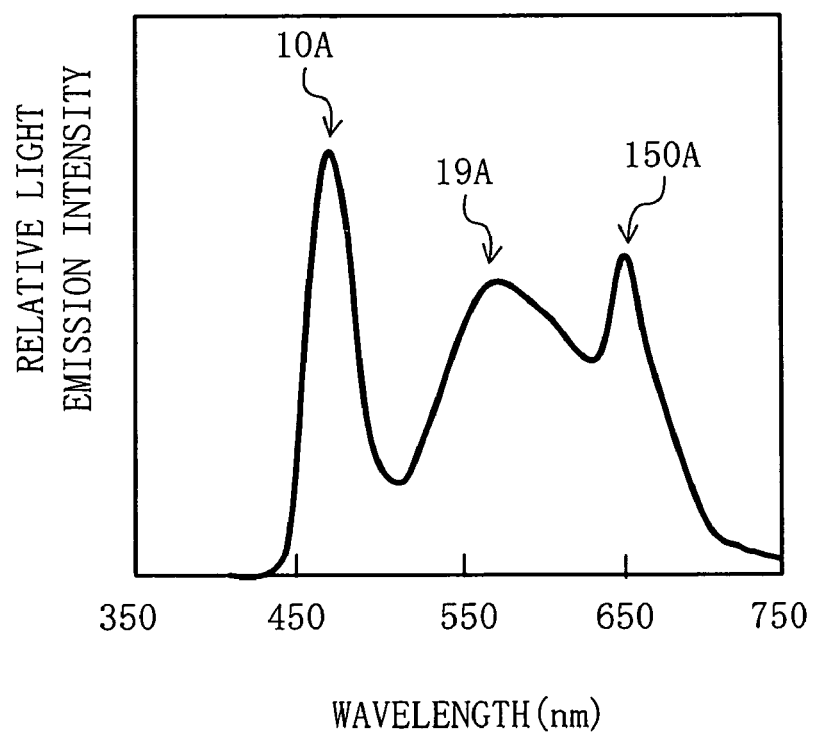
FIG. 23 is a graph showing an emission spectrum obtained from the semiconductor light emitting device according to the seventh embodiment.

White light having the spectrum shown in FIG. 23 can be obtained by injecting a current of, e.g., 20 mA into the blue light emitting diode 10 and thereby causing the emission of blue light at a wavelength of 470 nm. In FIG. 23, the emission spectrum is composed of the transmitted component 10A of the blue light at a wavelength of 470 nm, yellow emission light 19A with a peak wavelength of 550 nm from the YAG fluorescent material, and red light 150A at a wavelength of 622 nm from the red light emitting Eu doped layer 150. The blue light 10A, the yellow light 19A, and the red light 150A are mixed to provide white light.

Thus, the seventh embodiment allows one-chip integration of a light emitting diode which provides white light by exciting the YAG fluorescent material contained in the red light emitting Eu doped layer 150 and the insulating material 19 with light outputted from the blue light emitting diode 10. Accordingly, the intensity of emission light in the red range is higher in the semiconductor light emitting device according to the seventh embodiment than in the conventional white light emitting diode which excites the YAG fluorescent material with light outputted from the blue light emitting diode. This allows white light having an excellent color rendering property to be outputted.

It is also possible to provide the ultraviolet light emitting diode 30 which outputs ultraviolet light at a wavelength of 340 nm in place of the blue light emitting diode 10 and excite each of the blue light emitting fluorescent material, the green light emitting fluorescent material, and the red light emitting Eu doped layer 150 with the ultraviolet light to provide white light.

Referring to the drawings, a description will be given herein below to a method for fabricating the semiconductor light emitting device thus constructed.

FIGS. 24A through 24D and FIGS. 25A through 25C show the cross-sectional structures of the semiconductor light emitting device according to the seventh embodiment in the individual process steps of the fabrication method therefor.

Figure 24A:
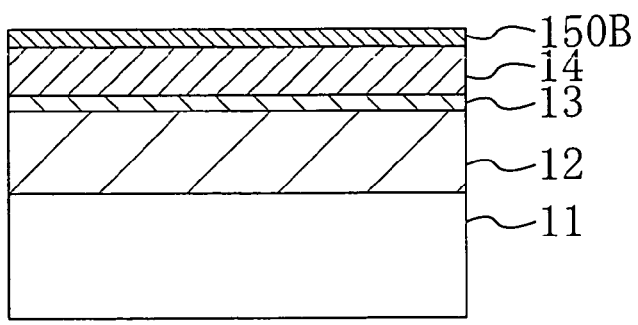
FIGS. 24A through 24D are cross-sectional views illustrating the individual process steps of a method for fabricating the semiconductor light emitting device according to the seventh embodiment.

First, as shown in FIG. 24A, the n-type semiconductor layer 12 made of n-type GaN, the active layer 13 having a multiple quantum well structure made of InGaN, the p-type semiconductor layer 14 made of p-type $Al_{0.05}Ga_{0.95}N$, and an undoped $Al_{0.5}Ga_{0.5}N$ layer 150B are grown successively by MOCVD (Metal Organic Chemical Vapor Deposition) on the substrate 11 made of sapphire having a principal surface of which the plane orientation is, e.g., the (0001) plane in the same manner as in the first embodiment. The n-type semiconductor layer 12, the active layer 13, and the p-type semiconductor layer 14 emit blue light at a wavelength of, e.g., 470 nm through current injection.

Figure 24B:
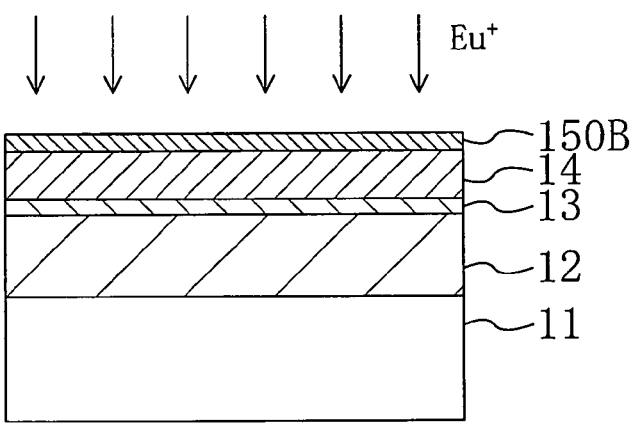

Next, as shown in FIG. 24B, europium (Eu) ions are implanted into the grown $Al_{0.5}Ga_{0.5}N$ layer 150B under such implant conditions that, e.g., an acceleration voltage is about 200 kV and the dose is about $1 \times 10^{15}$ cm$^{-2}$. Preferably, the substrate 11 is heated herein to about 500° C. during the implantation of Eu ions. Under these implant conditions, the concentration profile of Eu ions implanted in the $Al_{0.5}Ga_{0.5}N$ layer 150B has a peak at a depth of 75 nm from the surface of the $Al_{0.5}Ga_{0.5}N$ layer 150B. Subsequently to the ion implantation, annealing is performed in a nitrogen atmosphere at about 1000° C. for the activation of the Eu ions, thereby obtaining the red light emitting Eu doped layer 150 from the $Al_{0.5}Ga_{0.5}N$ layer 150B. As described above, the red light emitting Eu doped layer 150 emits red light at a wavelength of 622 nm through excitation caused by visible light or ultraviolet light.

Figure 24C:
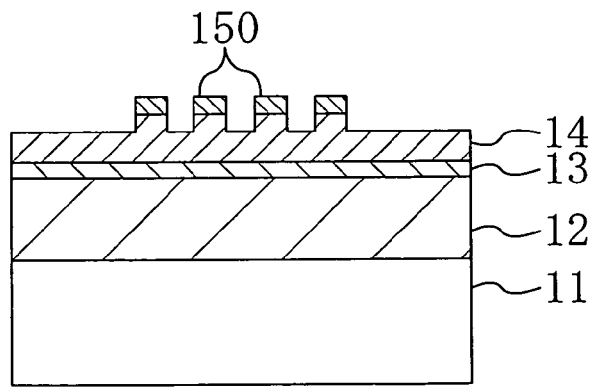

Next, as shown in FIG. 24C, the red light emitting Eu doped layer 150 and an upper portion of the p-type semiconductor layer 14 are selectively removed by ICP etching using, e.g., a chlorine ($Cl_2$) gas by using a metal mask (not shown) having a pattern consisting of a plurality of discrete and spaced-apart squares that has been placed on the red light emitting Eu doped layer 150. At this stage, the portion of the red light emitting Eu doped layer 150 overlying the p-side electrode formation region is also removed.

Figure 24D:
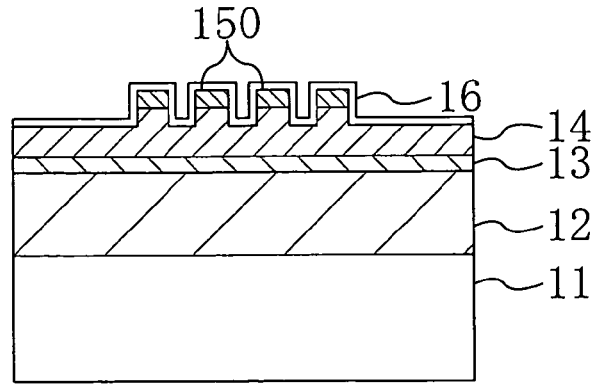

Next, as shown in FIG. 24D, the metal mask is removed and then the transparent electrode 16 which is made of ITO with a thickness of about 300 nm and transmits visible light is formed over the selectively exposed portions of the p-type semiconductor layer 14 and the red light emitting Eu doped layer 150 that has been divided into a plurality of islands each configured as a square when viewed in a plan view. Subsequently, the portion of the transparent electrode 16 overlying the n-side electrode formation region is removed by wet etching using, e.g., an aqueous hydrogen chloride (HCl) solution. Thereafter, a thermal process is performed in an oxygen atmosphere at a temperature of, e.g. about 600° C., thereby reducing the contact resistance and the resistivity of the transparent electrode 16 and improving the transmittance thereof.

Figure 25A:
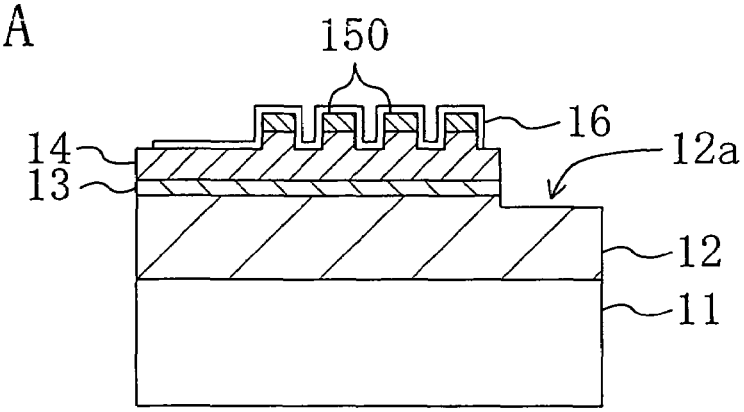
FIGS. 25A through 25C are cross-sectional views illustrating the individual process steps of the method for fabricating the semiconductor light emitting device according to the seventh embodiment.

Next, as shown in FIG. 25A, the respective portions of the p-type semiconductor layer 14 and the active layer 13 overlying the n-side electrode formation region 12a are removed selectively by ICP etching so that the n-side electrode formation region 12a of the n-type semiconductor layer 12 is exposed.

Figure 25B:
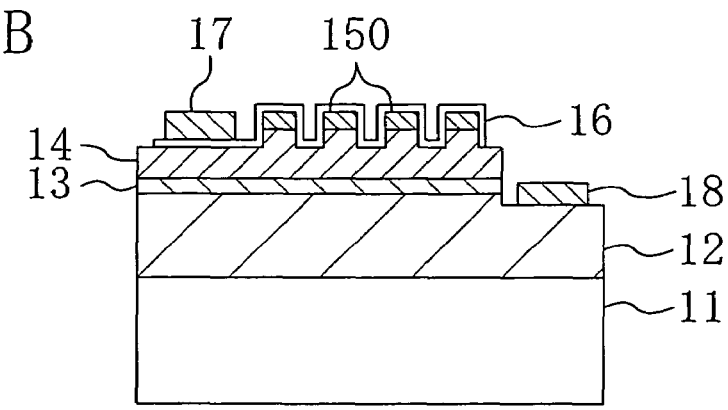

Next, as shown in FIG. 25B, the n-side electrode 18 as an ohmic electrode composed of a multilayer film of titanium (Ti) and gold (Au) is formed on the exposed n-side electrode formation region 12a of the n-type semiconductor layer 12 by, e.g., sputtering. Thereafter, sintering may also be performed appropriately in a nitrogen atmosphere at a temperature of, e.g., about 550° C. to reduce the contact resistance of the n-side electrode 18. Subsequently, the p-side electrode 17 made of gold (Au) and serving as a p-side electrode pad is formed selectively by, e.g., sputtering on the p-side electrode formation region of the transparent electrode 16.

Figure 25C:
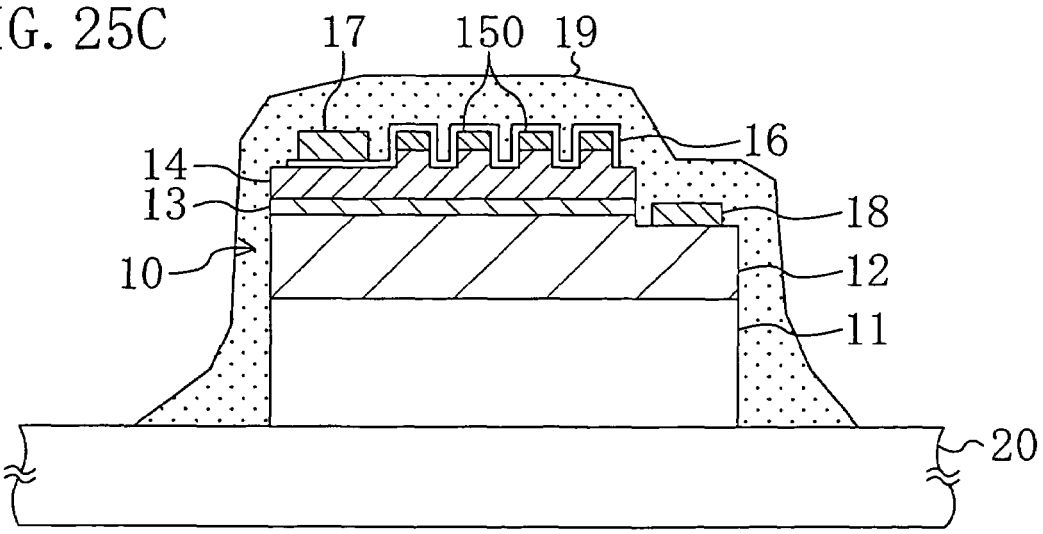

Next, as shown in FIG. 25C, the resulting structure is divided into light emitting diode chips each having a 350-μm square size by, e.g., dicing. Subsequently, each of the chips resulting from the division is mounted on the specified region of the package 20 by using, e.g., a silver (Ag) paste. Thereafter, wire bonding is performed with respect to the p-side electrode 17 and the n-side electrode 18 and the insulating material 19 containing a YAG fluorescent material is further applied to cover the chip.

Thus, the fabrication method according to the seventh embodiment allows one-chip integration of a white light emitting diode in which the red light emitting Eu doped layer 150 and the YAG fluorescent material are excited by the blue light from the blue light emitting diode 10. This enables the intensity of emission light in the red range to be higher than in the conventional white light emitting diode. As a result, it becomes possible to provide a white light emitting diode which outputs white light having an excellent color rendering property.

Although the seventh embodiment has doped the red light emitting Eu doped layer 150 with europium (Eu) as an element serving as a luminescent center, the doping element is not limited to Eu. Instead of Eu, samarium (Sm) or ytterbium (Yb) may also be used.

In each of the first through seventh embodiments, the plane orientation of the principal surface of sapphire used as the substrate for epitaxial growth is not particularly limited. In the case of using, e.g., sapphire, a plane orientation at an off-angle from a representative (typical) plane orientation, such as the (0001) plane, may also be adopted.

The material of the substrate for epitaxial growth is not limited to sapphire. Besides sapphire, there can be used silicon carbide (SiC), zinc oxide (ZnO), silicon (Si), gallium arsenide (GaAs), gallium phosphide (GaP), indium phosphide (InP), gallium nitride (GaN), aluminum nitride (AlN), magnesium oxide (MgO), or lithium aluminum gallium oxide ($LiAl_xGa_{1-x}O_2$ (where $0 \leq x \leq 1$)).

The composition of each of the n-type semiconductor layers 12 and 32, the active layers 13 and 33, and the p-type semiconductor layers 14 and 34 and the composition of the layer which emits light through excitation, such as the red light emitting layer 15, are not limited to those shown in the individual embodiments. The method for crystal growth is not limited to MOCVD and a semiconductor layer formed by using, e.g., an MBE (Molecular Beam Epitaxy) process or a HVPE (Hydride Vapor Phase Epitaxy) process may also be contained. Each of the semiconductor layers may also contain a group V element such as arsenide (As) or phosphorous (P) or a group III element such as boron (B).

Embodiment 8

An eighth embodiment of the present invention will be described with reference to the drawings.

Figure 26A:
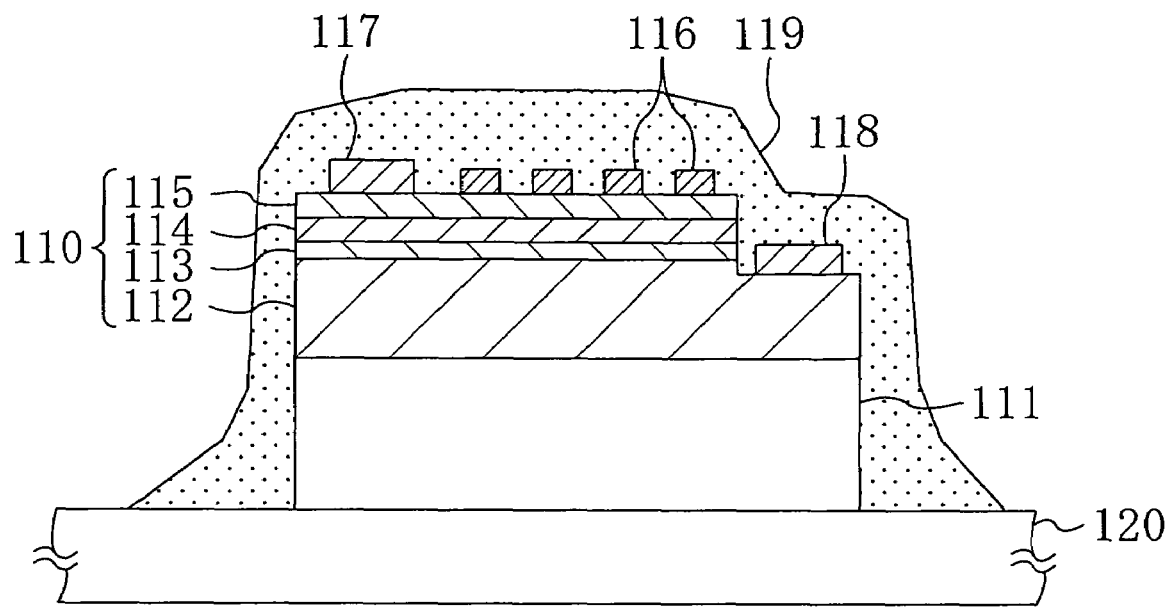
Figure 26B:
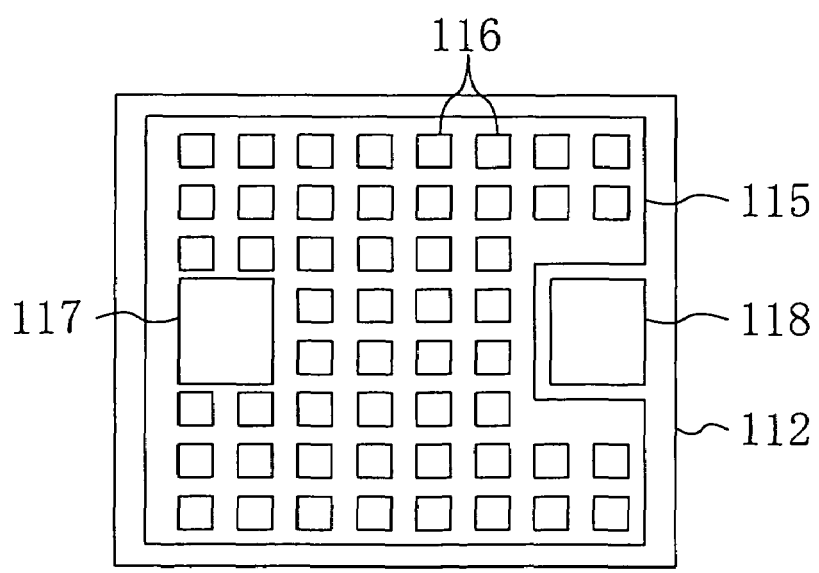

FIG. 26A shows a cross-sectional structure of a semiconductor light emitting device according to the eighth embodiment and FIG. 26B shows a plan structure thereof.

As shown in FIGS. 26A and 26B, the semiconductor light emitting device according to the eighth embodiment is composed of: a blue light emitting diode 110 mounted at a specified position on a package 120 as a mounting member; a red light emitting layer 116 grown epitaxially on the blue light emitting diode 110; and an insulating material 119 containing an yttrium aluminum garnet (YAG) fluorescent material. In FIG. 26B, the depiction of the insulating material 119 is omitted.

The blue light emitting diode 110 is composed of: an n-type semiconductor layer 112 made of n-type GaN; an active layer 113 having a multiple quantum well structure made of InGaN; a p$^+$-type semiconductor layer 114 made of p$^+$-type $Al_{0.05}Ga_{0.95}N$; and an n$^+$-type semiconductor layer 115 made of n$^+$-type $Al_{0.05}Ga_{0.95}N$ which are epitaxially grown successively on a substrate 111 made of, e.g., sapphire. The active layer 113 is composed of three well layers each made of $In_{0.35}Ga_{0.65}N$ having a thickness of 2 nm and three barrier layers each made of $In_{0.02}Ga_{0.98}N$ having a thickness of 10 nm which are alternately stacked, thereby emitting blue light at 470 nm.

The red light emitting layer 116 is made of, e.g., undoped $In_{0.4}Ga_{0.6}N$ with a forbidden band width of 1.9 eV and formed on the n$^+$-type semiconductor layer 115 to have a matrix configuration consisting of discrete and spaced-apart squares each with 2-μm to 20-μm sides when viewed in a plan view. Each square of the red light emitting layer 116 is excited by blue light outputted from the blue light emitting diode 110 and emits red light at 650 nm. Red light can be obtained from the red light emitting layer 116 by doping the red light emitting layer 15 with, e.g., zinc (Zn), magnesium (Mg), or silicon (Si) and thereby reducing the composition of In. By thus reducing the composition of In, a lattice mismatch with an underlie layer made of GaN normally used can be suppressed and crystal defects in the red light emitting layer 116 can be reduced so that high-brightness light emission is enabled. At this time, the emission light released from the red light emitting layer 116 is visible light generated via an energy level resulting from the impurity used for doping and blue excitation light is mixed in the visible light.

Thus, in the semiconductor light emitting device according to the eighth embodiment, the n$^+$-type semiconductor layer 115 is formed on the p$^+$-type semiconductor layer 114 of the blue light emitting diode 110 such that the p$^+$-type semiconductor layer 114 and the n$^+$-type semiconductor layer 115 form a p$^+$n$^+$ junction.

In the specification of the present application, a p$^+$-type semiconductor layer indicates a p-type semiconductor layer in which the concentration of a p-type dopant, e.g., magnesium (Mg) is about $1 \times 10^{21}$ cm$^{-3}$ and an n$^+$-type semiconductor layer indicates an n-type semiconductor layer in which the concentration of an n-type dopant, e.g., silicon (Si) is about $1 \times 10^{19}$ cm$^{-3}$.

The present invention can achieve an effect provided that the impurity concentration in each of the p$^+$-type semiconductor layer 114 and the n$^+$-type semiconductor layer 115 is $1 \times 10^{18}$ cm$^{-3}$ or more.

When a voltage higher than the voltage applied to the n-type semiconductor layer 112 is applied to the n$^+$-type semiconductor layer 115 between the p$^+$-type semiconductor layer 114 and the n$^+$-type semiconductor layer 115, voltage-current characteristics close to a low-resistance ohmic characteristic are shown due to a tunnel current generated in the p$^+$n$^+$ junction. Consequently, the same rectifying property as provided by a normal pn junction is obtainable.

Figure 27A:
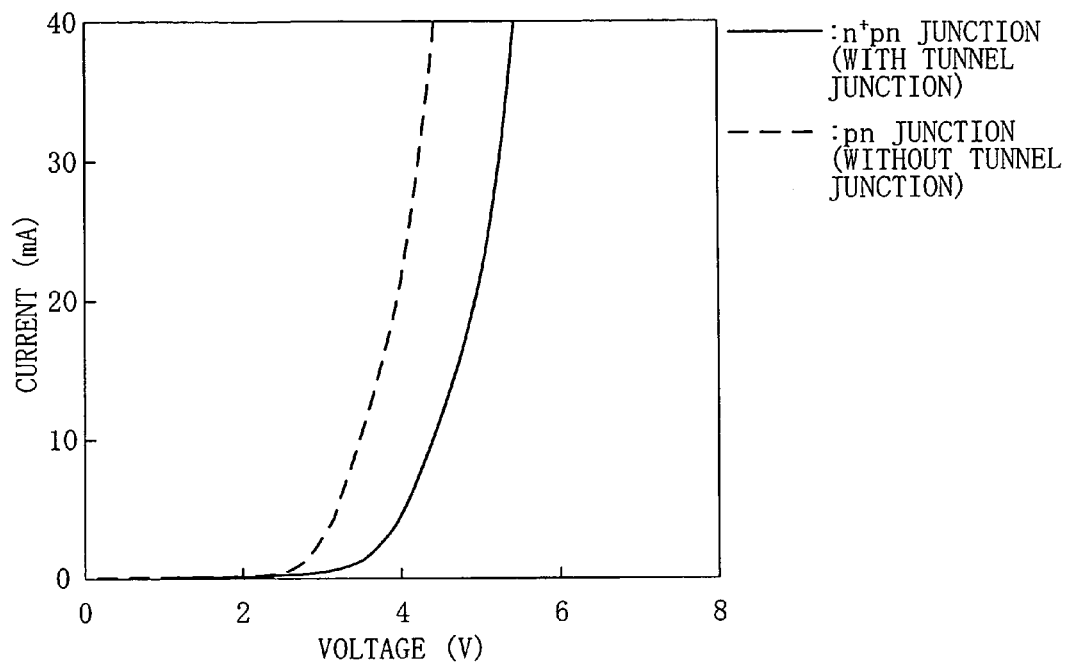
FIG. 27A is a graph showing voltage-current characteristics in the presence and absence of a tunnel junction and FIG. 27B is a graph showing current-light output characteristics in the presence and absence of a tunnel junction.
Figure 27B:
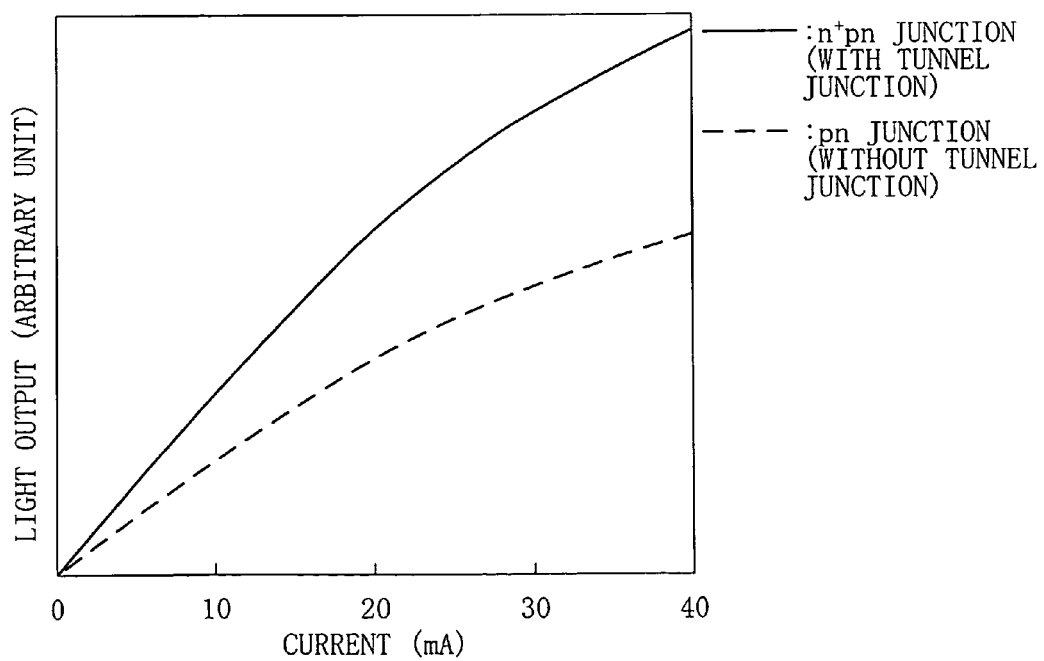

FIG. 27A shows the result of a comparison made between respective current-voltage characteristics when a tunnel junction (n$^+$pn junction) is formed and when a normal pn junction is formed. FIG. 27B shows the result of a comparison made between respective current-light output characteristics when the tunnel junction (n$^+$pn junction) is formed and when the normal pn junction is formed. As can be seen from FIG. 27A, an operating voltage during the rising edge is higher than when the normal pn junction is formed. However, a light output is larger when the tunnel junction is formed provided that the injected current has the same value, as can be seen from FIG. 27B.

In the case of adopting the conventional structure in which the p-type semiconductor layer is provided on the active layer, the transparent electrode occupying a large area should normally be provided on the high-resistance p-type semiconductor layer. In the semiconductor light emitting device according to the eighth embodiment, however, an injected current is sufficiently diffused even in a lateral direction (direction parallel to the substrate) without providing a transparent electrode on the n$^+$-type semiconductor layer 115 since the low-resistance n$^+$-type semiconductor layer 115 is provided on the p$^+$-type semiconductor layer 114. This obviates the necessity to provide a transparent electrode and allows respective ohmic electrodes provided in the n-type semiconductor layer 112 and the n$^+$-type semiconductor layer 115, which will be described later, to have the same compositions. As a result, the n-type semiconductor layer 112 and the n$^+$-type semiconductor layer 115 can be formed by the same process and the fabrication process for the semiconductor light emitting device can significantly be simplified.

A first ohmic n-side electrode 117 composed of a multilayer structure in which titanium (Ti), aluminum (Al), nickel (Ni), and gold (Au) films are stacked in layers is formed selectively on a region of the p$^+$-type semiconductor layer 115.

The n$^+$-type semiconductor layer 112 has an exposed region and a second ohmic n-side electrode 118 composed of a multilayer structure in which titanium (Ti), aluminum (Al), nickel (Ni), and gold (Au) films are stacked in layers is formed on the exposed region. To the first and second n-side electrodes 117 and 118, required metal thin lines are connected by wire bonding, though they are not depicted.

The insulating material 119 containing the YAG fluorescent material is formed as follows: The insulating material 119 is coated or applied dropwise onto the package 120 to cover the blue light emitting diode 110, the red light emitting layer 116, the first n-side electrode 117, and the second n-side electrode 118 and then hardened. The insulating material 119 is excited by blue light outputted from the blue light emitting diode 110 to emit yellow light.

Figure 28:
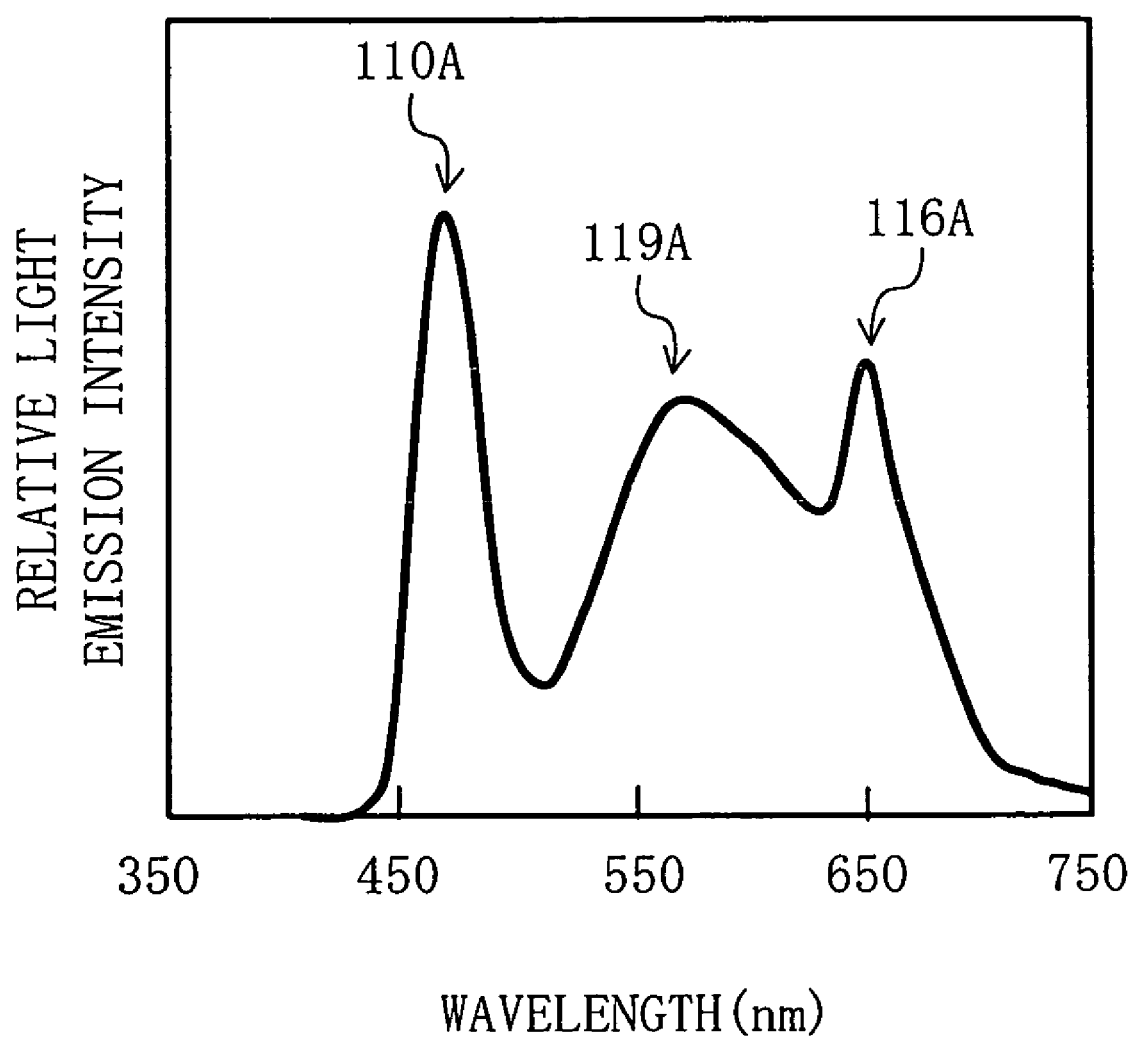
FIG. 28 is a graph showing an emission spectrum obtained from the semiconductor light emitting device according to the eighth embodiment.

A current is injected into the blue light emitting diode 110 via the first n-side electrode 117, the $n^+$-type semiconductor layer 115, and the p-type semiconductor layer 114. Accordingly, white light having the spectrum shown in FIG. 28 can be obtained by injecting a current of, e.g., 20 mA into the blue light emitting diode 110 and thereby causing the emission of blue light at a wavelength of 470 nm. In FIG. 28, the emission spectrum is composed of the transmitted component 110A of the blue light at a wavelength of 470 nm, yellow emission light 119A with a peak wavelength of 550 nm from the YAG fluorescent material, and the red light 116A at a wavelength of 650 nm from the red light emitting layer 116. The blue light 110A, the yellow light 119A, and the red light 116A are mixed to provide white light.

Figure 37:
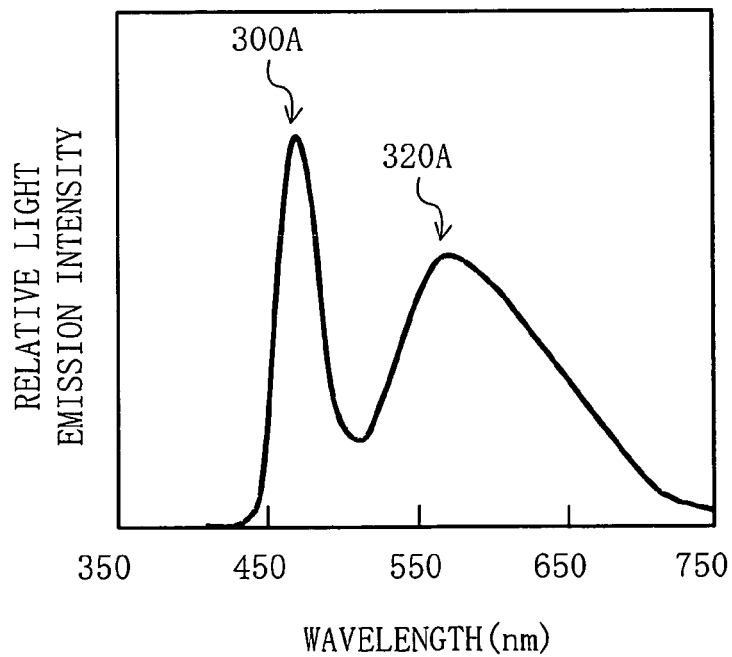
FIG. 37 is a graph showing an emission spectrum obtained from the conventional white light emitting diode.

Thus, the eighth embodiment allows one-chip integration of a light emitting diode in which the red light emitting layer 116 which receives blue light outputted from the blue light emitting diode 110 and generates red light through excitation caused thereby is provided between the insulating material 119 containing the YAG fluorescent material which emits yellow light and the blue light emitting diode 110 which emits blue light. Accordingly, the intensity of emission light in the red range is higher than in an emission spectrum obtained from the conventional white light emitting diode shown in FIG. 37 which provides white light by exciting the YAG fluorescent material with blue light from the blue light emitting diode. This allows a white light emitting diode which outputs white light having an excellent color rendering property to be provided.

In addition, when an operating current is injected in the blue light emitting diode 110, a so-called tunnel current flows in the $p^+n^+$ junction formed between the $p^+$-type semiconductor layer 114 and the $n^+$-type semiconductor layer 115 so that a rectifying property is obtained by applying a voltage between the $n^+$-type semiconductor layer 115 and the n-type semiconductor layer 112 such that it is higher to the $n^+$-type semiconductor layer 115 than to the n-type semiconductor layer 112. Moreover, since the $n^+$-type semiconductor layer 115 is low in resistance, the injected current is more likely to be diffused in the in-plane direction of the $n^+$-type semiconductor layer 115. This obviates the necessity to use a transparent electrode as used conventionally and enhances the brightness of the emission light.

The blue light emitting diode 110 may also be formed with an underlie layer made of GaN and a thin-film buffer layer made of GaN or AlN being interposed between the substrate 111 made of sapphire and the n-type semiconductor layer 112.

Although the eighth embodiment has patterned the red light emitting layer 116 into islands each configured as a square when viewed in a plan view, it need not necessarily be patterned. For example, the red light emitting layer 116 may also be formed over the entire upper surface of the $n^+$-type semiconductor layer 115 except for the region thereof to be formed with the first n-side electrode 117. In the case of forming the red light emitting layer 116 over the entire surface, the area of the red light emitting layer 116 is optimized to a value which optimizes the color rendering property of the output light.

The active layer 113 may also be constituted to have the composition of In which is nonuniform in the in-plane direction (direction parallel to a substrate surface) of the active layer 113.

Instead of varying a lattice constant in each of the n-type semiconductor layer 112, the active layer 113, the $p^+$-type semiconductor layer 114, the $n^+$-type semiconductor layer 115, and the read semiconductor layer 116 which have been formed on the substrate 111, the composition of a group III element in a quaternary or higher-order mixed crystal may also be varied in forming the blue light emitting diode 110 and the red light emitting layer 116. This provides a structure from which high-brightness light emission can be obtained without incurring a crystal defect due to a lattice mismatch and the resulting nonradiative recombination.

In the eighth embodiment, the YAG fluorescent material and the red light emitting layer 116 are excited by the output light received thereby from the blue light emitting diode 110 and emit yellow light and red light, respectively, thereby providing white light. However, an ultraviolet light emitting diode which output ultraviolet light at a wavelength of, e.g., 340 nm may also be formed in place of the blue light emitting diode 110. In this case, a blue light emitting fluorescent material and a green light emitting fluorescent material are added to the insulating material 119.

It is also possible to separate the substrate 111 made of sapphire from the blue light emitting diode 110 and provide a metal film in place of the separated substrate. The arrangement allows the use of the provided metal film as an n-side electrode and obviates the necessity to form the n-side electrode 118 by exposing the n-type semiconductor layer 112.

Referring to the drawings, a description will be given herein below to a method for fabricating the semiconductor light emitting device thus constructed.

FIGS. 29A through 29E show the cross-sectional structures of the semiconductor light emitting device according to the eighth embodiment in the individual process steps of the fabrication method therefor. The drawings show, of a wafer on which a plurality of semiconductor light elements can be formed simultaneously, only one element formation region.

Figure 29A:
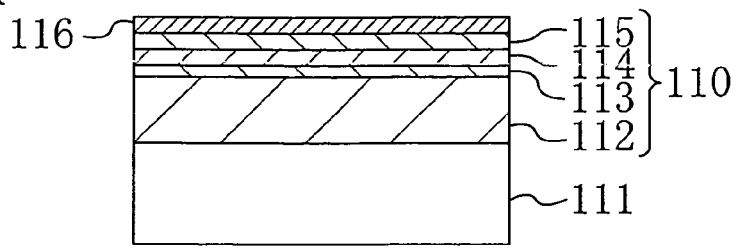
FIGS. 29A through 29E are cross-sectional views illustrating the individual process steps of a method for fabricating the semiconductor light emitting device according to the eighth embodiment.

First, as shown in FIG. 29A, the n-type semiconductor layer 112 made of n-type GaN, the active layer 113 having a multiple quantum well structure made of InGaN, the $p^+$-type semiconductor layer 114 made of $p^+$-type $Al_{0.05}Ga_{0.95}N$, the $n^+$-type semiconductor layer 115 made of $n^+$-type $Al_{0.05}Ga_{0.95}N$, and the red light emitting layer 116 made of undoped $In_{0.4}Ga_{0.6}N$ are grown successively by MOCVD (Metal Organic Chemical Vapor Deposition) on the substrate 111 made of sapphire having a principal surface of which the plane orientation is, e.g., the (0001) plane. As described above, the $p^+n^+$ junction formed between the $p^+$-type semiconductor layer 114 and the $n^+$-type semiconductor layer 115 shows current-voltage characteristics close to a low-resistance ohmic characteristic due to the tunnel current. On the other hand, the active layer 113 is composed of three quantum well layers each made of $In_{0.35}Ga_{0.65}N$ having a thickness of 2 nm and three barrier layers each made of $In_{0.02}Ga_{0.98}N$ having a thickness of 10 nm, which are alternately stacked. However, the structure of the active layer 113 is not limited thereto provided that the emission wavelength is about 470 nm. It is possible to form an underlie layer made of GaN and a thin-film buffer layer made of GaN or AlN between the substrate 111 and the n-type semiconductor layer 112. It is also possible to form the active layer 113 such that the composition of In is nonuniform in the in-plane direction (direction parallel to the substrate surface) of the active layer 113. It is also possible to obtain red emission light by using InGaN doped with, e.g., zinc, magnesium, or silicon, instead of using undoped $In_{0.4}Ga_{0.6}N$, and thereby forming the red light emitting layer 116 such that the composition of In is lower than 0.4.

Figure 29B:
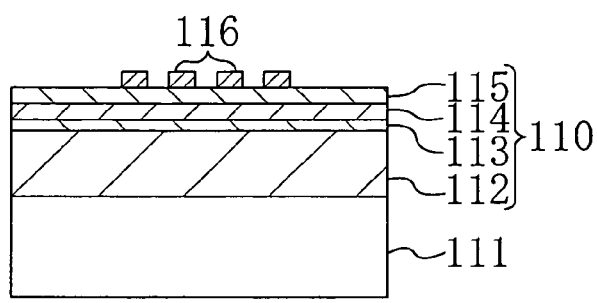

Next, as shown in FIG. 29B, a metal thin film (not shown) made of nickel and having a pattern consisting of a plurality of discrete and spaced-apart squares each having, e.g., 2-μm to 20-μm sides is formed on the red light emitting layer 116. Subsequently, the red light emitting layer 116 and an upper portion of the $n^+$-type semiconductor layer 115 are selectively removed by ICP (Inductive Coupled Plasma) etching using, e.g., a chlorine ($Cl_2$) gas by using the formed metal thin film as a mask. At this stage, the portion of the red light emitting layer 116 overlying the first n-side electrode formation region is also removed.

Figure 29C:
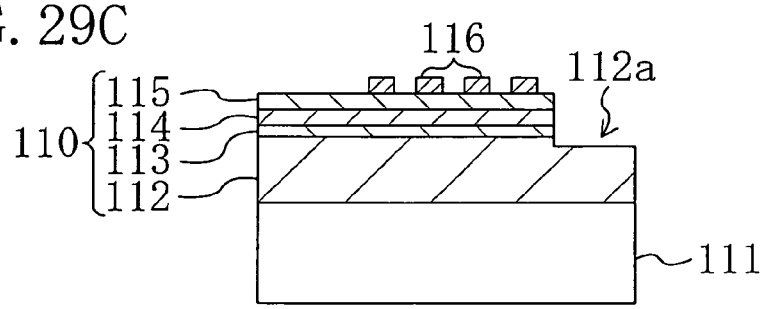

Next, as shown in FIG. 29C, the respective portions of the $n^+$-type semiconductor layer 115, the $p^+$-type semiconductor layer 114, and the active layer 113 overlying the second n-side electrode formation region 112a are selectively removed by ICP etching, whereby the second n-side electrode formation region 112a of the n-type semiconductor layer 112 is exposed.

Figure 29D:
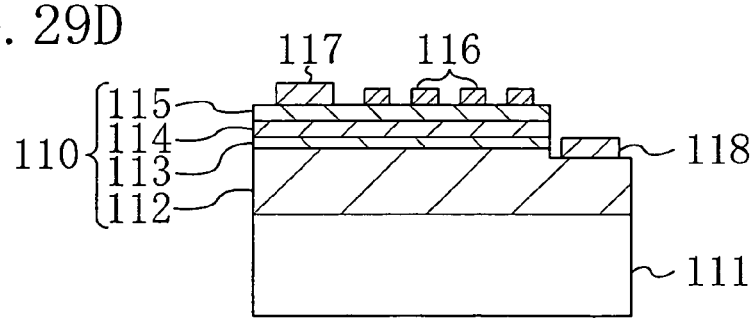

Next, as shown in FIG. 29D, a resist film (not shown) having opening patterns corresponding to the second n-side electrode formation region 112a and to the first n-side electrode formation region of the $n^+$-type semiconductor layer 115 is formed by lithography after dry etching. Subsequently, an electrode formation film composed of a multilayer film of Ti, Al, Ni, and Au is formed by, e.g., electron beam vapor deposition over the entire surface of the formed resist film. Then, the first and second n-side electrodes 117 and 118, each of which is an ohmic electrode, are formed simultaneously from the electrode formation film by a so-called lift-off process which removes the resist film. To reduce the contact resistance of each of the first and second n-side electrodes 117 and 118, sintering may also be performed appropriately in a nitrogen atmosphere at a temperature of, e.g., about 550° C.

Figure 29E:
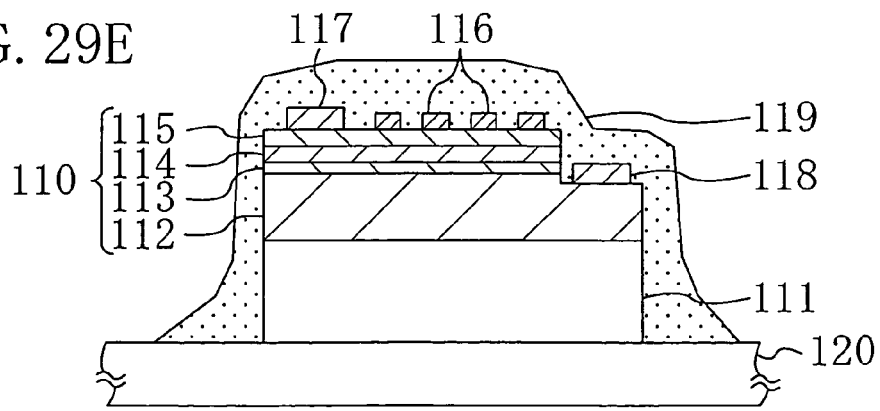

Next, as shown in FIG. 29E, after the formation of the first and second n-side electrodes 117 and 118, the resulting structure is divided into light emitting diode chips each having a 350-μm square size by, e.g., dicing. Subsequently, each of the chips resulting from the division is mounted on the specified region of the package 120 by using, e.g., a silver (Ag) paste. Thereafter, wire bonding is performed with respect to the first and second n-side electrodes 117 and 118 and the insulating material 119 containing a YAG fluorescent material is further applied to cover the chip.

Thus, the fabrication method according to the eighth embodiment allows one-chip integration of a white light emitting diode in which the red light emitting layer 116 and the YAG fluorescent material are excited by the blue light from the blue light emitting diode 110. This enables the intensity of emission light in the red range to be higher than in the conventional white light emitting diode. As a result, it becomes possible to provide a white light emitting diode which outputs white light having an excellent color rendering property.

In addition, since the $n^+$-type semiconductor layer 115 made of a nitride is lower in impurity energy level than a p-type semiconductor layer made of a nitride or a $p^+$-type semiconductor layer and therefore can be reduced in resistance, the diffusion of the current in a lateral direction (direction parallel to the substrate surface) is sufficiently large so that a transparent electrode as shown in the conventional embodiment need not be provided. This not only simplifies the fabrication process but also eliminates the absorption of the emission light by a transparent electrode, which occurs when the transparent electrode is provided. As a result, a high-brightness white light emitting diode can be provided.

Moreover, the first and second n-side electrodes 117 and 118, each of which is an ohmic electrode, do not have different compositions but have the same composition, in contrast to the p-side electrode and the n-side electrode having different compositions according to the conventional embodiment. Accordingly, the first and second n-side electrodes 117 and 118 can be formed simultaneously in the same process step. This simplifies the fabrication process and allows fabrication at a lower cost.

Although the eighth embodiment has adopted a structure in which the output light from the semiconductor light emitting device is extracted from the side with the $n^+$-type semiconductor layer 115, so-called flip-chip mounting may also be performed which forms a high-reflectivity electrode composed of a multilayer film using, e.g., platinum (Pt), rhodium (Rh), or silver (Ag) for the lower layer thereof and using gold (Au) for the upper layer thereof on the red light emitting layer 116 and the $n^+$-type semiconductor layer 115 and mounts the high-reflectivity electrode on the upper surface of the package 120 with a silver bump or the like interposed between the high-reflectivity electrode and the package 120. If flip-chip mounting is performed, the output light passes through the substrate 111 made of sapphire to be extracted so that a high-brightness white light emitting diode is provided.

Embodiment 9

A ninth embodiment of the present invention will be described with reference to the drawings.

Figure 30A:
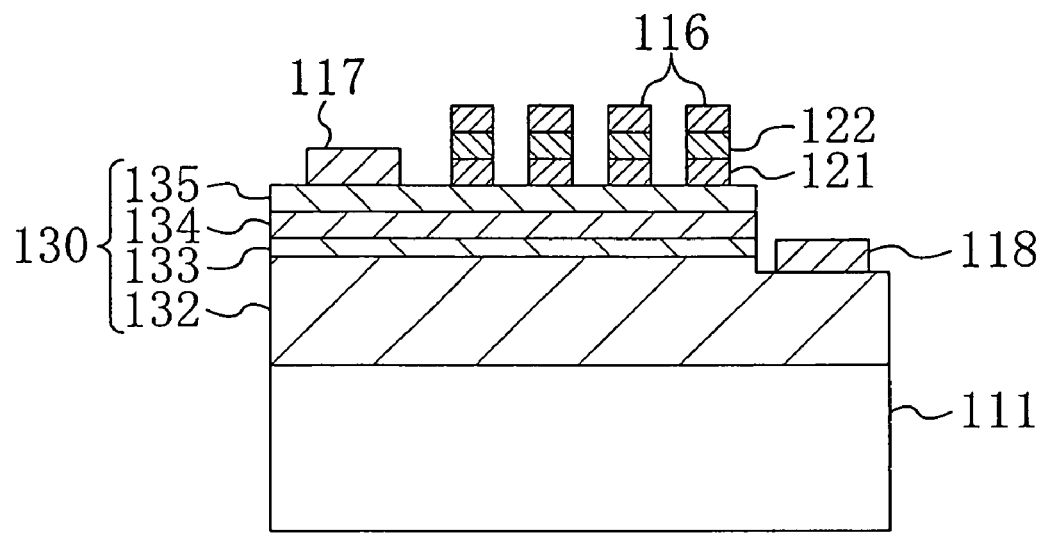
Figure 30B:
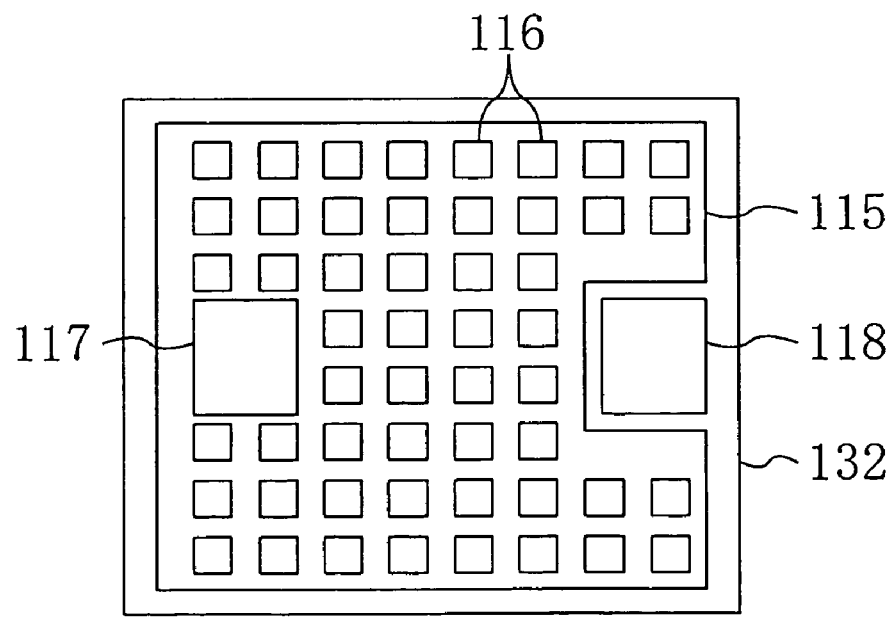

FIG. 30A shows a cross-sectional structure of a semiconductor light emitting device according to the ninth embodiment and FIG. 30B shows a plan structure thereof. The description of the components shown in FIGS. 30A and 30B which are the same as those shown in FIGS. 26A and 26B will be omitted by retaining the same reference numerals.

As shown in FIGS. 30A and 30B, the semiconductor light emitting device according to the ninth embodiment is composed of: an ultraviolet light emitting diode 130; a blue light emitting layer 121; a green light emitting layer 122; and the red light emitting layer 116, each of which has been grown epitaxially on the ultraviolet light emitting diode 130.

The ninth embodiment is different from the eighth embodiment in that it has provided the ultraviolet light emitting diode 130 as the light emitting diode in place of the blue light emitting diode 110 and newly provided the blue light emitting layer 121 and the green light emitting layer 122 which are excited by ultraviolet light at a wavelength of 340 nm outputted from the ultraviolet light emitting diode 130 to emit blue light at a wavelength of 470 nm and green light at a wavelength of 555 nm, respectively, thereby obviating the necessity for the insulating material 119 containing a YAG fluorescent material and covering the ultraviolet light emitting diode 130.

The ultraviolet light emitting diode 130 is composed of: an n-type semiconductor layer 132 made of, e.g., n-type $Al_{0.1}Ga_{0.9}N$; an active layer 133 having a multiple quantum well structure made of InGaN and AlGaN; a $p^+$-type semiconductor layer 134 made of $p^+$-type $Al_{0.15}Ga_{0.85}N$; and an $n^+$-type semiconductor layer 135 made of $n^+$-type $Al_{0.15}Ga_{0.85}N$. The active layer 133 is composed of five well layers each made of $In_{0.02}Ga_{0.98}N$ having a thickness of 1.5 nm and five barrier layers each made of $Al_{0.15}Ga_{0.85}N$ having a thickness of 10 nm which are alternately stacked, thereby emitting ultraviolet light at 340 nm.

The blue light emitting layer 121 is made of, e.g., undoped $In_{0.15}Ga_{0.85}N$ with a forbidden band width of 2.6 eV and formed on the $n^+$-type semiconductor layer 135 to have a configuration consisting of a plurality of discrete and spaced-apart islands. The green light emitting layer 122 is made of, e.g., undoped $In_{0.2}Ga_{0.8}N$ with a forbidden band width of 2.2 eV and formed on the blue light emitting layer 121 to have the same plan configuration as the blue light emitting layer 121. The red light emitting layer 116 is made of, e.g., undoped $In_{0.4}Ga_{0.6}N$ with a forbidden band width of 1.9 eV and formed on the green light emitting layer 122 to have the same plan configuration as the green light emitting layer 122. The blue light emitting layer 121, the green light emitting layer 122, and the red light emitting layer 116 are excited by the ultraviolet light outputted from the ultraviolet light emitting diode 130 to emit blue light at a wavelength of 470 nm, green light at a wavelength of 555 nm, and red light at a wavelength of 650 nm. Blue light emission, green light emission, and red light emission can be obtained from the blue light emitting layer 121, the green light emitting layer 122, and the red light emitting layer 116 by doping each of the blue light emitting layer 121, the green light emitting layer 122, and the red light emitting layer 116 with, e.g., zinc (Zn), magnesium (Mg), or silicon (Si) and thereby reducing the composition of In in each of the light emitting layers. By thus reducing the composition of In, a lattice mismatch with an underlie layer made of GaN normally used can be suppressed and crystal defects in the blue light emitting layer 121, in the green light emitting layer 122, and in the red light emitting layer 116 can be reduced so that high-brightness light emission is enabled.

If a voltage is applied between the n-type semiconductor layer 132 of the ultraviolet light emitting diode 130 and the $n^+$-type semiconductor layer 135 thereof to be higher to the $n^+$-type semiconductor layer 135 than to the n-type semiconductor layer 132, voltage-current characteristics close to a low-resistance ohmic characteristic are observed due to a tunnel current occurring in the $p^+n^+$ junction, as described in the eighth embodiment, so that the same rectifying property as obtained with a normal pn junction is obtainable. In addition, the injected current is diffused sufficiently even in a lateral direction (direction parallel to the substrate) without providing a transparent electrode on the $n^+$-type semiconductor layer 135, the first n-side electrode 117 provided on the $n^+$-type semiconductor layer 135 and the second n-side electrode 118 provided on the n-type semiconductor layer 132 can be formed to have the same composition, as will be described later. This allows the first n-side electrode and the second n-side electrode 118 to be formed in one process step and remarkably simplifies a fabrication process for the semiconductor light emitting device.

Figure 31:
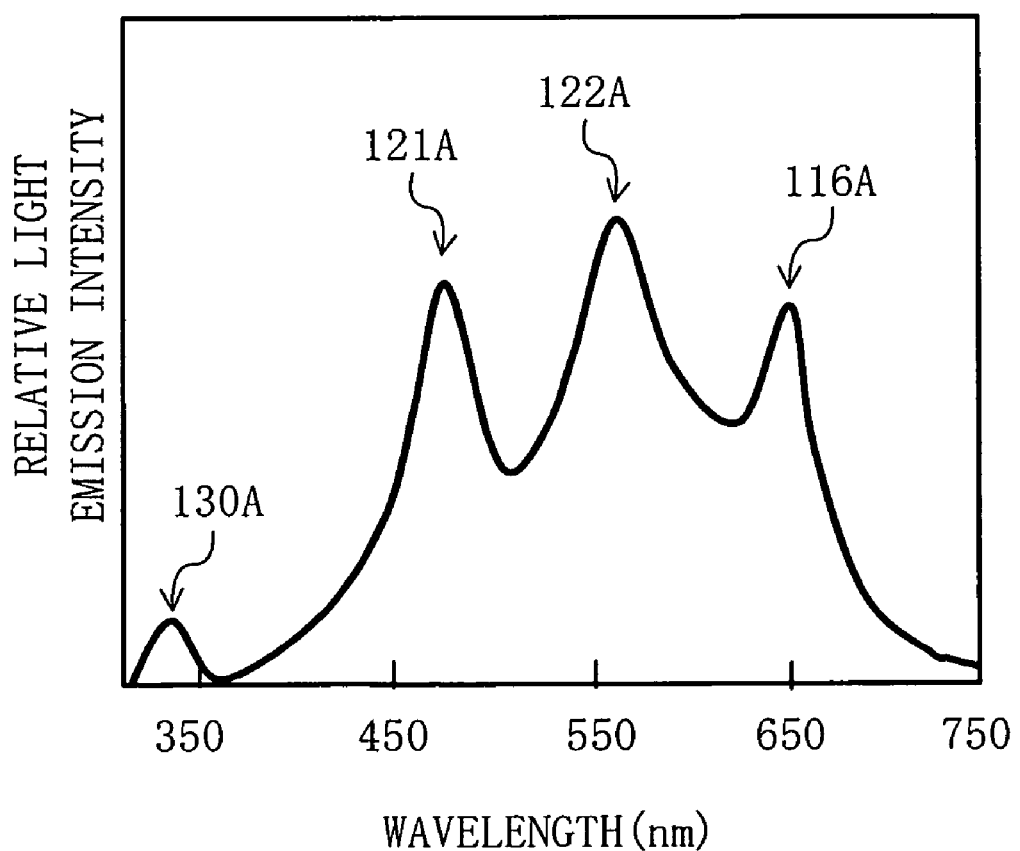
FIG. 31 is a graph showing an emission spectrum obtained from the semiconductor light emitting device according to the ninth embodiment.

A current is injected into the ultraviolet light emitting diode 130 via the first n-side electrode 117, the $n^+$-type semiconductor layer 135, and the $p^+$-type semiconductor layer 134. Accordingly, white light having the spectrum shown in FIG. 31 can be obtained by injecting a current of, e.g., 20 mA into the ultraviolet light emitting diode 130 and thereby causing the emission of ultraviolet light at a wavelength of 340 nm. In FIG. 31, the emission spectrum is composed of the transmitted component 130A of the ultraviolet light at a wavelength of 340 nm which is low in intensity, blue light 121A with a peak wavelength of 470 nm from the blue light emitting layer 121, green light 122A with a peak wavelength of 555 nm from the green light emitting layer 122, and the red light 116A at a wavelength of 650 nm from the red light emitting layer 116. The blue light 121A, the green light 122A, and the red light 116A are mixed to provide white light.

Thus, the ninth embodiment allows one-chip integration of a light emitting diode in which the blue light emitting layer 121, the green light emitting layer 122, and the red light emitting layer 116 which receive ultraviolet light outputted from the ultraviolet light emitting diode 130 and generate blue light, green light, and red light through excitation caused by the received ultraviolet light are provided on the ultraviolet light emitting diode 130. Accordingly, the intensity of emission light in the red range is higher than in an emission spectrum obtained from the conventional white light emitting diode which provides white light by exciting the YAG fluorescent material with blue light from the blue light emitting diode. This allows a white light emitting diode which outputs white light having an excellent color rendering property to be provided.

In addition, when an operating current is injected in the ultraviolet light emitting diode 130, a so-called tunnel current flows in the $p^+n^+$ junction formed between the $p^+$-type semiconductor layer 134 and the $n^+$-type semiconductor layer 135 so that a rectifying property is obtained by applying a voltage between the $n^+$-type semiconductor layer 135 and the n-type semiconductor layer 132 such that it is higher to the $n^+$-type semiconductor layer 135 than to the n-type semiconductor layer 132. Moreover, since the $n^+$-type semiconductor layer 135 is low in impurity energy level and can be reduced in resistance, the injected current is more likely to be diffused in the in-plane direction of the $n^+$-type semiconductor layer 135. This obviates the necessity to use a transparent electrode as used conventionally and enhances the brightness of the emission light. Moreover, since an insulating material containing a YAG fluorescent material is unnecessary, the steps of forming the transparent electrode and the insulating material containing the YAG fluorescent material can be omitted so that the fabrication process is simplified.

For easy transmission of the excitation light, the thickness of each of the red light emitting layer 116 and the green light emitting layer 122 is minimized provided that sufficient emission light is obtained.

The ultraviolet light emitting diode 130 may also be formed with an underlie layer made of GaN and a thin-film buffer layer made of GaN or AlN being interposed between the substrate 111 made of sapphire and the n-type semiconductor layer 132.

Although the ninth embodiment has patterned each of the blue light emitting layer 121, the green light emitting layer 122, and the red light emitting layer 116 into islands each configured as a square when viewed in a plan view, they need not necessarily be patterned. For example, each of the blue light emitting layer 121, the green light emitting layer 122, and the red light emitting layer 116 may also be formed over the entire upper surface of the $n^+$-type semiconductor layer 135 except for the region thereof to be formed with the first n-side electrode 117. In the case of forming each of the light emitting layers 121, 122, and 116 over the entire surface, the area of the light emitting layer is optimized to a value which optimizes the color rendering property of the output light.

In the case where the ultraviolet light emitting diode 130 is replaced with the blue light emitting diode 110 used in the eighth embodiment, the blue light emitting layer 121 need not be provided.

It is also possible to separate the substrate 111 made of sapphire from the ultraviolet light emitting diode 130 and provide a metal film in place of the separated substrate. The arrangement allows the provided metal film to be used as an n-side electrode and obviates the necessity to form the second n-side electrode 118 by exposing the n-type semiconductor layer 132.

Referring to the drawings, a description will be given herein below to a method for fabricating the semiconductor light emitting device thus constructed.

FIGS. 32A through 32D show the cross-sectional structures of the semiconductor light emitting device according to the ninth embodiment in the individual process steps of the fabrication method therefor.

Figure 32A:
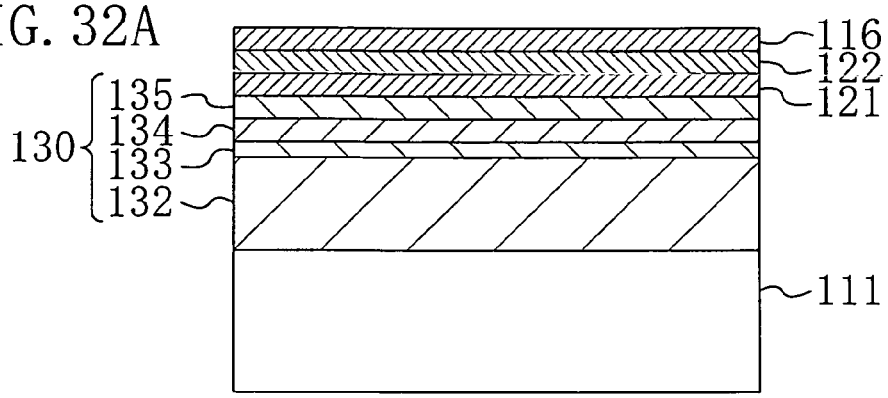
FIGS. 32A through 32D are cross-sectional views illustrating the individual process steps of a method for fabricating the semiconductor light emitting device according to the ninth embodiment.

First, as shown in FIG. 32A, the n-type semiconductor layer 132 made of n-type GaN, the active layer 133 having a multiple quantum well structure made of InGaN, the $p^+$-type semiconductor layer 134 made of $p^+$-type $Al_{0.05}Ga_{0.95}N$, the $n^+$-type semiconductor layer 135 made of $n^+$-type $Al_{0.05}Ga_{0.95}N$, the blue light emitting layer 121 made of undoped $In_{0.15}Ga_{0.85}N$, the green light emitting layer 122 made of undoped $In_{0.2}Ga_{0.8}N$, and the red light emitting layer 116 made of undoped $In_{0.4}Ga_{0.6}N$ are grown successively by MOCVD on the substrate 111 made of sapphire having a principal surface of which the plane orientation is, e.g., the (0001) plane. As stated previously, the $p^+n^+$ junction formed between the $p^+$-type semiconductor layer 134 and the $n^+$-type semiconductor layer 135 shows voltage-current characteristics close to a low-resistance ohmic characteristic due to the tunnel current. The active layer 133 is composed of five quantum well layers each made of $In_{0.02}Ga_{0.98}N$ having a thickness of 1.5 nm and five barrier layers each made of $Al_{0.15}Ga_{0.85}N$ having a thickness of 10 nm, which are alternately stacked. However, the structure of the active layer 133 is not limited thereto provided that the emission wavelength is about 340 nm. The forbidden band width of the blue light emitting layer 121 is 2.6 eV and emits blue light at 470 nm. The forbidden band width of the green light emitting layer 122 is 2.3 eV and emits green light at 555 nm. The forbidden band width of the red light emitting layer 116 is 1.9 eV and emits red light at 650 nm. It is possible to form an underlie layer made of GaN and a thin-film buffer layer made of GaN or AlN between the substrate 111 and the n-type semiconductor layer 132. The active layer 133 may also be constituted to have the composition of In which is nonuniform in the in-plane direction (direction parallel to a substrate surface) of the active layer 133. It is also possible to obtain red emission light by using InGaN doped with, e.g., zinc, magnesium, or silicon, instead of using undoped $In_{0.4}Ga_{0.6}N$, and thereby forming the red light emitting layer 116 such that the composition of In is lower than 0.4.

Figure 32B:
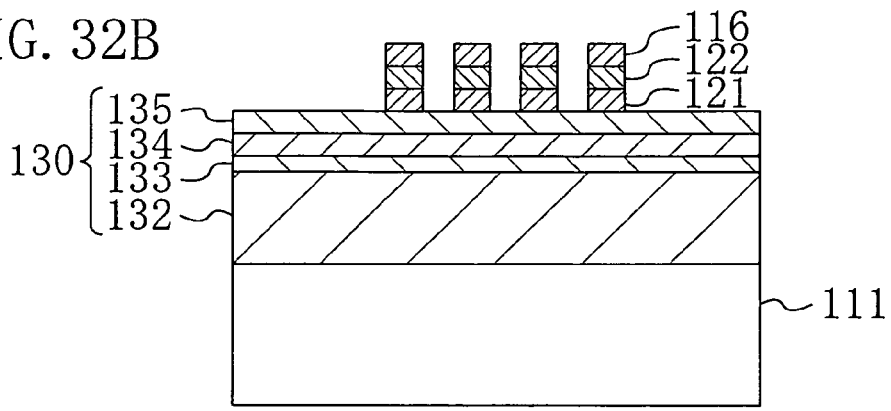

Next, as shown in FIG. 32B, a metal thin film (not shown) made of nickel and having a pattern consisting of a plurality of discrete and spaced-apart squares each having, e.g., 2-μm to 20-μm sides is formed on the red light emitting layer 116. Subsequently, respective upper portions of the red light emitting layer 116, the green light emitting layer 122, the blue light emitting layer 121, and the $n^+$-type semiconductor layer 135 are selectively removed by ICP etching using, e.g., a chlorine ($Cl_2$) gas by using the formed metal thin film as a mask. At this stage, the respective portions of the red light emitting layer 116, the green light emitting layer 122, and the blue light emitting layer 121 overlying the first n-side electrode formation region are also removed.

Figure 32C:
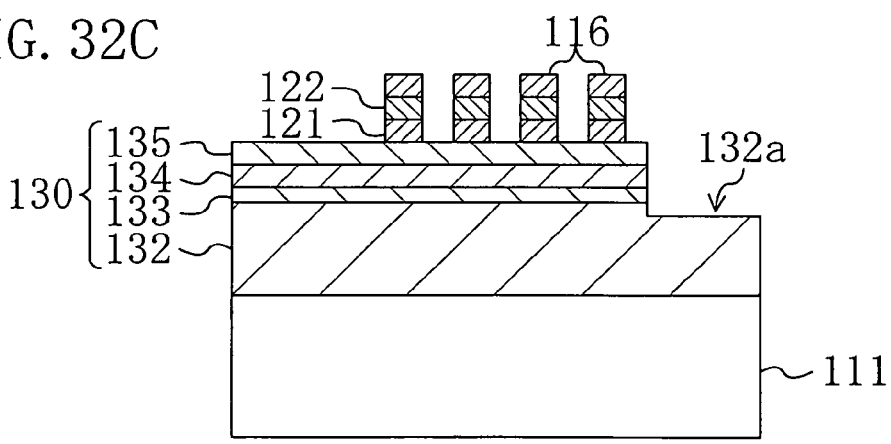

Next, as shown in FIG. 32C, the respective portions of the $n^+$-type semiconductor layer 135, the $p^+$-type semiconductor layer 134, and the active layer 133 overlying the second n-side electrode formation layer 132a are selectively removed by ICP etching, whereby the n-side electrode formation layer 132a of the n-type semiconductor layer 132 is exposed.

Figure 32D:
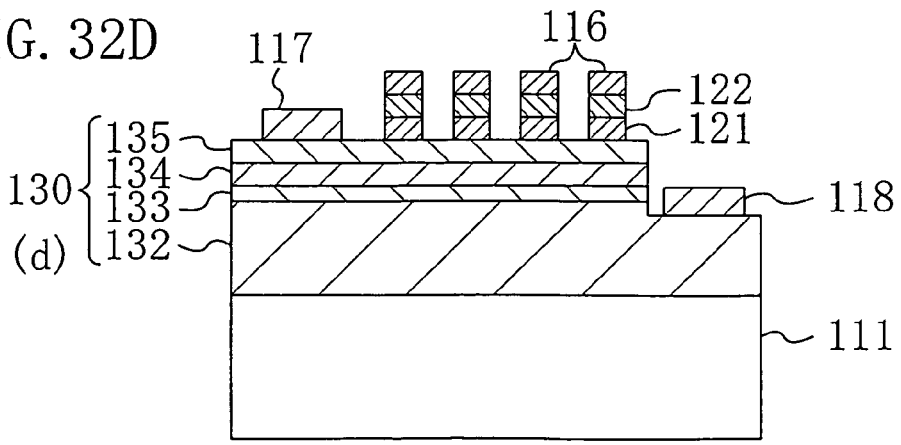

Next, as shown in FIG. 32D, a resist film (not shown) having opening patterns corresponding to the second n-side electrode formation layer 132a and to the first n-side electrode formation region of the $n^+$-type semiconductor layer 135 is formed by lithography after dry etching. Subsequently, an electrode formation film composed of a multilayer film of Ti, Al, Ni, and Au is formed by, e.g., electron beam vapor deposition over the entire surface of the formed resist film. Then, the first and second n-side electrodes 117 and 118, each of which is an ohmic electrode, are formed from the electrode formation film by a so-called lift-off process which removes the resist film. To reduce the contact resistance of each of the first and second n-side electrodes 117 and 118, sintering may also be performed appropriately in a nitrogen atmosphere at a temperature of, e.g., about 550° C. Subsequently, the resulting structure is divided into light emitting diode chips each having a 350-μm square size by, e.g., dicing. Further, each of the chips resulting from the division is mounted on the specified region of the package 120 by using, e.g., a silver (Ag) paste. Thereafter, wire bonding is performed with respect to the first and second n-side electrodes 117 and 118.

Thus, the fabrication method according to the ninth embodiment allows one-chip integration of a white light emitting diode in which the blue light emitting layer 121, the green light emitting layer 122, and the red light emitting layer 116 are excited by the ultraviolet light from the ultraviolet light emitting diode 130. This enables the intensity of emission light in the red range to be higher than in the conventional white light emitting diode. As a result, it becomes possible to provide a white light emitting diode which outputs white light having an excellent color rendering property.

In addition, since the $n^+$-type semiconductor layer 135 made of a nitride is lower in impurity energy level than a p-type semiconductor layer made of a nitride or a $p^+$-type semiconductor layer and therefore can be reduced in resistance, the diffusion of the current in a lateral direction (direction parallel to the substrate surface) is sufficiently large so that a transparent electrode as shown in the conventional embodiment need not be provided. This not only simplifies the fabrication process but also eliminates the absorption of the emission light by a transparent electrode, which occurs when the transparent electrode is provided. As a result, a high-brightness white light emitting diode can be provided.

In the fabrication method according to the ninth embodiment, the step of providing an insulating material containing a YAG fluorescent material is unnecessary. In addition, since the first and second n-side electrodes 117 and 118, each of which is an ohmic electrode, have the same composition, they can be formed in the same process step. This further simplifies the fabrication process and allows fabrication at lower cost.

In the ninth embodiment also, it is possible to form an electrode made of a high-reflectivity material as described in the eighth embodiment and perform flip-chip mounting which mounts the formed electrode made of the high-reflectivity material with a silver bump or the like interposed between the package and the electrode.

Embodiment 10

A tenth embodiment of the present invention will be described with reference to the drawings.

Figure 33A:
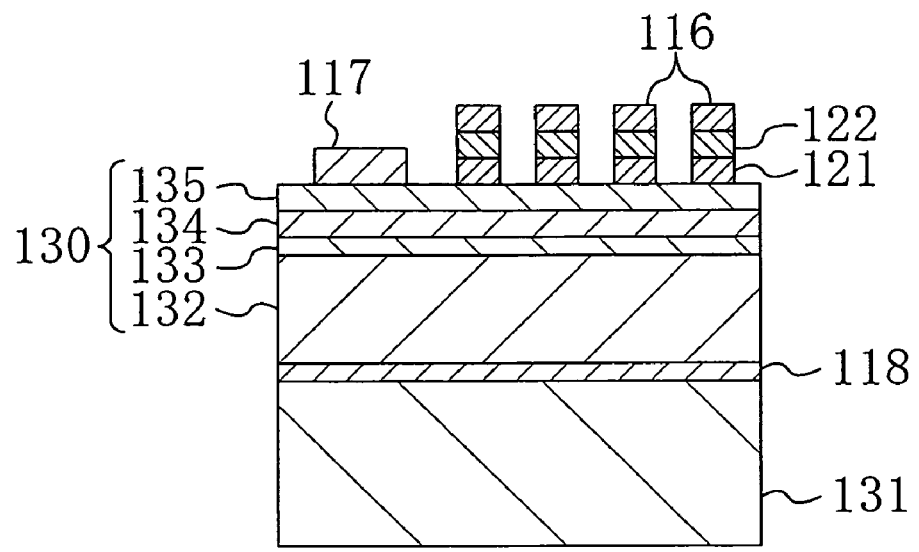
Figure 33B:
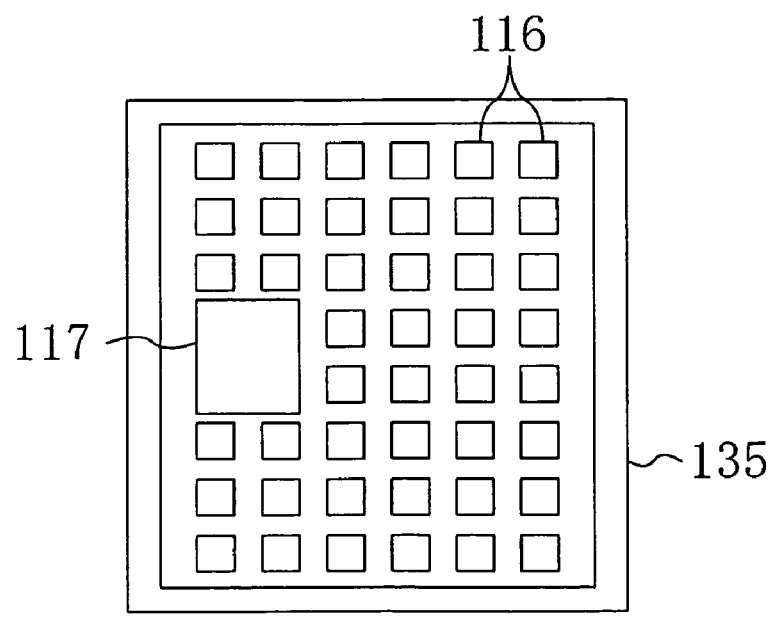

FIG. 33A shows a cross-sectional structure of a semiconductor light emitting device according to the tenth embodiment and FIG. 33B shows a plan structure thereof. The description of the components shown in FIGS. 33A and 33B which are the same as those shown in FIGS. 30A and 30B will be omitted by retaining the same reference numerals.

The tenth embodiment is different from the ninth embodiment in that a substrate made of sapphire is separated and removed from the ultraviolet light emitting diode 130 during the epitaxial growth thereof, the second n-side electrode 118 composed of a multilayer structure of titanium (Ti) and gold (Au) is provided on the surface of the n-type semiconductor layer 132 from which the substrate has been removed, and a plating layer 131 made of gold (Au) with a thickness of 10 μm or more, e.g., about 50 μm is provided to substantially function as the n-side electrode. Preferably, a material having a reflectivity of 60% or more with respect to ultraviolet light, blue light, green light, and red light is used herein for the second n-side electrode 118. For example, a single layer film made of, e.g., gold (Au), platinum (Pt), copper (Cu), silver (Ag), or rhodium (Rh) or a multilayer film containing at least two of the foregoing elements can be used. For the gold plating layer 131, copper (Cu) or silver (Ag) can be used instead of gold (Au).

If ultraviolet light at a wavelength of 340 nm is generated by injecting a current of, e.g., 20 mA in the ultraviolet light emitting diode 130, white light having a spectrum pattern equal to the spectrum shown in FIG. 31 is obtained.

With the arrangement, the semiconductor light emitting device according to the tenth embodiment can be integrated as one chip in which the blue light emitting layer 121, the green light emitting layer 122, and the red light emitting layer 116 which receive ultraviolet light outputted from the ultraviolet light emitting diode 130 and generate blue light, green light, and red light through excitation caused by the received ultraviolet light are provided on the ultraviolet light emitting diode 130, similarly to the semiconductor light emitting device according to the ninth embodiment. Accordingly, the intensity of emission light in the red range is higher than in an emission spectrum obtained from the conventional white light emitting diode which provides white light by exciting the YAG fluorescent material with blue light from the blue light emitting diode. This allows a white light emitting diode which outputs white light having an excellent color rendering property to be provided.

Since it is unnecessary to provide an insulating material containing a YAG fluorescent material and a transparent electrode as provided conventionally, the absorption of emission light by the transparent electrode, which occurs when the transparent electrode is provided, is no more observed so that higher brightness is achieved.

In addition, the tenth embodiment has formed the second n-side electrode 118 over the entire surface (back surface) of the n-type semiconductor layer 132 opposite to the active layer 133 by removing the substrate made of sapphire for epitaxial growth and further provided the gold plating layer 131 with a relatively large thickness of 50 μm. The arrangement significantly improves the heat dissipation property of the ultraviolet light emitting diode 130 and allows a higher-output white light emitting diode to be provided. In addition, since the second n-side electrode 118 and the first n-side electrode 117 are disposed in opposing relation with the active layer 133 interposed therebetween, a series resistance between the second n-side electrode 118 and the first n-side electrode 117 can be reduced advantageously. Since the insulating substrate made of sapphire or the like has been removed, it is unnecessary to provide the second n-side electrode 118 on the upper portion of the n-type semiconductor layer 132. This achieves a reduction in chip size and allows the elimination of the step of etching away the n-side semiconductor layer 132 from the side of the $p^+$-type semiconductor layer 134.

For easy transmission of the excitation light, the thickness of each of the red light emitting layer 116 and the green light emitting layer 122 is minimized provided that sufficient emission light is obtained.

The ultraviolet light emitting diode 130 may also be formed with an underlie layer made of GaN and a thin-film buffer layer made of GaN or AlN being interposed between the substrate 111 made of sapphire and the n-type semiconductor layer 132.

Although the tenth embodiment has patterned each of the blue light emitting layer 121, the green light emitting layer 122, and the red light emitting layer 116 into islands each configured as a square when viewed in a plan view, they need not necessarily be patterned. For example, the blue light emitting layer 121, the green light emitting layer 122, and the red light emitting layer 116 may also be formed over the entire upper surface of the $n^+$-type semiconductor layer 135 except for the region thereof to be formed with the first n-side electrode 117. In the case of forming each of the light emitting layers 121, 122, and 116 over the entire surface, the area of the light emitting layer is optimized to a value which optimizes the color rendering property of the output light.

In the case where the ultraviolet light emitting diode 130 is replaced with the blue light emitting diode 110 used in the eighth embodiment, the blue light emitting layer 121 need not be provided.

Referring to the drawings, a description will be given herein below to a method for fabricating the semiconductor light emitting device thus constructed.

FIGS. 34A through 34D and FIGS. 35A through 35C show the cross-sectional structures of the semiconductor light emitting device according to the tenth embodiment in the individual process steps of the fabrication method therefor.

Figure 34A:
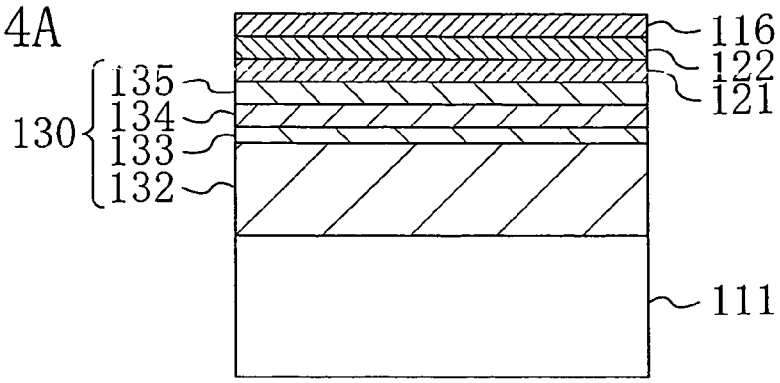
FIGS. 34A through 34D are cross-sectional views illustrating the individual process steps of a method for fabricating the semiconductor light emitting device according to the tenth embodiment.

First, as shown in FIG. 34A, the n-type semiconductor layer 132 made of n-type GaN, the active layer 133 having a multiple quantum well structure made of InGaN, the $p^+$-type semiconductor layer 134 made of $p^+$-type $Al_{0.05}Ga_{0.95}N$, the $n^+$-type semiconductor layer 135 made of $n^+$-type $Al_{0.05}Ga_{0.95}N$, the blue light emitting layer 121 made of undoped $In_{0.15}Ga_{0.85}N$, the green light emitting layer 122 made of undoped $In_{0.2}Ga_{0.8}N$, and the red light emitting layer 116 made of undoped $In_{0.4}Ga_{0.6}N$ are grown successively by MOCVD on the substrate 111 made of sapphire having a principal surface of which the plane orientation is, e.g., the (0001) plane. As stated previously, the $p^+n^+$ junction formed between the $p^+$-type semiconductor layer 134 and the $n^+$-type semiconductor layer 135 shows voltage-current characteristics close to a low-resistance ohmic characteristic due to the tunnel current. The active layer 133 is composed of five quantum well layers each made of $In_{0.02}Ga_{0.98}N$ having a thickness of 1.5 nm and five barrier layers each made of $Al_{0.5}Ga_{0.85}N$ having a thickness of 10 nm, which are alternately stacked. However, the structure of the active layer 133 is not limited thereto provided that the emission wavelength is about 340 nm. The forbidden band width of the blue light emitting layer 121 is 2.6 eV and emits blue light at 470 nm. The forbidden band width of the green light emitting layer 122 is 2.3 eV and emits green light at 555 nm. The forbidden band width of the red light emitting layer 116 is 1.9 eV and emits red light at 650 nm. It is possible to form an underlie layer made of GaN and a thin-film buffer layer made of GaN or AlN between the substrate 111 and the n-type semiconductor layer 132. The active layer 133 may also be constituted to have the composition of In which is nonuniform in the in-plane direction (direction parallel to a substrate surface) of the active layer 133. It is also possible to obtain red emission light by using InGaN doped with, e.g., zinc, magnesium, or silicon, instead of using undoped $In_{0.4}Ga_{0.6}N$, and thereby forming the red light emitting layer 116 such that the composition of In is lower than 0.4.

Figure 34B:
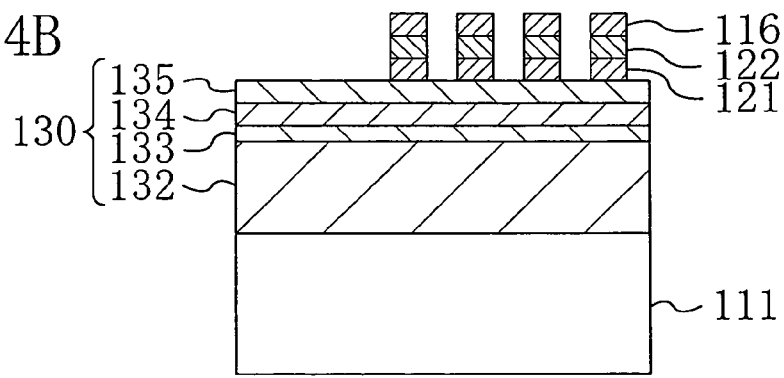

Next, as shown in FIG. 34B, a metal thin film (not shown) made of nickel and having a pattern consisting of a plurality of discrete and spaced-apart squares each having, e.g., 2-μm to 20-μm sides is formed on the red light emitting layer 116. Subsequently, respective upper portions of the red light emitting layer 116, the green light emitting layer 122, the blue light emitting layer 121, and the $n^+$-type semiconductor layer 135 are selectively removed by ICP etching using, e.g., a chlorine ($Cl_2$) gas by using the formed metal thin film as a mask. At this stage, the respective portions of the red light emitting layer 116, the green light emitting layer 122, and the blue light emitting layer 121 overlying the first n-side electrode formation region are also removed.

Figure 34C:
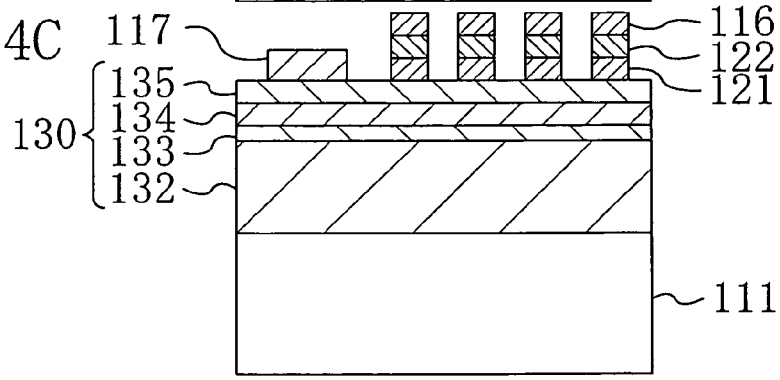

Next, as shown in FIG. 34C, a resist film (not shown) having an opening pattern corresponding to the first n-side electrode formation region of the $n^+$-type semiconductor layer 135 is formed by lithography after dry etching. Subsequently, an electrode formation film composed of a multilayer film of Ti, Al, Ni, and Au is formed by, e.g., electron beam vapor deposition over the entire surface of the formed resist film. Then, the first n-side electrode 117, which is an ohmic electrode, is formed from the electrode formation film by a so-called lift-off process which removes the resist film. To reduce the contact resistance of the first n-side electrode 117, sintering may also be performed appropriately in a nitrogen atmosphere at a temperature of, e.g., about 550° C.

Figure 34D:
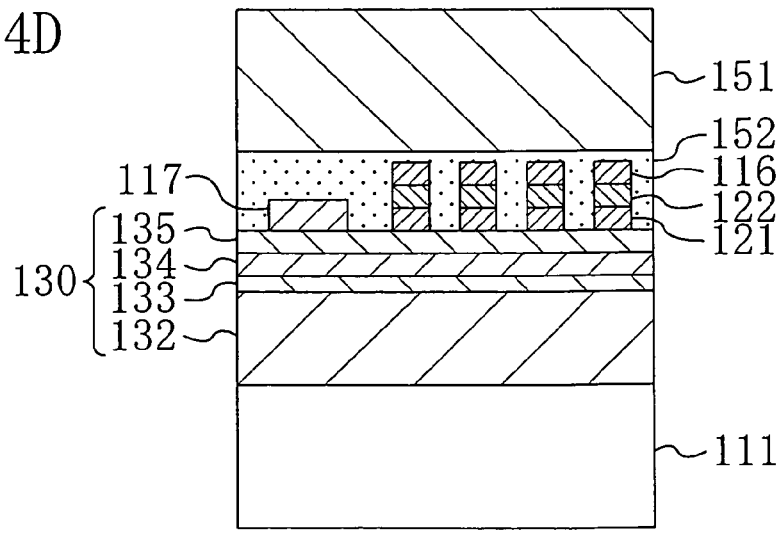

Next, as shown in FIG. 34D, after the formation of the first p-side electrode 117, a holding substrate 151 made of silicon is bonded to the $n^+$-type semiconductor layer 135 containing the first n-side electrode 117, the red light emitting layer 116, and the like by using, e.g., an epoxy-based adhesive agent 152. The material of the holding substrate 151 is not limited to silicon. A polymer film may also be used for the holding substrate 151.

Figure 35A:
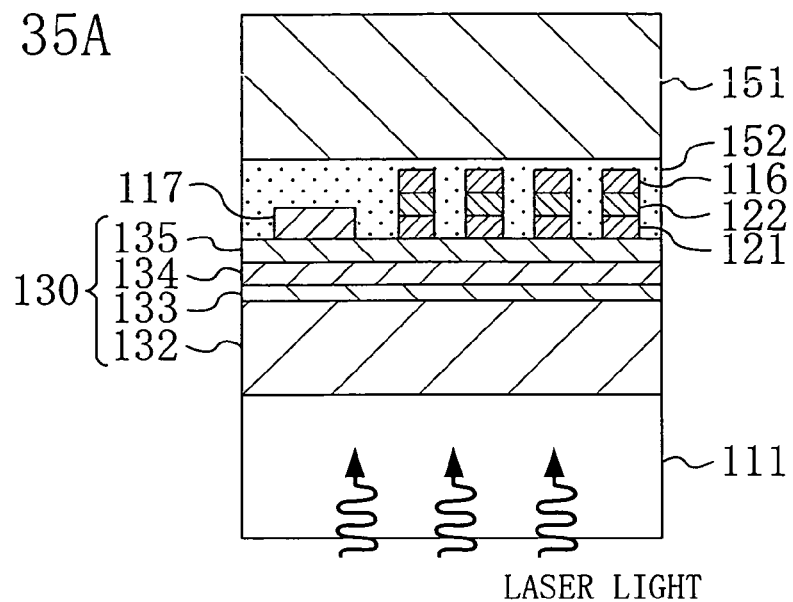
FIGS. 35A through 35C are cross-sectional views illustrating the individual process steps of the method for fabricating the semiconductor light emitting device according to the tenth embodiment.

Next, as shown in FIG. 35A, a high-output and short-wavelength pulse laser beam which is not absorbed by the substrate 111 but is absorbed by the n-type semiconductor layer 132, such as the third-harmonic beam of a YAG laser at a wavelength of 355 nm or a KrF excimer laser beam at a wavelength of 248 nm, is applied in a scanning manner to the surface of the substrate 111 opposite to the holding substrate 151 for the irradiation thereof. At this time, the applied laser beam is absorbed by the portion of the n-type semiconductor layer 132 made of GaN which is adjacent to the interface between itself and the substrate 111. As a result, the portion of the n-type semiconductor layer 132 which is adjacent to the interface with the substrate 111 is heated and, if the temperature becomes 900° C. or higher through the absorption of the laser beam, the portion of the n-type semiconductor layer 132 adjacent to the interface with the substrate 111 is decomposed into a metal gallium (Ga) gas and a nitrogen ($N_2$) gas, so that a decomposition layer is formed.

Figure 35B:
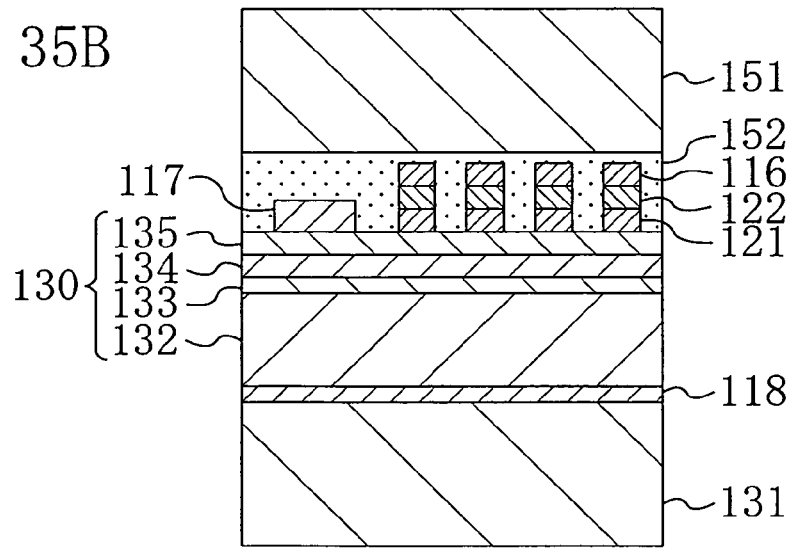

Then, the substrate 111 formed with the decomposition layer is separated from the n-type semiconductor layer 132 by heating the substrate 111 to a temperature not less than 29° C., which is a melting point of gallium, or by immersing the substrate 111 in an aqueous hydrogen chloride (HCl) solution and thereby melting or removing metal gallium contained in the decomposition layer. Thereafter, the second n-side electrode 118 composed of a multilayer film of titanium (Ti) and gold (Au) is formed by, e.g., electron beam vapor deposition on the exposed surface from which the substrate 111 has been separated and removed. Subsequently, the gold plating layer 131 with a thickness of about 50 μm is formed by electrolytic plating using the gold (Au) layer of the second n-side electrode 118 as an underlie, whereby the structure shown in FIG. 35B is obtained.

Figure 35C:
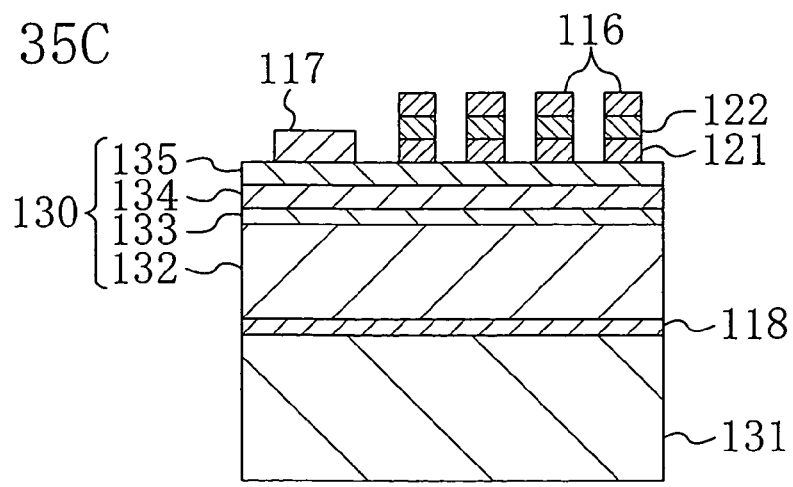
Figure 36:
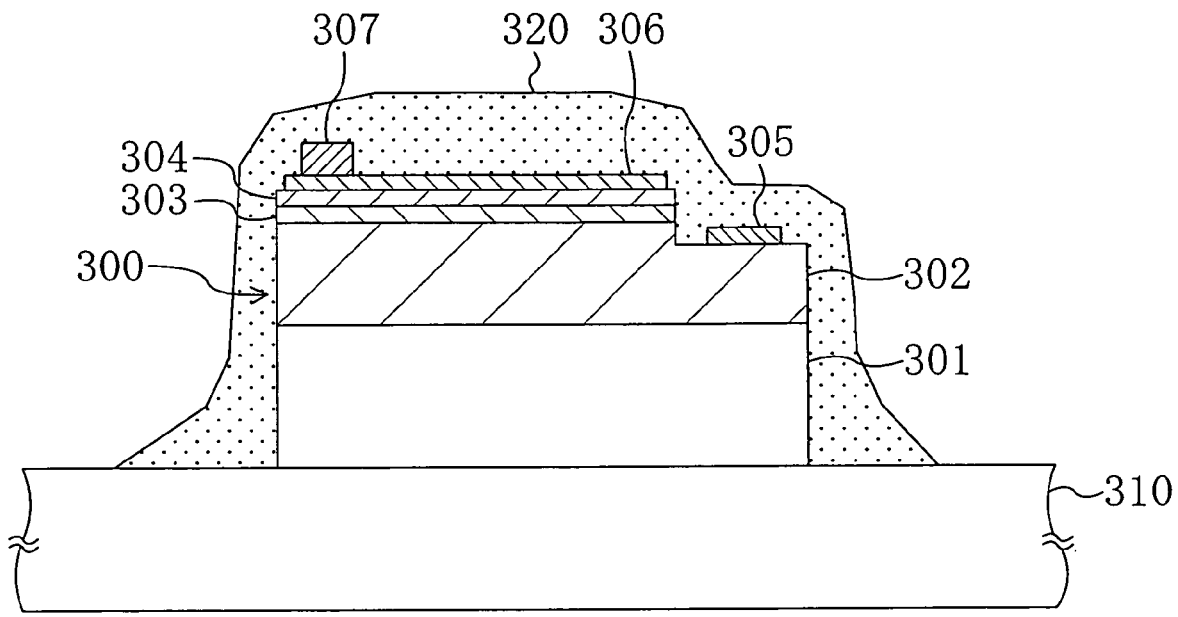
FIG. 36 is a cross-sectional view showing a conventional white light emitting diode.

Next, as shown in FIG. 35C, the adhesive agent 53 is removed by using, e.g., acetone so that the holding substrate 151 is removed. Then, the resulting structure is divided into light emitting diode chips each having a 350-μm square size by, e.g., dicing. Subsequently, each of the chips resulting from the division is mounted on the specified region of a package (not shown) by using, e.g., a silver (Ag) paste. Thereafter, wire bonding is performed with respect to the first n-side electrode 117, whereby the white light emitting diode is obtained.

Thus, the fabrication method according to the tenth embodiment allows one-chip integration of a white light emitting diode in which each of the blue light emitting layer 121, the green light emitting layer 122, and the red light emitting layer 116 is excited by the ultraviolet light outputted from the ultraviolet light emitting diode 130. This enables the intensity of emission light in the red range to be higher than in the conventional white light emitting diode. As a result, it becomes possible to provide a white light emitting diode outputs white light having an excellent color rendering property.

In addition, since the $n^+$-type semiconductor layer 135 made of a nitride is lower in impurity energy level than a p-type semiconductor layer made of a nitride or a $p^+$-type semiconductor layer and therefore can be reduced in resistance, the diffusion of the current in a lateral direction (direction parallel to the substrate surface) is sufficiently large so that a transparent electrode as shown in the conventional embodiment need not be provided. This not only simplifies the fabrication process but also eliminates the absorption of the emission light by a transparent electrode, which occurs when the transparent electrode is provided. As a result, a high-brightness white light emitting diode can be provided.

In addition, the substrate made of sapphire which is not excellent in heat dissipation property is removed and the gold plating layer 131 which is excellent in heat dissipation property is provided in place thereof so that a higher output is produced.

Although the tenth embodiment has described the separation method which applies the high-output short-wavelength pulse laser beam for the separation of the substrate 111 made of sapphire, the separation of the substrate 111 is not limited to the method using laser irradiation. It is also possible to, e.g., use the substrate 111 made of silicon (Si) or gallium arsenide (GaAs) in place of the substrate 111 made of sapphire and separate and remove the substrate 111 by wet etching using an acid.

In each of the ninth and tenth embodiments, the plane orientation of the principal surface of sapphire used as the substrate for epitaxial growth is not particularly limited. In the case of using, e.g., sapphire, a plane orientation at an off-angle from a representative (typical) plane orientation, such as the (0001) plane, may also be adopted.

The material of the substrate for epitaxial growth is not limited to sapphire. Besides sapphire, there can be used silicon carbide (SiC), zinc oxide (ZnO), silicon (Si), gallium arsenide (GaAs), gallium phosphide (GaP), indium phosphide (InP), gallium nitride (GaN), aluminum nitride (AlN), magnesium oxide (MgO), or lithium aluminum gallium oxide ($LiAl_xGa_{1-x}O_2$ (where $0 \leq x \leq 1$)).

The composition of each of the nitride semiconductor layers composing the blue light emitting diode 110 and the ultraviolet light emitting diode 130 and the composition of each of the nitride semiconductor layers composing the individual layers which emit light through excitation, such as the red light emitting layer 116, are not limited to those shown in the individual embodiments. The method for crystal growth is not limited to MOCVD and a semiconductor layer formed by using, e.g., an MBE (Molecular Beam Epitaxy) process or a HVPE (Hydride Vapor Phase Epitaxy) process may also be contained. Each of the semiconductor layers may also contain a group V element such as arsenide (As) or phosphorous (P) or a group III element such as boron (B) as a constituent element.

As described above, the semiconductor light emitting device according to the present invention allows one-chip integration of a high-output white light emitting diode structure featuring an excellent color rendering property and high brightness and is useful as the back light of a liquid crystal display device, a white light source for illumination, or the like.

What is claimed is:

1. A semiconductor light emitting device comprising:
   a light emitting diode comprising a plurality of semiconductor layers for emitting first emission light;
   a semiconductor film provided in a portion of the light emitting diode to absorb the first emission light and emit second emission light; and
   an electrode,
   wherein the semiconductor film emits the second emission light through optical excitation by the first emission light,
   wherein both of the semiconductor film and the electrode are formed over a top surface of the plurality of semiconductor layers included in the light emitting diode, and
   wherein the semiconductor film is divided into plural separated areas, the plural separated areas of the semiconductor film are continuously covered with the electrode.

2. The semiconductor light emitting device of claim 1, wherein the semiconductor film is formed on a part of a light emitting surface of the semiconductor light emitting device.

3. The semiconductor light emitting device of claim 1, further comprising:
   a fluorescent material covering the light emitting diode and the semiconductor film,
   wherein the fluorescent material absorbs the first emission light and emits third emission light.

4. The semiconductor light emitting device of claim 1, wherein the light emitting diode or the semiconductor film is formed on a substrate made of a single crystal.

5. The semiconductor light emitting device of claim 4, wherein the substrate transmits the first emission light and the second emission light.

6. The semiconductor light emitting device of claim 4, wherein the single crystal is sapphire, silicon carbide, gallium nitride, aluminum nitride, magnesium oxide, lithium gallium oxide, lithium aluminum oxide, lithium aluminum oxide, or a mixed crystal of lithium gallium oxide and lithium aluminum oxide.

7. The semiconductor light emitting device of claim 1, wherein the first emission light is blue light or ultraviolet light.

8. The semiconductor light emitting device of claim 7, wherein the semiconductor film is excited by the first emission light to emit the second emission light which is red light.

9. The semiconductor light emitting device of claim 1, wherein the semiconductor film is composed of a plurality of semiconductor films which are stacked in layers and emit emission light components having different wavelengths from each of the stacked layers.

10. The semiconductor light emitting device of claim 1, wherein the semiconductor film is doped with impurities and excited by the first emission light to emit the second emission light in a visible range via energy levels resulting from the impurities.

11. The semiconductor light emitting device of claim 1, wherein the semiconductor film is doped with an impurity to emit the second emission light in a visible range through light emission from inner-shell transition of the impurities.

12. The semiconductor light emitting device of claim 11, wherein the impurity is Eu, Sm, or Yb.

13. The semiconductor light emitting device of claim 11, wherein the impurities in the semiconductor film are introduced by ion implantation.

14. The semiconductor light emitting device of claim 1, further comprising a metal film on a portion of the electrode, wherein a current is injected in the light emitting diode through the metal film.

15. The semiconductor light emitting device of claim 14, wherein the metal film is made of gold, copper, or silver.

16. The semiconductor light emitting device of claim 1, wherein the top surface of the plurality of semiconductor layers has grooves in areas above which the plural separated areas of the semiconductor film are not formed, and an inside surface of each of the grooves is covered with the electrode.

* * * * *